United States Patent
Yamanouchi et al.

(10) Patent No.: US 7,821,337 B2
(45) Date of Patent: Oct. 26, 2010

(54) POWER AMPLIFIER

(75) Inventors: Shingo Yamanouchi, Tokyo (JP);
Kazuaki Kunihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 65 days.

(21) Appl. No.: 12/297,901

(22) PCT Filed: Apr. 12, 2007

(86) PCT No.: PCT/JP2007/058059

§ 371 (c)(1),
(2), (4) Date: Oct. 21, 2008

(87) PCT Pub. No.: WO2007/123040

PCT Pub. Date: Nov. 1, 2007

(65) Prior Publication Data

US 2009/0072901 A1    Mar. 19, 2009

(30) Foreign Application Priority Data

Apr. 21, 2006   (JP)   ............................. 2006-117745

(51) Int. Cl.
    *H03F 1/26* (2006.01)
(52) U.S. Cl. .................... 330/149; 330/124 R; 375/297
(58) Field of Classification Search ................. 330/149, 330/124 R; 455/114.3; 375/296–297
    See application file for complete search history.

(56) References Cited

U.S. PATENT DOCUMENTS 6,242,979 B1 * 6/2001 Li ............................... 330/149
7,313,370 B2 * 12/2007 Branson .................. 455/114.2

FOREIGN PATENT DOCUMENTS

| JP | 58-16802 | 4/1983 |
|---|---|---|
| JP | 04-047804 | 2/1992 |
| JP | 05-206743 | 8/1993 |
| JP | 2973684 | 9/1999 |
| JP | 2000-261252 | 9/2000 |
| JP | 2001-016047 | 1/2001 |
| JP | 2001-094359 | 4/2001 |
| JP | 2003-332852 | 11/2003 |
| JP | 2005-253045 | 9/2005 |

OTHER PUBLICATIONS

N. Carvalho et al., Compactformulas to Relate ACPR And NPR to Two-Tone IMR and IP3, Microwave Journal vol. 42., No. 12, 1999.
J. Bussgang et al., "Analysis of Nonlinear Systems With Multiple Inputs", Preceedings of the IEEE, vol. 62, No. 8, Aug. 1974.
M. Nakayama et al,, "Techniques For Low Distortion And High Efficiency Power Amplifiers", MWE2004- Microwave Workshop Digest, pp. 575-584, 2004.

* cited by examiner

*Primary Examiner*—Hieu P Nguyen
(74) *Attorney, Agent, or Firm*—Young & Thompson

(57) ABSTRACT

A power amplifier of the present invention includes a distributor (76) for distributing an input signal; an anti-phase third-order intermodulation distortion generation circuit (63) for, upon receiving the input signal that was distributed by the distributor, generating third-order intermodulation distortion for which the phase difference is anti-phase with respect to each of two main signals of different frequencies and supplying the two main signals and the third-order intermodulation distortion; a first amplifier (61) for amplifying the signal received from the anti-phase third-order intermodulation distortion generation circuit and supplying the result; a second amplifier (62) for amplifying the input signal that was distributed by the distributor and supplying the result; and a synthesizer (64) for combining the output signal of the first amplifier and the output signal of the second amplifier.

10 Claims, 31 Drawing Sheets

POWER AMPLIFIER

TECHNICAL FIELD

The present invention relates to a power amplifier used in radio communication.

BACKGROUND ART

In radio transmitters used for high-speed communication, high linearity (low distortion characteristic) is required in amplifiers to transmit data correctly. An explanation follows below regarding the configuration and operation of an amplifier of the related art.

FIG. 1 is a block diagram showing a feed-forward amplifier for realizing a low-distortion characteristic. The feed-forward amplifier includes: amplifier 1, delay lines 10 and 11, subtractor 2 for synthesizing the signal from amplifier 1 and the signal from delay line 10 and extracting third-order intermodulation distortion 6, error amplifier 3 for amplifying third-order intermodulation distortion 6 to generate third-order intermodulation distortion 7, and synthesizer 4 for offsetting third-order intermodulation distortion 6 and third-order intermodulation distortion 7.

As a simple explanation of the operation of the feed-forward amplifier shown in FIG. 1, when input signal 12 is applied as input from input terminal 13, input signal 12 is applied to amplifier 1 and delay line 10. The output signal from amplifier 1 includes third-order intermodulation distortion 6 in addition to main signal 5 that has been amplified. Upon the input of the output signal from amplifier 1 and input signal 12 via delay line 10, subtractor 2 extracts third-order intermodulation distortion 6 generated in amplifier 1 by combining these signals. Error amplifier 3 amplifies third-order intermodulation distortion 6 that is received as input and supplies the result as third-order intermodulation distortion 7. Synthesizer 4 adds together main signal 5 that is received as input via delay line 11 and third-order intermodulation distortion 6 with third-order intermodulation distortion 7 from error amplifier 3, whereby third-order intermodulation distortion 9 resulting from the addition of third-order intermodulation distortion 6 and third-order intermodulation distortion 7 is offset in the signal supplied from output terminal 14. In this type of feed-forward amplifier, distortion compensation is achieved by using the distortion generated from the amplifier itself and can therefore achieve a high distortion compensation amount, as described in "MWE 2004 Microwave Workshop Digest," pp. 575-584, November 2004 (hereinbelow referred to as "Document 1").

In the feed-forward amplifier shown in FIG. 1, however, the adoption of a two-loop structure leads to the problems of large circuit scale and increases in cost, size, and power loss. A method of circumventing these problems is proposed in U.S. Pat. No. 2,973,684 (hereinbelow referred to as "Document 2"). FIG. 2 is a block diagram showing an amplification device of the distortion compensation method proposed in Document 2.

FIG. 2 is a block diagram showing an example of the configuration of an amplification device of the related art. As shown in FIG. 2, the amplification device is of a configuration that includes low-distortion amplifiers 21 and 22, high-distortion amplifier 23, phase equalizer 24 provided in the section following high-distortion amplifier 23, hybrid transformer 25, and synthesizer 26.

As a simple explanation of the operation of the amplification device shown in FIG. 2, upon input of input signal 37 from input terminal 35, hybrid transformer 25 splits input signal 37 into main signal 28 that is in-phase with input signal 37 and main signal 27 in which the phase of input signal 37 is inverted 180°. Main signal 28 is then applied as input to low-distortion amplifier 21 and main signal 27 is applied as input to high-distortion amplifier 23. By the amplification of main signal 28 by low-distortion amplifier 21 and low-distortion amplifier 22, main signal 29 in which main signal 28 has been amplified and third-order intermodulation distortion 30 are supplied from low-distortion amplifier 22.

In contrast, upon receiving main signal 27 from hybrid transformer 25, high-distortion amplifier 23 generates third-order intermodulation distortion 32 for distortion compensation from main signal 27. High-distortion amplifier 23 next supplies main signal 27 and third-order intermodulation distortion 32 as output. Phase equalizer 24 provided in the section following high-distortion amplifier 23, upon receiving main signal 27 and third-order intermodulation distortion 32 from high-distortion amplifier 23, corrects for the phase shift in low-distortion amplifier 21 regarding third-order intermodulation distortion 32 and corrects phase such that the phase is anti-phase with third-order intermodulation distortion 30 supplied from low-distortion amplifier 22. Phase equalizer 24 then supplies third-order intermodulation distortion 32 in which phase has been adjusted and main signal 31 that replaces main signal 27.

Synthesizer 26 combines main signal 29 and third-order intermodulation distortion 30 supplied from low-distortion amplifier 22 and main signal 31 and third-order intermodulation distortion 32 supplied from phase equalizer 24. In this way, third-order intermodulation distortion 34 supplied to output terminal 36 can be offset and the relative strength of third-order intermodulation distortion 34 with respect to main signal 33 at output terminal 36 can be decreased. By means of this approach, distortion compensation is possible by a single-loop construction and a reduction in circuit scale can be achieved.

On the other hand, a Doherty amplifier is described in the above-mentioned Document 1 as a method of improving efficiency at times of low power in a parallel construction. FIG. 3 is a block diagram showing an example of the configuration of a Doherty amplifier of the related art.

As shown in FIG. 3, a Doherty amplifier is of a configuration that includes main amplifier 41, auxiliary amplifier 42, $\lambda/4$ lines 43 and 44, synthesizer 45, input terminal 46, output terminal 47, and distributor 48. In addition, main amplifier 41 is set to a Class-A to Class-AB bias state, and auxiliary amplifier 42 is set to a Class-C bias state.

As a simple explanation of the operation of the Doherty amplifier shown in FIG. 3, upon the input of input signal 51 to input terminal 46, distributor 48 distributes input signal 51 to the path to main amplifier 41 and the path to $\lambda/4$ line 43 and auxiliary amplifier 42. Each of main amplifier 41 and auxiliary amplifier 42 amplify input signal 51 that is received. Main amplifier 41 amplifies input signal 51 and transmits the result to synthesizer 45 by way of $\lambda/4$ line 44. Auxiliary amplifier 42 amplifies input signal 51 that is received by way of $\lambda/4$ line 43 and transmits the result to synthesizer 45. Synthesizer 45 combines the signal that is received from main amplifier 41 via $\lambda/4$ line 44 and the signal received from auxiliary amplifier 42 to supply output terminal 47.

The configuration explained in FIG. 3 can be designed to use change of the output impedance of auxiliary amplifier 42 that accompanies increase of the input power to optimize efficiency of the load impedance of main amplifier 41 over a broad range of input power, whereby efficiency can be improved over a broad range of input power compared to a single main amplifier 41.

DISCLOSURE OF INVENTION

The first problem that is to be solved is the unnecessary power loss generated in the distortion compensation method of the related art.

For example, the need for error amplifier and delay circuits in the feed-forward amplifier referred to in FIG. 1 leads to the problem of increased power consumption. In particular, a drastic reduction in power efficiency occurs because distortion ideally should not occur in the error amplifier and the error amplifier must therefore be made somewhat large, and moreover, because the error amplifier itself does not supply a main signal. In addition, the occurrence of delay in the amplifier and error amplifier necessitates delay lines to implement satisfactory distortion compensation over a broad bandwidth. In particular, the provision of the delay lines on the output side of the main amplifier causes the problem of a reduction of the overall efficiency of the amplifier due to the loss in these lines.

In the output synthesizer in the distortion compensation amplification device referred to in FIG. 2, a drop in power of the main signal occurs because the main signal is combined in an anti-phase state, and the drop in power results in power loss, and therefore, a reduction of the power efficiency.

The second problem to be solved is the occurrence of large signal distortion and the deterioration in linearity in the high-efficiency amplifier of the related art.

For example, when the idle current of the amplifier is decreased and the bias condition is set to Class-C from a state close to Class-B to raise power efficiency or to suppress power consumption during idle operation, third-order intermodulation distortion that is in-phase with the main signal occurs and this third-order intermodulation distortion acts as a source of signal distortion. In the Doherty amplifier referred to in FIG. 3 as well, the problem of signal distortion also occurs that third-order intermodulation distortion 55 is generated because auxiliary amplifier 42 is set to the Class-C bias state and overall third-order intermodulation distortion 57 also increases.

The present invention was achieved for solving the problems of the above-described related art and has as an object the provision of a power amplifier that controls power loss and reduces distortion.

A power amplifier of the present invention includes a distributor for distributing an input signal; an anti-phase third-order intermodulation distortion generation circuit for, upon receiving the input signal that has been distributed by the distributor, generating anti-phase third-order intermodulation distortion having a phase difference in the range from +90° to +180° or in the range of from −180° to −90° with respect to each of two main signals of different frequency that are included in the input signal and supplying the above-described two main signals and third-order intermodulation distortion as output; a first amplifier for amplifying the signal received from the anti-phase third-order intermodulation distortion generation circuit and supplying the result as output; a second amplifier for amplifying the input signal distributed by the distributor and supplying the result as output; and a synthesizer for combining the output signal of the first amplifier and the output signal of the second amplifier.

In the present invention, although third-order intermodulation distortion that is in-phase with the main signal is generated when the input signal is amplified in the second amplification path, the amplitude of this third-order intermodulation distortion is reduced by the anti-phase third-order intermodulation distortion that is generated by the anti-phase third-order intermodulation distortion generation circuit. In addition, the main signal supplied from the synthesizer is a signal amplified by each of the first amplifier and second amplifier. As a result, a reduction of distortion can be achieved while suppressing the power loss during power synthesis that was generated in the parallel low-distortion amplifiers of the related art. In addition, the present invention enables an amplifier that operates with higher efficiency and lower distortion.

Figure 1:
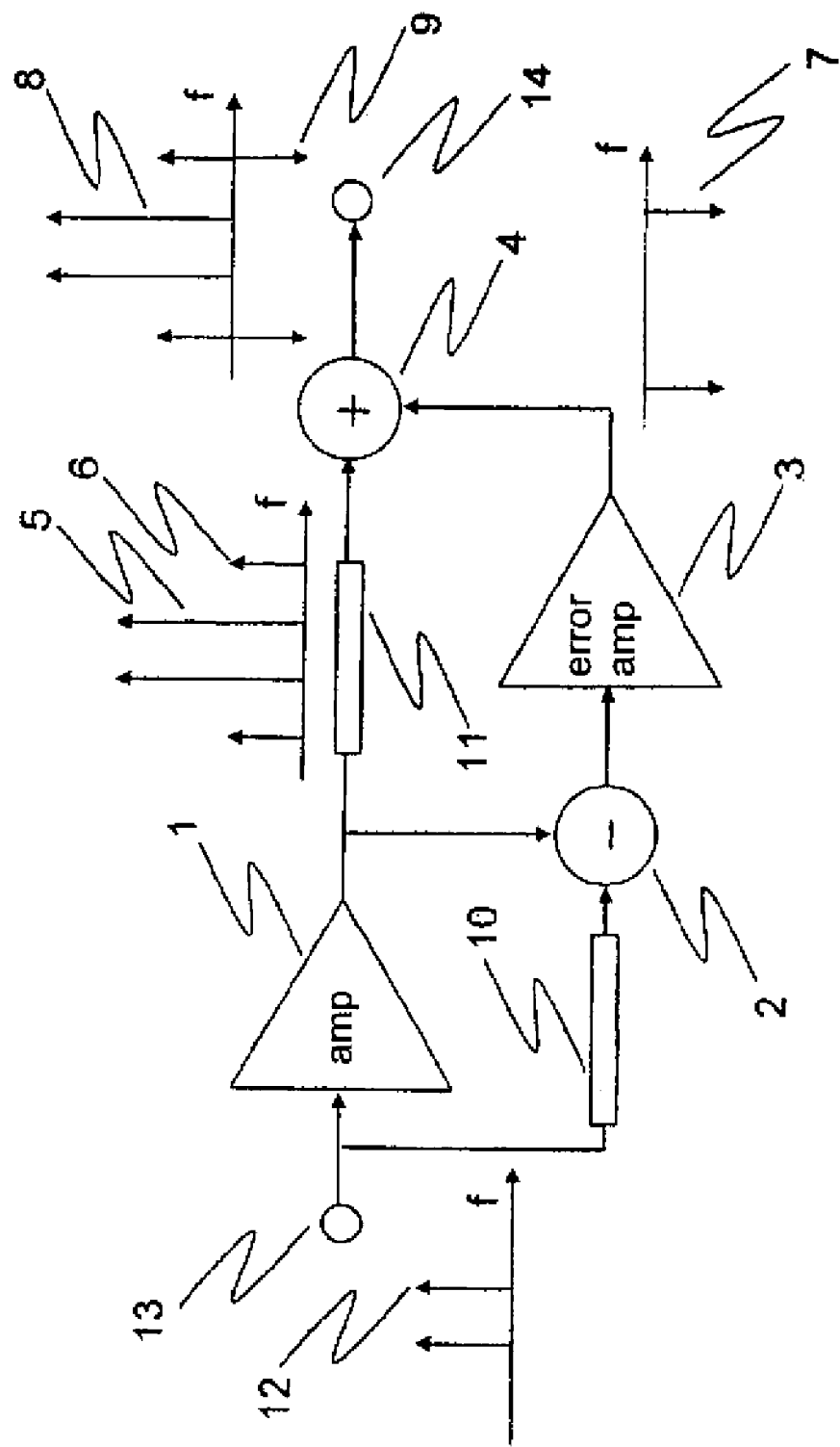
FIG. 1 is a block diagram showing an example of the configuration of a feed-forward amplifier of the related art.

EXPLANATION OF REFERENCE NUMBERS 1, 61, 61a, 61b, 62, 62a, 62b, 481, 491a, 491b, 561, 562 amplifier
2 subtractor
3 error-amplifier
4, 26, 45, 64, 64a, 64b synthesizer
5, 8, 27, 28, 29, 31, 33, 52, 54, 56, 66, 68, 68a, 68b, 70, 70a, 70b, 72, 121, 122, 528, 530, 538, 540 main signal
6, 7, 9, 30, 32, 34, 53, 55, 57, 67, 69, 69a, 69b, 71, 71a, 71b, 73, 123, 124, 141, 142, 143, 144, 529, 531, 539, 541 third-order intermodulation distortion
10, 11 delay line
12, 37, 51, 65 input signal
13, 35, 46, 74, 84 input terminal
14, 36, 47, 75, 85, 209 output terminal
21, 22, 481a, 481b, 482, 501, 501a, 502, 503 low-distortion amplifier
23 high-distortion amplifier
24 phase equalizer
25 hybrid transformer
41 main amplifier
42 auxiliary amplifier
43, 44, 167, 227, 511, 512 λ/4 line
48, 76, 76a, 76b distributor
63, 63a, 63b anti-phase third-order intermodulation distortion generation circuit
81 distortion generation circuit
82 phase-adjustment circuit
83 amplitude regulation circuit
86, 87, 109, 201, 203, 204, 205, 205a, 205b, 206, 207, 208, 264, 265, 266, 267, 268, 269 node
101 nonlinear element
102, 103, 104, 106 impedance element
105 signal source
108, 373 signal line
125, 126 third-order nonlinear process
145 second-order intermodulation distortion
147, 148 second-order harmonics
149, 150, 151, 152, 153, 154 second-order nonlinear process
161, 165, 168, 225, 228 bipolar transistor
162, 163, 166, 226, 341a, 341b, 351a, 351b, 371a, 371b, 422, 432, 442, 452, 551a, 551b, 553a, 553b capacitance element
164, 342, 352, 372, 423, 433, 443, 453, 552a, 554a inductor element
169, 170, 229, 391, 421, 431, 441, 451 resistance element
191, 251 input matching circuit
192, 192a, 192b, 194, 194a, 194b, 252, 254 power-supply stabilizing circuit
193, 253 output-matching circuit
281, 281a, 281b, 282, 282a, 282b, 283, 301, 302, 303 power-supply terminal
361a, 361b, 381, 424, 434, 444, 454, 461a, 461b, 462a, 462b, 483a, 483b, 511a, 512a circuit
401 field-effect transistor
411 diode

BEST MODE FOR CARRYING OUT THE INVENTION

The power amplifier of the present invention both maintains an amplification factor of a main signal and is provided with a circuit for generating anti-phase third-order intermodulation distortion for offsetting third-order intermodulation distortion that is generated when the main signal is amplified.

The power amplifier of the present invention is next described based on exemplary embodiments shown in the accompanying drawings. Identical constructions or parts equivalent to identical constructions are given the same reference numbers.

First Exemplary Embodiment

Explanation next regards the configuration of the power amplifier of the first exemplary embodiment of the present invention.

Figure 4:
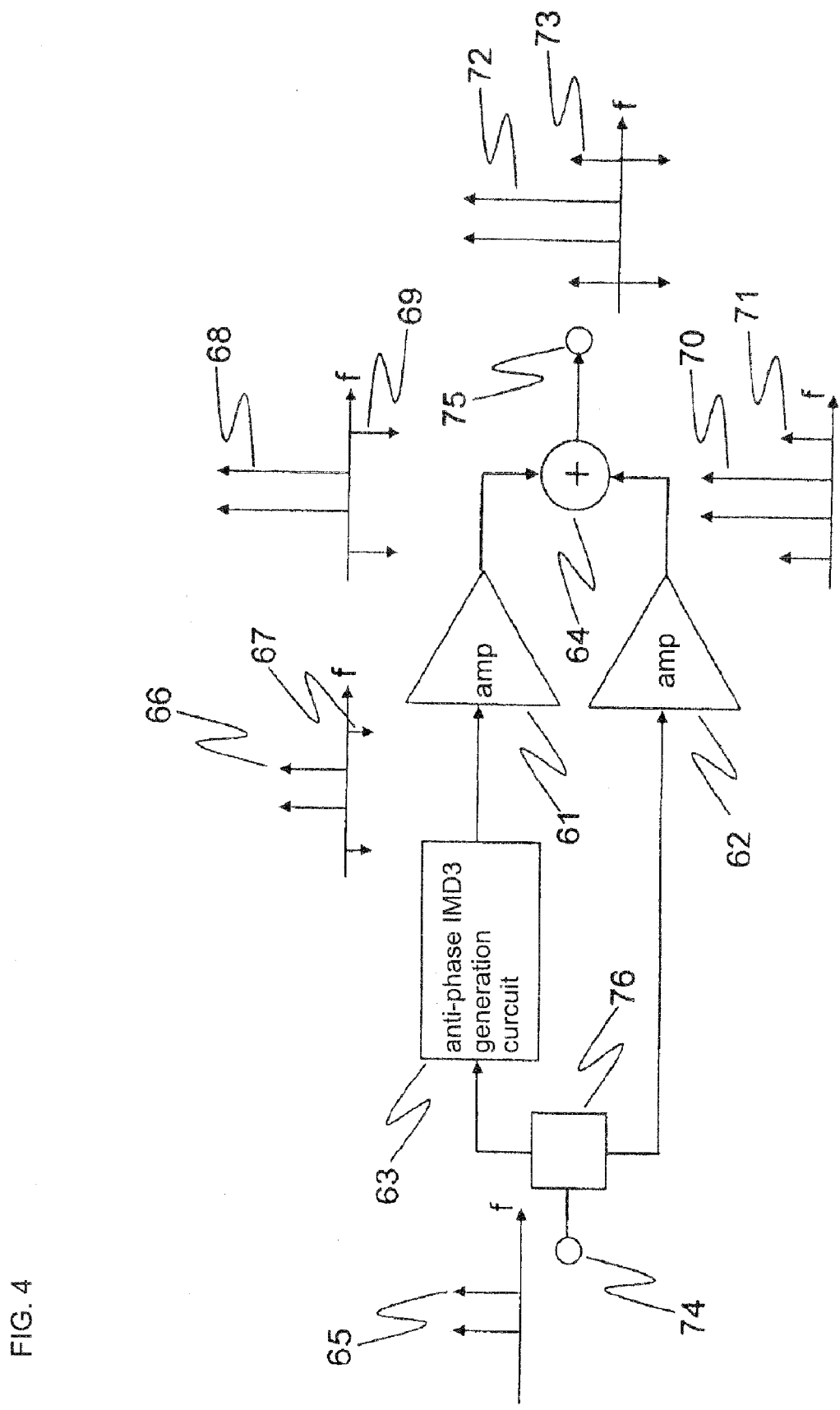
FIG. 4 is a block diagram showing an example of the configuration of a power amplifier according to the first exemplary embodiment.

FIG. 4 is a block diagram showing an example of the configuration of the power amplifier according to the first exemplary embodiment. As shown in FIG. 4, the power amplifier of the present exemplary embodiment includes distributor 76 for distributing input signal 65, third-order intermodulation distortion generation circuit 63 for supplying main signal 66 and third-order intermodulation distortion (IMD3) 67 that is anti-phase with main signal 66, amplifier 61 connected to the output side of anti-phase third-order intermodulation distortion generation circuit 63, amplifier 62 connected in parallel to anti-phase third-order intermodulation distortion generation circuit 63 and amplifier 61, and synthesizer 64 for combining the output signals of amplifier 61 and amplifier 62. Input terminal 74 for receiving an input signal from the outside is provided in the section preceding distributor 76. Output terminal 75 for supplying the output signal of synthesizer 64 is provided in the section following synthesizer 64. In the following explanation, the anti-phase third-order intermodulation distortion generation circuit is referred to as "anti-phase IMD3 generation circuit."

As shown in FIG. 4, the power amplifier of the present exemplary embodiment includes two sets of signal amplification paths. Of the two sets of amplification paths, in one anti-phase IMD3 generation circuit 63 and amplifier 61 are connected in a series, and the other is provided with amplifier 62.

"In-phase" is defined as having a phase difference in the range from −90° to +90°. "Anti-phase" is defined as having a phase difference in either of the range from +90° to +180° or the range from −90° to −180°.

Explanation next regards the operation of the power amplifier of the present exemplary embodiment.

In the configuration of the power amplifier shown in FIG. 4, when input signal 65 is applied from input terminal 74, distributor 76 distributes input signal 65 to each of anti-phase IMD3 generation circuit 63 and amplifier 62. Upon receiving input signal 65 from distributor 76, anti-phase IMD3 generation circuit 63 generates third-order intermodulation distortion 67 that is anti-phase with respect to main signal 66 that is contained in input signal 65 and transmits main signal 66 and third-order intermodulation distortion 67 to amplifier 61. Amplifier 61, upon receiving main signal 66 and third-order intermodulation distortion 67, amplifies each of these signals to generate main signal 68 and third-order intermodulation distortion 67 and then transmits main signal 68 and third-order intermodulation distortion 69 to synthesizer 64. The phase of third-order intermodulation distortion 69 is anti-phase with main signal 68.

On the other hand, upon receiving input signal 65 from distributor 76, amplifier 62 generates third-order intermodulation distortion 71 that is in-phase with main signal 70 that is contained in input signal 65 and transmits main signal 70 and third-order intermodulation distortion 71 to synthesizer 64. The output by amplifier 62 of third-order intermodulation distortion 71 that is in-phase with main signal 70 can be easily realized by decreasing the idle current of amplifier 62. Decreasing the idle current of amplifier 62 in turn leads to an increase in the power efficiency, and further, a suppression of the power consumption during idle operation.

In addition, because the phase shift of main signal 66 that is supplied from anti-phase IMD3 generation circuit 63 is small, the phase difference between main signal 68 supplied from amplifier 61 and main signal 70 supplied from amplifier 62 is also small, and the two signals are in-phase. Third-order intermodulation distortion 69 supplied from amplifier 61 and third-order intermodulation distortion 71 supplied from amplifier 62 are also in an anti-phase relation.

Synthesizer 64 next combines main signal 68 and third-order intermodulation distortion 69 received from amplifier 61 with main signal 70 and third-order intermodulation distortion 71 received from amplifier 62. Main signal 72 obtained by combining main signal 68 and main signal 70 and third-order intermodulation distortion 73 obtained by combining third-order intermodulation distortion 69 and third-order intermodulation distortion 71 are next supplied from output terminal 75. Because third-order intermodulation distortion 69 and third-order intermodulation distortion 71 are in an anti-phase relation as described hereinabove, third-order intermodulation distortion 69 and third-order intermodulation distortion 71 offset each other. As a result, the relative strength of third-order intermodulation distortion 73 with respect to main signal 72 can be decreased at output terminal 75.

Figure 2:
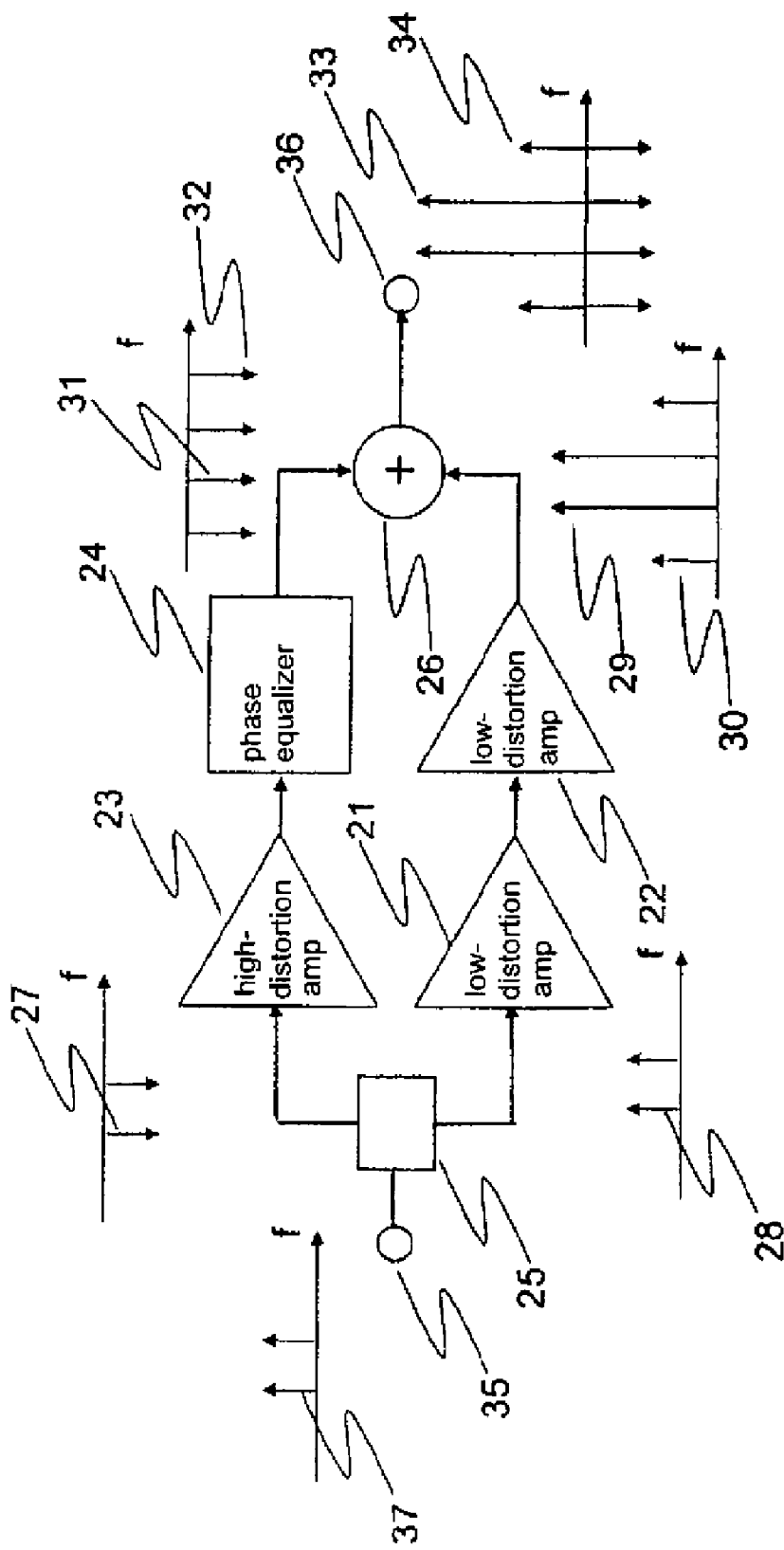
FIG. 2 is a block diagram showing an example of the configuration of an amplifier provided with a distortion compensation mode of the related art.
Figure 3:
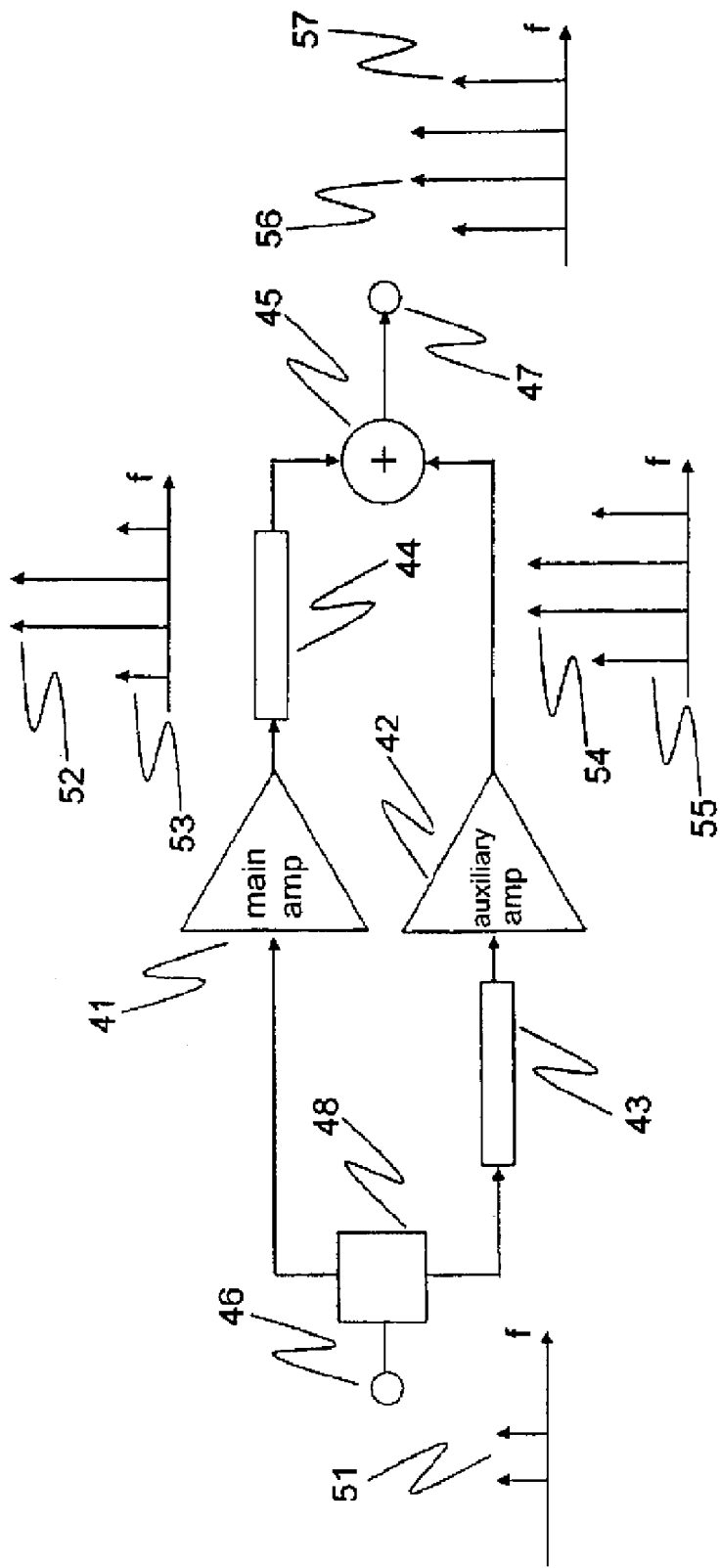
FIG. 3 is a block diagram showing an example of the configuration of a Doherty amplifier of the related art.

In addition, because main signal 68 supplied from amplifier 61 and main signal 70 supplied from amplifier 62 are in an in-phase relation, the power loss during synthesis that was a problem in the example of the related art described in FIG. 2 is suppressed. In the configuration of the power amplifier shown in FIG. 4, the number of sections of amplifier 61 and amplifier 62 is not limited to one section for each and a multi-stage construction can be adopted.

Explanation next regards the configuration of anti-phase IMD3 generation circuit 63.

Figure 5:
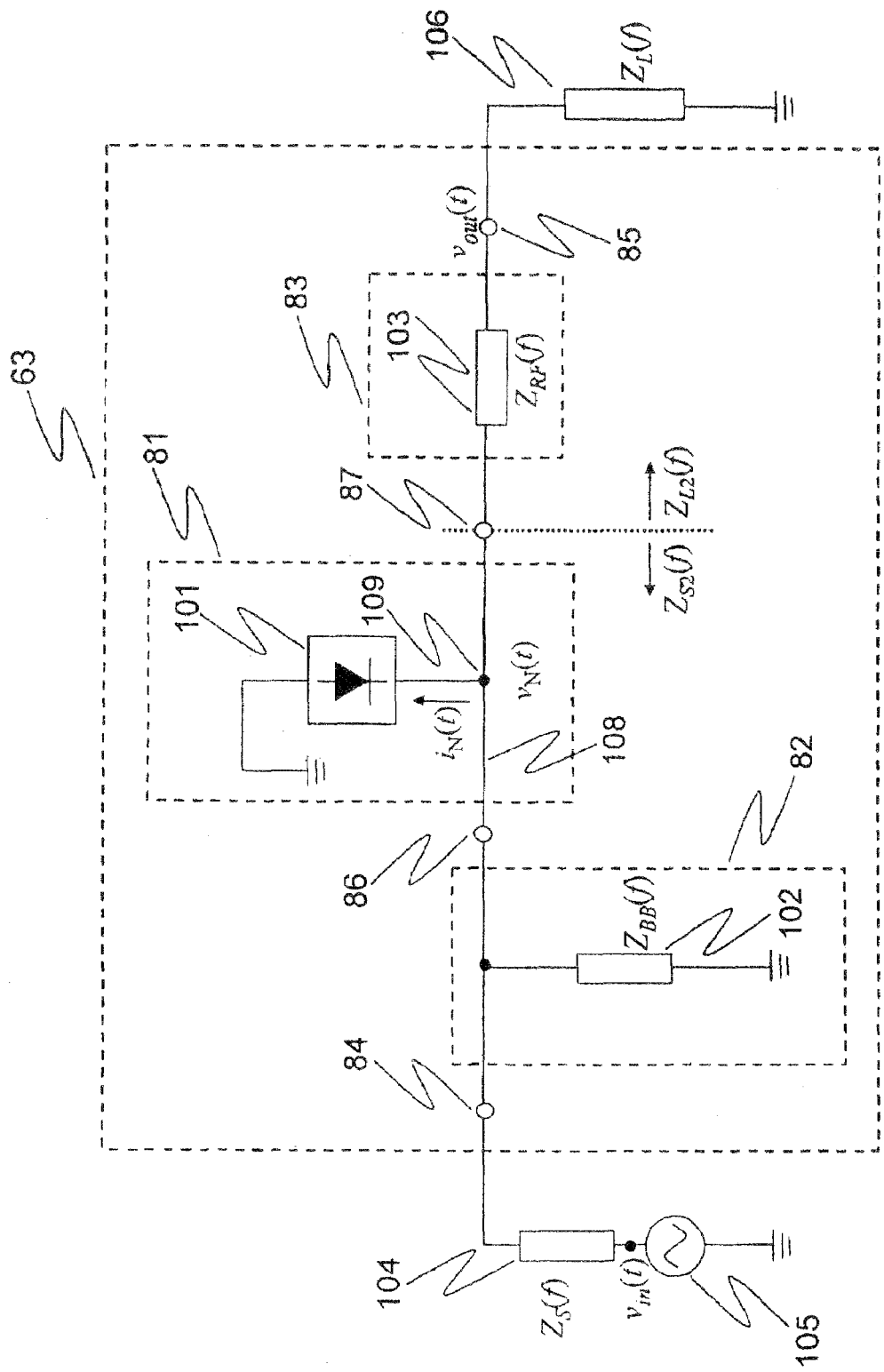
FIG. 5 is a block diagram showing an example of the configuration of an anti-phase third-order intermodulation distortion generation circuit in the power amplifier shown in FIG. 4.

FIG. 5 is a block diagram showing an example of the configuration of anti-phase IMD3 generation circuit 63. As shown in FIG. 5, anti-phase IMD3 generation circuit 63 includes input terminal 84, distortion generation circuit 81, third-order intermodulation distortion phase-adjustment circuit 82, third-order intermodulation distortion amplitude regulation circuit 83, and output terminal 85. In the following explanation, the third-order intermodulation distortion phase-adjustment circuit is referred to as simply "phase-adjustment circuit" and the third-order intermodulation distortion amplitude regulation circuit is referred to as simply "amplitude regulation circuit."

Distortion generation circuit 81 supplies third-order intermodulation distortion that is necessary for distortion compensation. Phase-adjustment circuit 82 sets the optimum phase of the third-order intermodulation distortion supplied from distortion generation circuit 81 by setting the load impedance in the difference frequency band impedance of distortion generation circuit 81 to the optimum value. The difference frequency band refers to the frequency band that corresponds to the difference in frequencies of the two main signals (desired waves) received as input or to the frequency band that corresponds to the modulation bandwidth of the modulated waves that are received as input.

Amplitude regulation circuit 83 sets the amplitude of the third-order intermodulation distortion that is supplied from distortion generation circuit 81 to the optimum value by setting the load impedance in the RF fundamental wave band of distortion generation circuit 81 to the optimum value. The RF fundamental wave band refers to the carrier wave of the input signal and the frequency band in its vicinity.

The connection relation between distortion generation circuit 81, phase-adjustment circuit 82, and amplitude regulation circuit 83 is not limited to the configuration shown in FIG. 5 and may be of any configuration by which load impedance of the RF fundamental wave band and difference frequency band of distortion generation circuit 81 can be set to the optimum values in phase-adjustment circuit 82 and amplitude regulation circuit 83. For example, the configuration is not limited to the configuration shown in FIG. 5 in which distortion generation circuit 81 is arranged between phase-adjustment circuit 82 and amplitude regulation circuit 83, and may be a configuration in which phase-adjustment circuit 82 is arranged between distortion generation circuit 81 and amplitude regulation circuit 83, or may be a configuration in which amplitude regulation circuit 83 is arranged between distortion generation circuit 81 and phase-adjustment circuit 82.

Referring to FIG. 5, explanation next regards the details of the principles of the function realized by phase-adjustment circuit 82 that sets the phase of third-order intermodulation distortion that is supplied from distortion generation circuit 81 to an optimum value. In addition, explanation also regards the details of the principles of the functions realized by amplitude regulation circuit 83 that sets the amplitude of third-order intermodulation distortion supplied from distortion generation circuit 81 to an optimum value.

As shown in FIG. 5, distortion generation circuit 81 includes non-linear element 101, one end of non-linear element 101 being connected to signal line 108 at node 109. The voltage $v_N(t)$ and current $i_N(t)$ of non-linear element 101 at node 109 with signal line 108 has the nonlinear characteristic represented by Equation (1), Equation (2), and Equation (3) using DC voltage $v_{N\_DC}(t)$ and DC current $i_{N\_DC}(t)$ during idle, AC voltage $v_{N\_AC}(t)$ and AC current $i_{N\_AC}(t)$ during signal input, and parameter $K_n$ (n=1, 2, 3, ...) that represents nonlinearity.

[Equation 1]

$$v_N(t) = v_{N\_DC} + v_{N\_AC}(t) \tag{1}$$

[Equation 2]

$$i_N(t) = i_{N\_DC} + i_{N\_AC}(t) \tag{2}$$

[Equation 3]

$$i_{N\_AC}(t) = K_1 v_{N\_AC}(t) + K_2 \{v_{N\_AC}(t)\}^2 + K_3 \{v_{N\_AC}(t)\}^3 + \tag{3}$$

In the configuration of FIG. 5, moreover, phase-adjustment circuit 82 includes impedance element 102 with one end of impedance element 102 being connected to signal line 108. Here, the impedance of impedance element 102 is represented by $Z_{BB}(f)$.

In addition, amplitude regulation circuit 83 includes impedance element 103, impedance element 103 being connected in a series to signal line 108. Here, the impedance of impedance element 103 is represented by $Z_{RF}(f)$.

In the configuration of FIG. 5, impedance element 106 represents load impedance $Z_L(f)$ that is connected to output terminal 85 of anti-phase IMD3 generation circuit 63.

Impedance element 104 represents load impedance $Z_S(f)$ that is connected to input terminal 84 of anti-phase IMD3 generation circuit 63. This load impedance $Z_S(f)$ is designed to be in a state close to conjugate conformity with the input impedance of anti-phase IMD3 generation circuit 63 in the RF fundamental wave band and assumes the suitable transmission of signal power. In this case, impedance $Z_{L2}(f)$ when viewing the side of amplitude regulation circuit 83 and impedance $Z_{S2}(f)$ when viewing the side of phase-adjustment circuit 82 and distortion generation circuit 81 are in a state approaching conjugate conformity.

In the example of the configuration shown in FIG. 5, signal source 105 is connected to the input of anti-phase IMD3 generation circuit 63, and 2tone signal $v_{in}(t)$ of Equation (5) in which the desired frequencies are $f_1$ and $f_2$ (where $f_1 < f_2$) and the maximum voltage amplitude is A is assumed to be applied as input from signal source 105.

[Equation 4]

$$v_{in}(t) = \frac{A}{2} \{\cos(2\pi f_1 t) + \cos(2\pi f_2 t)\}, \tag{4}$$

In the configuration of anti-phase IMD3 generation circuit 63 of the above-described FIG. 5, main signal (complex spectrum) $d_{-1}$ of frequency $f_1$ supplied from output terminal 85, main signal (complex spectrum) $d_1$ of frequency $f_2$, third-order intermodulation distortion (complex spectrum) $d_{-3}$ of frequency $2f_1 - f_2$, and third-order intermodulation distortion (complex spectrum) $d_3$ of frequency $2f_1 - f_2$ are calculated using the procedures of a Volterra series method described in the document "Proceedings of the IEEE, vol. 62, no. 8, pp. 1088-1098, August 1974" as shown from Equation (5) to Equation (11).

[Equation 5]

$$d_1 = d_{-1} = \left(\frac{A}{2}\right) \frac{Z_L(f_c)}{\text{Re}(Z_{L2}(f_c))} + O(A^3), \tag{5}$$

[Equation 6]

$$d_3 = d_{N3} = d_{N2B} = d_{N2H} + O(A^5), \tag{6}$$

[Equation 7]

$$d_{-3} = d_{N3} + (d_{N2B})^* + d_{N2H} + O(A^5), \tag{7}$$

[Equation 8]

$$d_{N3} = -\frac{3}{4}\left(\frac{A}{2}\right)^3 K_3 Z_Q(f_c), \tag{8}$$

[Equation 9]

$$d_{N2B} = 2\left(\frac{A}{2}\right)^3 K_2^2 Z_Q(f_c) \cdot (Z_{L2}(\Delta f) \| Z_{S2}(\Delta f)), \tag{9}$$

[Equation 10]

$$d_{N2H} = 2\left(\frac{A}{2}\right)^3 K_2^2 Z_Q(f_c) \cdot (Z_{L2}(2f_c) \| Z_{S2}(2f_c)), \tag{10}$$

[Equation 11]

$$Z_Q(f_c) \equiv \left(\frac{|Z_{L2}(f_c)|}{2\,\text{Re}(Z_{L2}(f_c))}\right)^4 \cdot Z_L(f_c) \tag{11}$$

In the above-described equations, $f_c$ represents the frequency of the carrier wave ($=(f_1+f_2)/2 \sim f_1 \sim f_2$), and $\Delta f$ represents the difference frequency ($=f_2-f_1$), i.e., the frequency that corresponds to the difference between frequencies of the two main signals (desired waves).

The notation (A∥B) represents the parallel composite impedance of impedances A and B, and the notation (A)* represents the complex conjugate of A.

Figure 6:
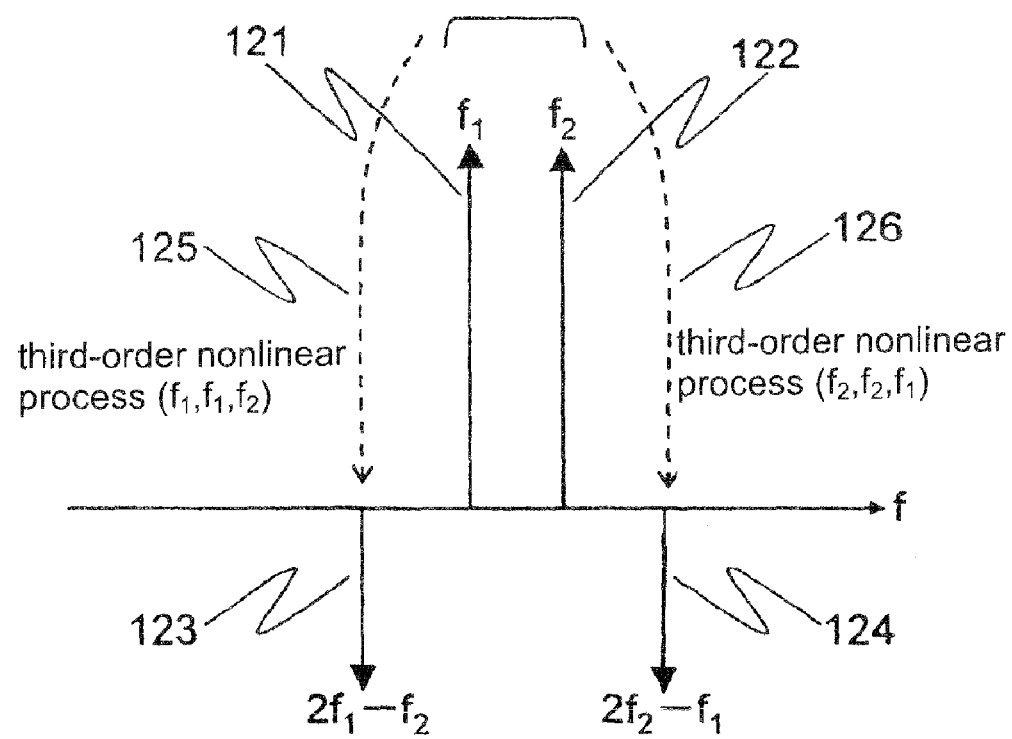
FIG. 6 is a schematic view showing a third-order non-linear process and the third-order intermodulation distortion that is generated by this process.
Figure 7:
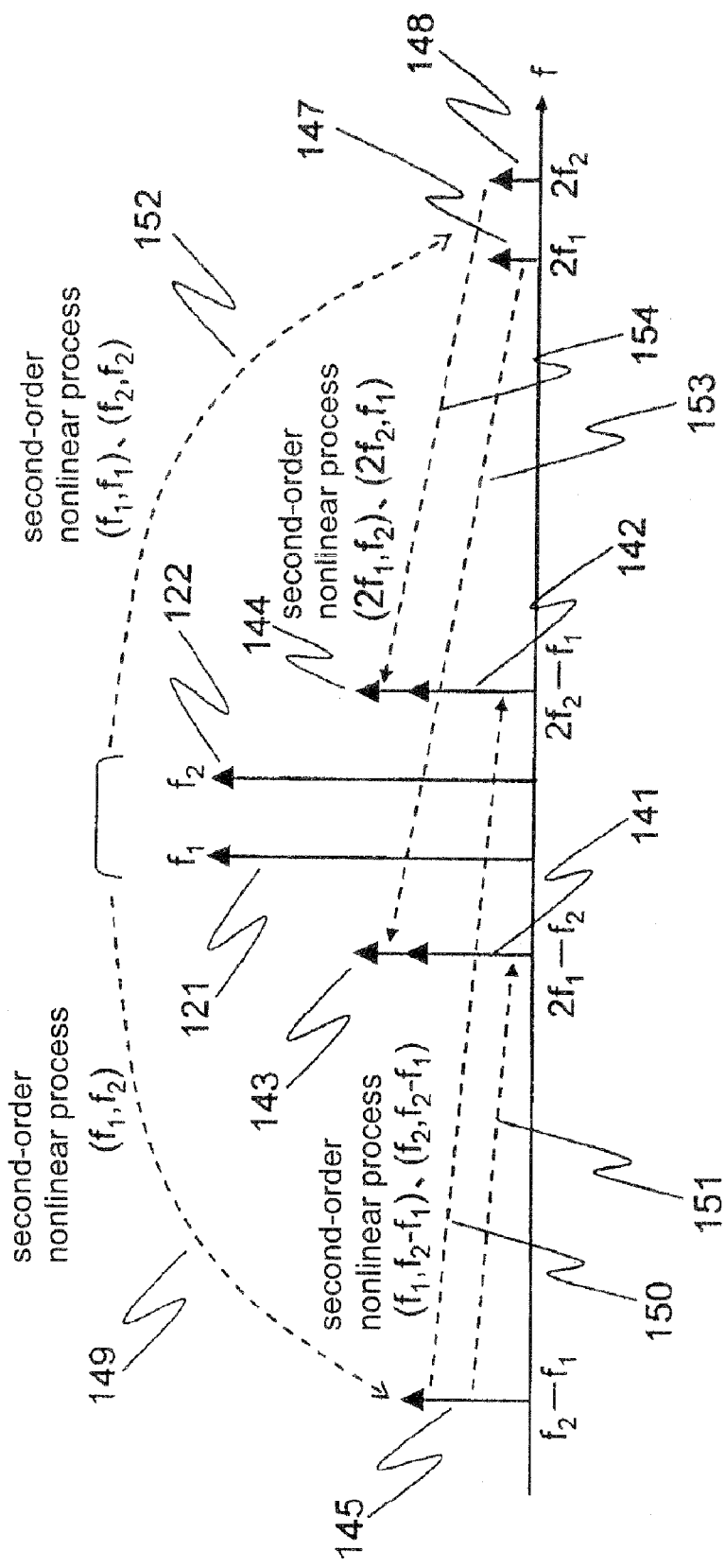
FIG. 7 is a schematic view showing a second-order non-linear process and the third-order intermodulation distortion that is generated by this process.

FIG. 6 and FIG. 7 are figures for explaining the process of generating third-order intermodulation distortion.

The value $d_{N3}$ in Equation (6), Equation (7), and Equation (8) represents third-order intermodulation distortion 123 and 124 shown in FIG. 6. Third-order intermodulation distortion 123 and 124 are generated by mixing main signals 121 and 122 by third-order nonlinear processes 125 and 126.

The value $d_{N2B}$ in Equation (6), Equation (7), and Equation (9) represents third-order intermodulation distortion 142 shown in FIG. 7. As shown in FIG. 7, second-order intermodulation distortion 145 is generated by mixing main signals 121 and 122 by second-order nonlinear process 149, and third-order intermodulation distortion 142 is generated by remixing this second-order intermodulation distortion 145 with main signal 122 by second-order nonlinear process 150. Third-order intermodulation distortion 141 that is generated by remixing second-order intermodulation distortion 145 with main signal 122 by second-order nonlinear process 151, is $(d_{N2B})^*$ which is the complex conjugate of $d_{N2B}$.

In addition, $d_{N2H}$ in Equation (6), Equation (7), and Equation (10) represents third-order intermodulation distortion 143 and 144 shown in FIG. 7. As shown in FIG. 7, second-order harmonics 147 and 148 are generated by mixing main signals 121 and 122 by second-order nonlinear process 152, and third-order intermodulation distortion 143 and 144 are generated by remixing these second-order harmonics 147 and 148 with main signals 121 and 122 by second-order nonlinear processes 153 and 154.

As shown in Equation (10), amplitude $|d_{N2H}|$ of third-order intermodulation distortion 143 and 144 that is generated by way of second-order harmonics 147 and 148 is proportional to impedance $|Z_{L2}(2f_c)\|Z_{S2}(2f_c)|$ of the second-order harmonic band. Impedance $|Z_{L2}(2f_c)\|Z_{S2}(2f_c)|$ of the second-order harmonic band is normally a value as low as from several Ω to several tens of Ω, and $|d_{N2H}|$ is therefore also small. Third-order intermodulation distortion 143 and 144 that are generated by way of second-order harmonics 147 and 148 are of a negligible strength with respect to third-order intermodulation distortion $d_{N3}$ that is generated by third-order nonlinear processes 125 and 126.

As shown by Equation (9), amplitude $|d_{N2B}|$ of third-order intermodulation distortion 141 and 142 by way of second-order intermodulation distortion 145 is proportional to differential frequency band impedance $|Z_{L2}(\Delta f)\|Z_{S2}(\Delta f)|$. Differential frequency band impedance $|Z_{L2}(\Delta f)\|Z_{S2}(\Delta f)|$ is normally a comparatively high value of from several hundred Ω to several thousand Ω in a state lacking phase-adjustment circuit 82. As a result, third-order intermodulation distortion 141 and 142 that are generated by way of second-order intermodulation distortion 145 can have a larger amplitude than third-order intermodulation distortion 123 and 124 that are generated by third-order nonlinear processes 125 and 126. In contrast, third-order intermodulation distortion 141 and 142 that are generated by way of second-order intermodulation distortion 145 are suppressed if phase-adjustment circuit 82 is provided and $|Z_{L2}(\Delta f)\|Z_{S2}(\Delta f)|$ is decreased to a level below several tens of Ω.

Third-order intermodulation distortion 123 and 124 that are generated by third-order nonlinear processes 125 and 126 do not depend on difference frequency band impedance $|Z_{L2}(\Delta f)\|Z_{S2}(\Delta f)|$, as shown in Equation (8). As a result, third-order intermodulation distortion 123 and 124 generated by third-order nonlinear processes 125 and 126 are not greatly changed even if phase-adjustment circuit 82 is provided. Accordingly, only third-order intermodulation distortion 141 and 142 that are generated by way of second-order intermodulation distortion 145 are suppressed by the provision of phase-adjustment circuit 82, and third-order intermodulation distortion 123 and 124 that are generated by third-order nonlinear processes 125 and 126 can be supplied as the principal component of the third-order intermodulation distortion.

The phase difference of main signal 122 and third-order intermodulation distortion 142 that is generated by way of second-order intermodulation distortion 145 is calculated as shown in Equation (12).

Equation (12)

$$\angle(d_{N2B}) - \angle(d_1) = \angle\left(\frac{d_{N2B}}{d_{out1}}\right) \approx \angle(Z_{L2}(\Delta f) \| Z_{S2}(\Delta f)) \tag{12}$$

The phase difference of main signal 121 and third-order intermodulation distortion 141 that is generated by way of second-order intermodulation distortion 145 is calculated as shown in Equation (13).

Equation (13)

$$\angle(d_{N2B})^* - \angle(d_1) = \angle\left(\frac{(d_{N2B})^*}{d_{out1}}\right) \approx \angle(Z_{L2}(\Delta f) \| Z_{S2}(\Delta f)) \tag{13}$$

Based on the condition that difference frequency band impedance $|Z_{L2}(\Delta f)\|Z_{S2}(\Delta f)|$ is not negative, i.e., the condition that the real part of impedance is positive, the phase difference of third-order intermodulation distortion 142 and main signal 122 calculated by Equation (12) and the phase difference of third-order intermodulation distortion 141 and main signal 121 calculated by Equation (13) are each in the range of from −90° to +90°. In other words, third-order intermodulation distortion 141 and 142 generated by way of second-order intermodulation distortion 145 are in-phase with main signals 121 and 122.

The phase differences of main signals 121 and 122 and third-order intermodulation distortion 123 and 124 generated by third-order nonlinear processes 125 and 126 are calculated as shown in Equation (14).

[Equation (14)]

$$\angle(d_{N3}) - \angle(d_1) = \angle(d_{N3}) - \angle(d_{-1}) = \angle\left(\frac{d_{N3}}{d_1}\right) \approx \angle(-K_3) \tag{14}$$

In Equation (14), the phase difference between main signals 121 and 122 and third-order intermodulation distortion 123 and 124 that are generated by third-order nonlinear processes 125 and 126 is 180° if coefficient $K_3$ that represents the third-order nonlinear process is positive. In other words, third-order intermodulation distortion 123 and 124 that are generated by third-order nonlinear processes 125 and 126 are anti-phase with main signals 121 and 122. Accordingly, the use of a nonlinear element in which coefficient $K_3$ that represents a third-order nonlinear process is positive as nonlinear element 101 can realize a state in which third-order intermodulation distortion 123 and 124 that are generated by third-order nonlinear processes 125 and 126 are anti-phase with main signals 121 and 122.

As described hereinabove, third-order intermodulation distortion 141 and 142 that are generated by way of second-order intermodulation distortion 145 are in-phase with main signals 121 and 122, and third-order intermodulation distortion 123 and 124 that are generated by third-order nonlinear processes 125 and 126 are anti-phase with main signals 121 and 122.

In addition, as previously described, third-order intermodulation distortion 141 and 142 that are generated by way of second-order intermodulation distortion 145 are suppressed if phase-adjustment circuit 82 is provided and $|Z_{L2}(\Delta f)\|Z_{S2}(\Delta f)|$ is reduced to the order of several tens of Ω or less. Third-order intermodulation distortion 123 and 124 that are anti-phase with main signals 121 and 122 and that are generated by third-order nonlinear processes 125 and 126 can then be supplied as the principal component of third-order intermodulation distortion. In this case, third-order intermodulation distortion 67 supplied as output from anti-phase IMD3 generation circuit 63 is anti-phase with main signal 66.

On the other hand, if phase-adjustment circuit 82 is not provided or the impedance in a frequency that corresponds to the difference frequency band of phase-adjustment circuit 82 is as high as several hundred Ω or more, third-order intermodulation distortion 141 and 142 that are in-phase with main signals 121 and 122 and that are generated by way of second-order intermodulation distortion 145 become the principal component of the third-order intermodulation distortion. As a result, third-order intermodulation distortion 67 that is supplied from anti-phase IMD3 generation circuit 63 is in-phase with main signal 66.

By thus using phase-adjustment circuit 82 to adjust difference frequency impedance $|Z_{L2}(\Delta f)||Z_{S2}(\Delta f)|$, the phase difference between the main signal and the third-order intermodulation distortion can be set to the optimum value.

It can be seen from Equations (6)-(10) that both amplitude $|d_{-3}|$ of the third-order intermodulation distortion of frequency $2f_1-f_2$ and amplitude $|d_3|$ of the third-order intermodulation distortion of frequency $2f_1-f_2$ that are supplied from output terminal 85 are proportional to impedance amount $|Z_Q(f_c)|$ in the RF fundamental wave band defined by Equation (11). In addition, as shown in Equation (11), impedance amount $|Z_Q(f_c)|$ increases monotonically with respect to the ratio $|Z_{L2}(f_c)|/\mathrm{Re}[Z_{L2}(f_c)]$ of the real part and absolute value of impedance $Z_{L2}(f_c)$ of the RF fundamental wave band when viewing the side of amplitude regulation circuit 83.

Accordingly, regulating amplitude regulation circuit 83 such that the ratio $|Z_{L2}(f_c)|/\mathrm{Re}[Z_{L2}(f_c)]$ of the real part and absolute value of impedance $Z_{L2}(f_c)$ increases enables an increase in the amplitude of third-order intermodulation distortion 67 supplied from anti-phase IMD3 generation circuit 63. On the other hand, regulating amplitude regulation circuit 83 such that the ratio $|Z_{L2}(f_c)|/\mathrm{Re}[Z_{L2}(f_c)]$ of the real part and absolute value of impedance $Z_{L2}(f_c)$ decreases enables the decrease of the amplitude of third-order intermodulation distortion 67 supplied from anti-phase IMD3 generation circuit 63.

Using amplitude regulation circuit 83 in this way enables regulation of the ratio $|Z_{L2}(f_c)|/\mathrm{Re}[Z_{L2}(f_c)]$ of the real part and absolute value of impedance $Z_{L2}(f_c)$ when viewing the side of amplitude regulation circuit 83 and allows setting the amplitude of third-order intermodulation distortion 67 that is supplied from anti-phase IMD3 generation circuit 63 to the optimal value.

In the present invention, the amplitude of third-order intermodulation distortion 67 that is supplied from anti-phase IMD3 generation circuit 63 can be set to the optimum value by amplitude regulation circuit 83, and the phase of third-order intermodulation distortion 67 supplied from anti-phase IMD3 generation circuit 63 can be set to the optimum value by phase-adjustment circuit 82.

Accordingly, in the configuration of FIG. 4, setting the amplitude and phase of third-order intermodulation distortion 67 supplied from anti-phase IMD3 generation circuit 63 to optimum values enables setting optimum values to achieve a state in which the phase of third-order intermodulation distortion 69 supplied from amplifier 61 is anti-phase or nearly anti-phase with third-order intermodulation distortion 71 supplied from amplifier 62, and moreover, in which the amplitude of these two third-order intermodulation distortions 69 and 71 is the same or nearly the same, whereby a low-distortion state can be achieved in which third-order intermodulation distortion 69 and 71 offset each other.

In the present invention, the amplitude and phase of third-order intermodulation distortion 67 supplied from anti-phase IMD3 generation circuit 63 can each be set to optimum values by the separate means of amplitude regulation circuit 83 and phase-adjustment circuit 82, whereby the advantage is obtained that both the amplitude and phase of third-order intermodulation distortion 67 can be easily set simultaneously to values ideal for distortion compensation.

Although 2tone signal represented by Equation (4) was used as the input signal in the above-described explanation, in actuality, the input signal is not limited to a 2tone signal when using the circuit of the present invention and a typical modulated signal may also be applied as input. As described in the document "Microwave Journal, vol. 42, no. 12, pp. 70-84, December, 1999," an amplifier that decreases intermodulation distortion, which is the distortion index when a 2tone signal is applied as input, can also reduce a distortion index such as the adjacent channel power ratio (ACPR) that is used when modulated waves are applied as input. As a result, the circuit of the present invention can effectively reduce distortion even when a typical modulated wave is applied as input instead of a 2tone signal.

Second Exemplary Embodiment

Figure 8:
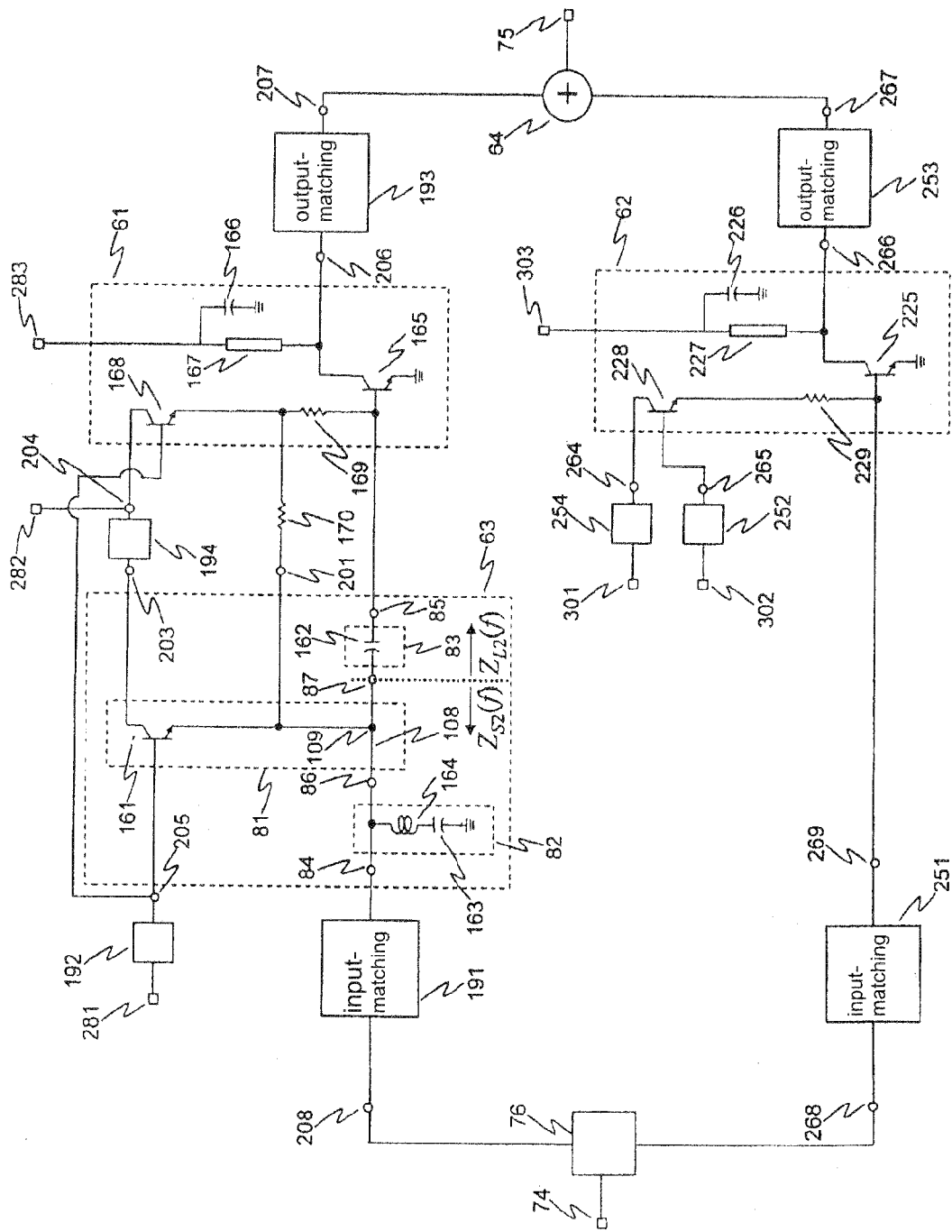
FIG. 8 is a block diagram showing an example of the configuration of a power amplifier according to the second exemplary embodiment.

Explanation next regards the configuration of the power amplifier of the second exemplary embodiment of the present invention. FIG. 8 is a block diagram showing an example of the configuration of the power amplifier according to the second exemplary embodiment.

As shown in FIG. 8, the power amplifier of the present exemplary embodiment includes: distributor 76 for distributing an input signal, anti-phase IMD3 generation circuit 63 for supplying a main signal and a third-order intermodulation distortion that is anti-phase with the main signal, amplifier 61 that is connected to the output of the anti-phase IMD3 generation circuit 63, amplifier 62 that is connected in parallel with anti-phase IMD3 generation circuit 63 and amplifier 61, and synthesizer 64 that combines the output signals of amplifier 61 and amplifier 62. Input terminal 74 is provided in the section preceding distributor 76, and output terminal 75 is provided in the section after synthesizer 64. The details regarding each configuration are described hereinbelow.

As shown in FIG. 8, amplifier 61 is made up from bipolar transistor 165 having an amplification action, a base bias circuit made up from bipolar transistor 168 and resistance element 169, and a collector bias circuit made up from λ/4 line 167 and capacitance element 166. An RF signal is applied as input to the base terminal of bipolar transistor 165. The collector terminal is the output terminal of the RF signal, and the collector voltage of bipolar transistor 165 is applied from power-supply terminal 283.

Amplifier 62 has a similar construction and is of a configuration that includes bipolar transistor 225 having an amplification action, a base bias circuit made up from bipolar transistor 228 and resistance element 229, and a collector bias circuit made up from λ/4 line 227 and capacitance element 226, the collector voltage of bipolar transistor 225 being applied from the power-supply terminal.

In the present invention, the circuit configurations of amplifiers 61 and 62 are not limited to the configurations shown in FIG. 8, the only requirement being that amplifiers 61 and 62 be circuits having an amplification action. For example, field-effect transistors may be used in place of the bipolar transistors used in amplifiers 61 and 62, and choke coils may be used in place of λ/4 lines in the collector bias circuits. In addition, the base bias circuits of amplifiers 61 and 62 are not limited to a circuit configuration made up from bipolar transistor 168 and resistance element 169 but may be of a circuit configuration that can apply bias appropriately to an amplification element such as bipolar transistor 165. In addition, amplifiers 61 and 62 are not limited to a single-stage configuration and can employ amplifiers of a multistage configuration. In this way, a variety of modifications other than the circuit configurations of amplifiers 61 and 62 shown in FIG. 8 can be considered as examples of circuits having an amplification action.

In the exemplary embodiment shown in FIG. 8, the collector voltage of bipolar transistor 168 included in the base bias circuit of amplifier 61 is applied by way of power-supply stabilizing circuit 194 and power-supply terminal 282. The base voltage of bipolar transistor 168 is applied by way of power-supply stabilizing circuit 192 and power-supply terminal 281. Similarly, the collector voltage of bipolar transistor 228 contained in the base bias circuit of amplifier 62 is applied by way of power-supply stabilizing circuit 254 and power-supply terminal 301, and the base voltage of bipolar transistor 228 is applied by way of power-supply stabilizing circuit 252 and power-supply terminal 302.

Each of power-supply stabilizing circuits 192 and 194 and power-supply stabilizing circuits 252 and 254 limits the transfer of the voltage fluctuation of each of power-supply terminals 281 and 282 and power-supply terminals 301 and 302 to each of bipolar transistor 168 and bipolar transistor 228. As a result, DC voltage in which the voltage fluctuation is controlled is supplied to bipolar transistors 168 and 228.

Although the use of power-supply stabilizing circuits 192, 194, 252, 254 is desirable, the use of the power-supply stabilizing circuits is not necessary in the present invention, and DC voltage may be applied from power-supply terminals 281 and 282 and power-supply terminals 301 and 302 directly to bipolar transistor 168 and bipolar transistor 228.

In addition, although power-supply terminals 281, 282, 283, 301, 302, and 303 are provided in the exemplary embodiment shown in FIG. 8, a plurality of these power-supply terminals may be connected and collected as a single terminal, and voltage may be applied to this plurality of power-supply terminals from one power supply.

In the exemplary embodiment shown in FIG. 8, input-matching circuit 191 for appropriately transferring an input signal is provided in the section preceding anti-phase IMD3 generation circuit 63, and input-matching circuit 251 for appropriately transferring an input signal is provided in the section preceding amplifier 62. Either of input-matching circuits 191 and 251 may be made up from a low-pass filter or a high-pass filter, or may be made up from a combination of low-pass filters and high-pass filters.

In the exemplary embodiment shown in FIG. 8, output-matching circuit 193 for appropriately transferring an output signal is provided in a section following amplifier 61, and output-matching circuit 253 for appropriately transferring an output signal is provided in a section following amplifier 62. Either of output-matching circuits 193 and 253 may be made up from a low-pass filter or a high-pass filter, or may be made up from a combination of low-pass filters and high-pass filters.

In the exemplary embodiment shown in FIG. 8, on the amplification path that includes amplifier 61 and anti-phase IMD3 generation circuit 63 and the amplification path that includes amplifier 62, the phases of the spectrums of the main signal frequency components supplied from each amplification path are matched. Amplifier 61 and amplifier 62 are therefore preferably of the same configuration. For the same reason, input-matching circuit 191 and input-matching circuit 251 are preferably of the same configuration, and output-matching circuit 193 and output-matching circuit 253 are preferably of the same configuration as well.

However, amplifier 61 and amplifier 62 in the present invention need not be of the same configuration as long as the phases of the spectrums of the main signal frequencies are in-phase. For the same reason, input-matching circuit 191 and input-matching circuit 251 need not be of the same configuration, and output-matching circuit 193 and output-matching circuit 253 need not be of the same configuration as long as the phases of the signals to be transferred are in-phase. Circuits of different configurations may be used for each according to necessity.

In the exemplary embodiment shown in FIG. 8, anti-phase IMD3 generation circuit 63 is of a configuration that includes distortion generation circuit 81, phase-adjustment circuit 82, and amplitude regulation circuit 83. Distortion generation circuit 81 supplies third-order intermodulation distortion that is necessary for distortion compensation. Phase-adjustment circuit 82 sets the load impedance in the difference frequency band impedance of distortion generation circuit 81 to the optimum value to set the phase of the third-order intermodulation distortion supplied from distortion generation circuit 81 to the optimum value. Amplitude regulation circuit 83 sets the load impedance in the RF fundamental wave band of distortion generation circuit 81 to the optimum value to set the amplitude of the third-order intermodulation distortion supplied from distortion generation circuit 81 to the optimum value.

Explanation next regards the details of the above-described distortion generation circuit 81. In the exemplary embodiment shown in FIG. 8, distortion generation circuit 81 in anti-phase IMD3 generation circuit 63 is provided with bipolar transistor 161. The emitter terminal of bipolar transistor 161 is connected with signal line 108 at node 109. As with bipolar transistor 168 in base bias circuit in amplifier 61, the collector voltage of bipolar transistor 161 is applied by way of power-supply stabilizing circuit 194 from power-supply terminal 282, and the base voltage is applied by way of power-supply stabilizing circuit 192 from power-supply terminal 281. The emitter terminal of bipolar transistor 161 is connected with the emitter terminal of bipolar transistor 168 by way of resistor 170, whereby the emitter current of bipolar transistor 161 and bipolar transistor 168 is bypassed as the base current of bipolar transistor 165. Bipolar transistor 161 has the same nonlinear characteristic as nonlinear element 101 shown in the first exemplary embodiment and is used for generating the third-order intermodulation distortion necessary for distortion compensation.

Explanation next regards the details of amplitude regulation circuit 83.

In the exemplary embodiment shown in FIG. 8, amplitude regulation circuit 83 in anti-phase IMD3 generation circuit 63 is made up from capacitance element 162 that is connected in a series with signal line 108. By setting the capacitance of capacitance element 162 to an optimum value, the ratio $|Z_{L2}(f_c)|/\text{Re}[Z_{L2}(f_c)]$ of the real part and absolute value in the RF fundamental wave band of impedance $Z_{L2}(f)$ when the side of amplitude regulation circuit is seen from distortion generation circuit 81 can be set to the optimum value. Still further, based on the principles explained in the first exemplary embodiment, the amplitude of third-order intermodulation distortion 67 supplied from output terminal 85 of anti-phase IMD3 generation circuit 63 can be set to the optimum value by setting the above-described $|Z_{L2}(f_c)|/\text{Re}[Z_{L2}(f_c)]$ to the optimum value.

An explanation is now given of the characteristics result from the amplitude regulation of third-order intermodulation distortion 67 in anti-phase IMD3 generation circuit 63.

Figure 9:
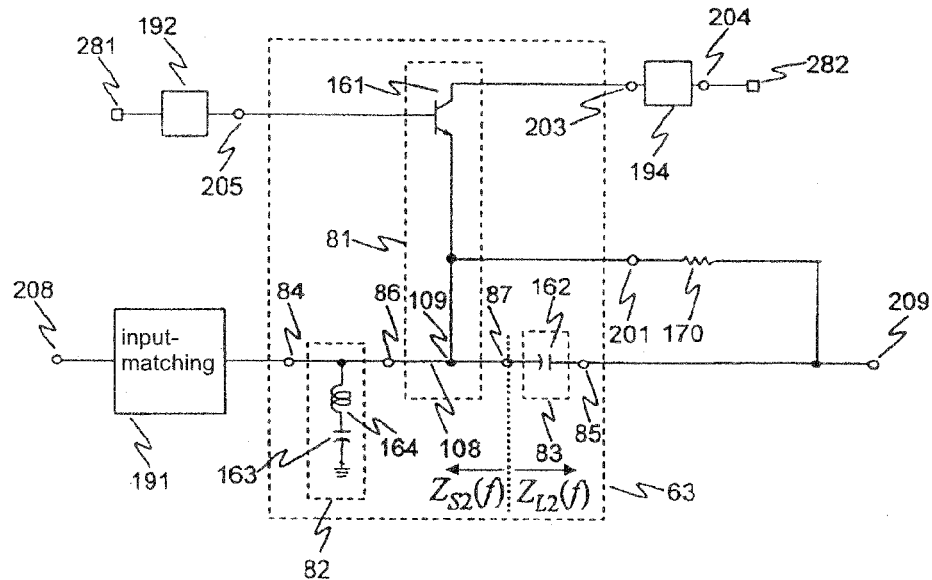
FIG. 9 is a circuit diagram showing an actual example of an anti-phase third-order intermodulation distortion generation circuit.

FIG. 9 is a circuit diagram showing an actual example of the anti-phase IMD3 generation circuit used in the measurement of characteristics. FIG. 9 shows a configuration in which amplifier 62 is eliminated from the circuit configuration shown in FIG. 8 to leave anti-phase IMD3 generation circuit 63 and input-matching circuit 191 and power-supply stabilizing circuits 192 and 194, which are peripheral circuits of anti-phase IMD3 generation circuit 63.

Figure 10:
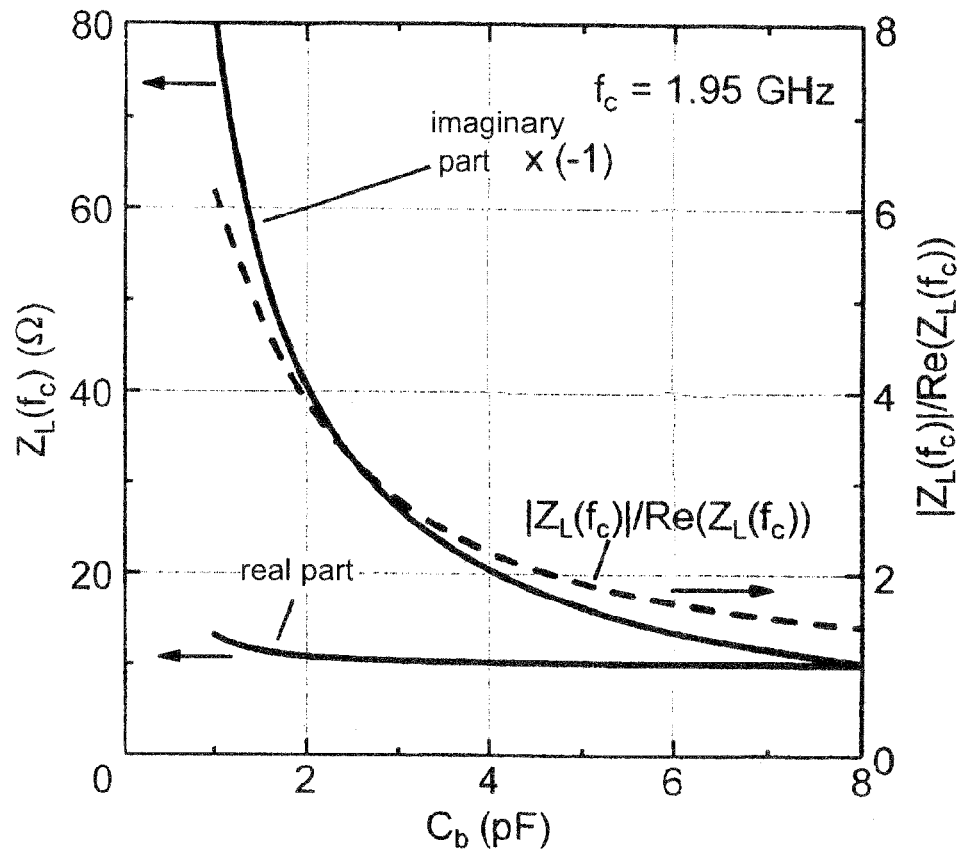
FIG. 10 is a graph showing change in impedance in the RF fundamental wave band and the change in the ratio of the real part and absolute value of the impedance with respect to the capacitance of a capacitance element of the amplitude regulation circuit shown in FIG. 9.

FIG. 10 is a graph showing the change of impedance in the RF fundamental wave band with respect to the capacitance of the capacitance element in the amplitude regulation circuit and the change of the ratio of the real part and absolute value of this impedance. In this measurement, the center frequency of the RF fundamental wave band was 1.95 GHz. The horizontal axis of the graph shows the capacitance $C_b$ of capacitance element 162 in amplitude regulation circuit 83 of the circuit configuration shown in FIG. 9. The vertical axis on the left of the graph shows the value of impedance $Z_{L2}(f_c)$ in the RF fundamental wave band when the amplitude regulation circuit 83 side is viewed from distortion generation circuit 81, and the vertical axis on the right side of the graph shows the ratio $|Z_{L2}(f_c)|/Re[Z_{L2}(f_c)]$ of the real part and absolute value of this impedance. The result of FIG. 10 shows that impedance $Z_{L2}(f_c)$ increases monotonically with decrease of capacitance $C_b$ of capacitance element 162. Similarly, the ratio $|Z_{L2}(f_c)|/Re[Z_{L2}(f_c)]$ of the real part and absolute value of impedance $Z_{L2}(f_c)$ increases monotonically with decrease of capacitance $C_b$ of capacitance element 162.

Figure 11:
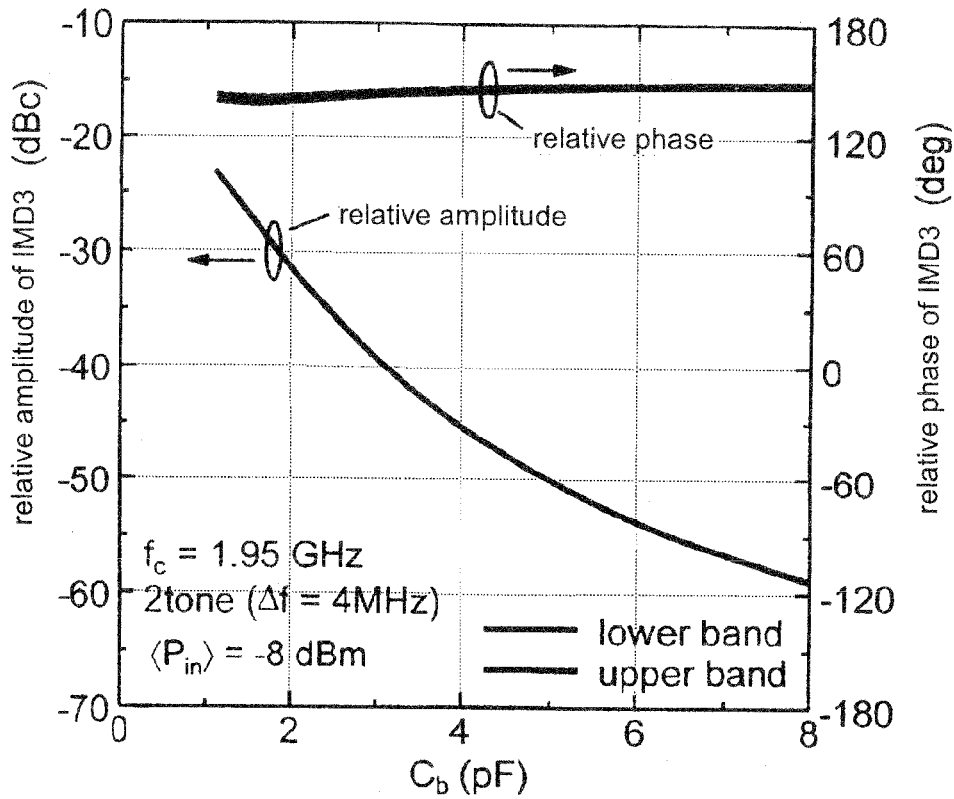
FIG. 11 is a graph showing change of the amplitude and phase of third-order intermodulation distortion with respect to the capacitance of a capacitance element in the amplitude regulation circuit shown in FIG. 9.

FIG. 11 is a graph showing change of the amplitude and phase of third-order intermodulation distortion with respect to the capacitance of the capacitance element in the amplitude regulation circuit. In this measurement, a case is shown in which a 2tone signal having a difference frequency of 4 MHz and a center frequency of 1.95 GHz was applied as input. The horizontal axis of the graph shows the capacitance $C_b$ of capacitance element 162 in amplitude regulation circuit 83 of the circuit configuration shown in FIG. 9. The vertical axis on the left side of the graph shows the amplitude of third-order intermodulation distortion that is supplied from output terminal 209, and the vertical axis on the right side of the graph shows the phase of third-order intermodulation distortion. The result of FIG. 11 shows that the amplitude of third-order intermodulation distortion that is supplied from output terminal 209 increases monotonically with decrease of capacitance $C_b$ of capacitance element 162.

The results shown in FIG. 10 and FIG. 11 show that setting capacitance $C_b$ of capacitance element 162 of amplitude regulation circuit 83 to the optimum value enables regulation of the ratio $|Z_{L2}(f_c)|/Re[Z_{L2}(f_c)]$ of the real part and absolute value in the RF fundamental wave band of impedance $Z_{L2}(f_c)$. Further, based on the principles explained in the first exemplary embodiment, regulating the value of $|Z_{L2}(f_c)|/Re[Z_{L2}(f_c)]$ enables adjustment of the amplitude of third-order intermodulation distortion that is supplied from output terminal 209 and enables setting of the optimum value for distortion compensation.

Based on the foregoing explanation, the configuration of amplitude regulation circuit 83 in the exemplary embodiment shown in FIG. 8 provides a means for setting the amplitude of third-order intermodulation distortion 67 supplied from output terminal 209 and output terminal 85 of anti-phase IMD3 generation circuit 63 to the value necessary for distortion compensation by setting the capacitance of capacitance element 162 to the optimum value.

The optimum value of impedance in the RF fundamental wave band of capacitance element 162 depends on the amplitude of third-order intermodulation distortion 67 that is necessary for distortion compensation, but this value is normally on the order of several $\Omega$ to several tens of $\Omega$, and the corresponding capacitance is normally on the order of several pF to several tens of pF. As a result, capacitance element 162 is of a size that can be easily integrated on an integrated circuit and the amplitude regulation circuit of third-order intermodulation distortion can therefore be realized compactly and with low cost. However, capacitance element 162 is not limited to a component that is integrated on an integrated circuit and may be realized by a passive element outside of an integrated circuit. In addition, the capacitance of capacitance element 162 is not limited to a range on the order of from several pF to several tens of pF and may be set to any capacitance according to necessity.

Explanation next regards the details of phase-adjustment circuit 82.

In the exemplary embodiment shown in FIG. 8, phase-adjustment circuit 82 in anti-phase IMD3 generation circuit 63 includes a circuit in which capacitance element 163 and inductor element 164 are connected in a series. The end of this circuit on the side of inductor element 164 is connected in parallel to signal line 108, and the end of the circuit on the side of capacitance element 163 is grounded.

The capacitance of capacitance element 163 in phase-adjustment circuit 82 is preferably a comparatively large value that falls within the range of from several nF to several hundred uF. The reasons for this range are explained hereinbelow. The range of difference frequency $\Delta f$ is assumed to be from several kHz to several tens of MHz that corresponds to the modulated bandwidth of the communication system. In this case, the parallel combination impedance $|Z_{L2}(\Delta f)||Z_{S2}(\Delta f)|$ of impedance $Z_{L2}(f)$ when viewing the side of amplitude regulation circuit 83 and impedance $Z_{S2}(f)$ when viewing the side of phase-adjustment circuit 82 and distortion generation circuit 81 can be decreased to the order of several tens of $\Omega$ or less in the frequency range that corresponds to this difference frequency $\Delta f$ while the DC current is cut off. Even at this large capacitance value, a low-cost, and moreover, compact capacitance element can be obtained due to the development of device fabrication technology in recent years.

In addition, the inductance value of inductor element 163 in phase-adjustment circuit 82 is preferably on the order of from several nH to several tens of nH. The reasons for this value are explained hereinbelow. Inductor element 163 must have impedance on the order of several tens of $\Omega$ to several hundred $\Omega$ that is sufficiently higher than the matching impedance such that matching is not affected in the RF fundamental wave band. In addition, inductor element 163 must have a sufficiently low impedance of several $\Omega$ or less in the frequency range that corresponds to difference frequency $\Delta f$. The above-described inductance value is for satisfying at least these two conditions. This inductor element 163 may be integrated on an integrated circuit or may be packaged as a passive element outside an integrated circuit.

Thus, decreasing impedance $|Z_{L2}(\Delta f)||Z_{S2}(\Delta f)|$ in the frequency that corresponds to difference frequency $\Delta f$ to several tens of $\Omega$ or less suppresses third-order intermodulation distortion 141 and 142 generated by way of second-order intermodulation distortion 145 based on the principles described in the first exemplary embodiment. Third-order intermodulation distortion 123 and 124 that are anti-phase with main signals 121 and 122 that is generated by means of third-order nonlinear processes 125 and 126 can then be supplied as the main component of third-order intermodulation distortion. In such a case, third-order intermodulation distortion 67 supplied from anti-phase IMD3 generation circuit 63 is anti-phase with main signal 66.

The characteristics of a configuration provided with phase-adjustment circuit 82 is next compared with the characteristics of a configuration that lacks phase-adjustment circuit 82. The circuit configuration shown in FIG. 9 is used as the configuration that is provided with phase-adjustment circuit 82, and a circuit configuration in which phase-adjustment circuit 82 is eliminated from the circuit configuration shown in FIG. 9 is used as the configuration that is not provided with phase-adjustment circuit 82.

Figure 12:
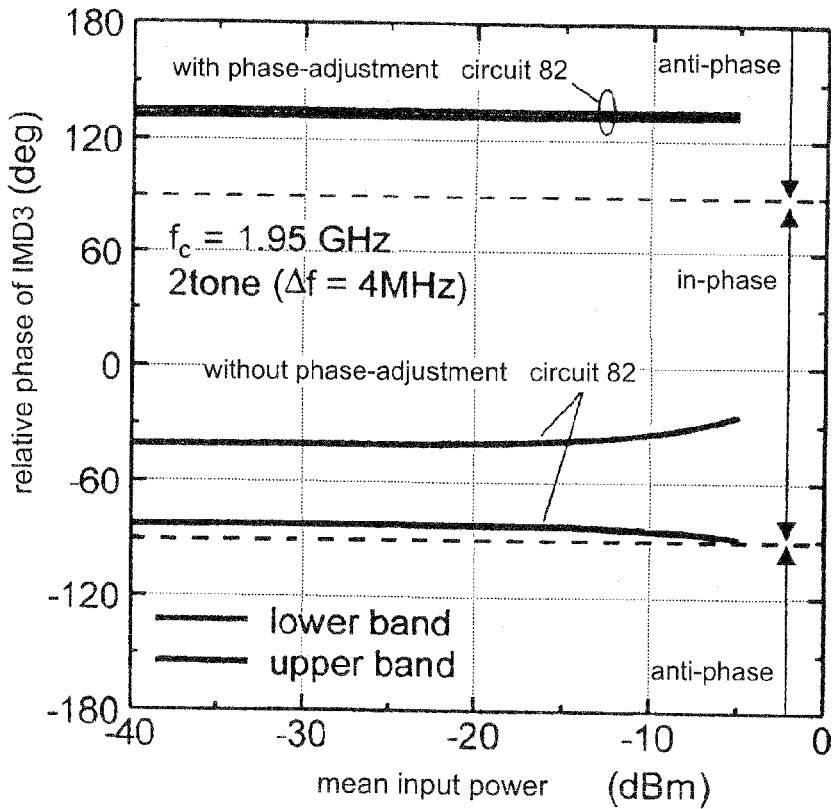
FIG. 12 is a graph for comparing characteristics results of a configuration provided with a phase-adjustment circuit and a configuration not provided with the circuit.

FIG. 12 is a graph for comparing the characteristics results of a configuration provided with the phase-adjustment circuit and a configuration that lacks the circuit. In this measurement, a case was taken in which the input was a 2tone signal having a difference frequency of 4 MHz and a center frequency of 1.95 GHz. The horizontal axis of the graph shows the mean input power of the 2tone signal, and the vertical axis of the graph shows the phase of the third-order intermodulation distortion supplied from output terminal 209. The graph of FIG. 12 shows the dependence of the mean input power of 2tone signal with relation to the phase of the third-order intermodulation distortion.

As shown in FIG. 12, in the configuration that is provided with phase-adjustment circuit 82, the relative phase of the third-order intermodulation distortion supplied from output terminal 209 with respect to the main signal is anti-phase. The reasons for this phase are as follows. The reduction of impedance $|Z_{L2}(\Delta f)\|Z_{S2}(\Delta f)|$ in the frequency that corresponds to difference frequency $\Delta f$ causes suppression of third-order intermodulation distortion 141 and 142 that are in-phase with main signals 121 and 122 and generated by way of second-order intermodulation distortion 145. Third-order intermodulation distortion 123 and 124 that are anti-phase with main signals 121 and 122 and that are generated by third-order nonlinear processes 125 and 126 are therefore supplied as the main component of third-order intermodulation distortion.

In contrast, the relative phase with respect to the main signal of the third-order intermodulation distortion supplied from output terminal 209 is in-phase in the configuration in which phase-adjustment circuit 82 is eliminated from the circuit configuration shown in FIG. 9. This is because impedance $|Z_{L2}(\Delta f)\|Z_{S2}(\Delta f)|$ at the frequency that corresponds to difference frequency $\Delta f$ is not decreased, and third-order intermodulation distortion 141 and 142 that are in-phase with main signals 121 and 122 and that are generated by way of second-order intermodulation distortion 145 remain without being suppressed.

Accordingly, the configuration of phase-adjustment circuit 82 in the exemplary embodiment shown in FIG. 8 causes the output of third-order intermodulation distortion 67 that is anti-phase with main signal 66 from anti-phase third-order intermodulation distortion inversion circuit 63 and brings about offset with third-order intermodulation distortion 71 that is in-phase with main signal 70 that is supplied from amplifier 62. In this way, the configuration of phase-adjustment circuit 82 provides a means for enabling reduction of the relative strength of third-order intermodulation distortion 73 with respect to main signal 72 at output terminal 75.

Based on the above-described points, the following effects can be obtained in the present exemplary embodiment.

Figures 13, 14:
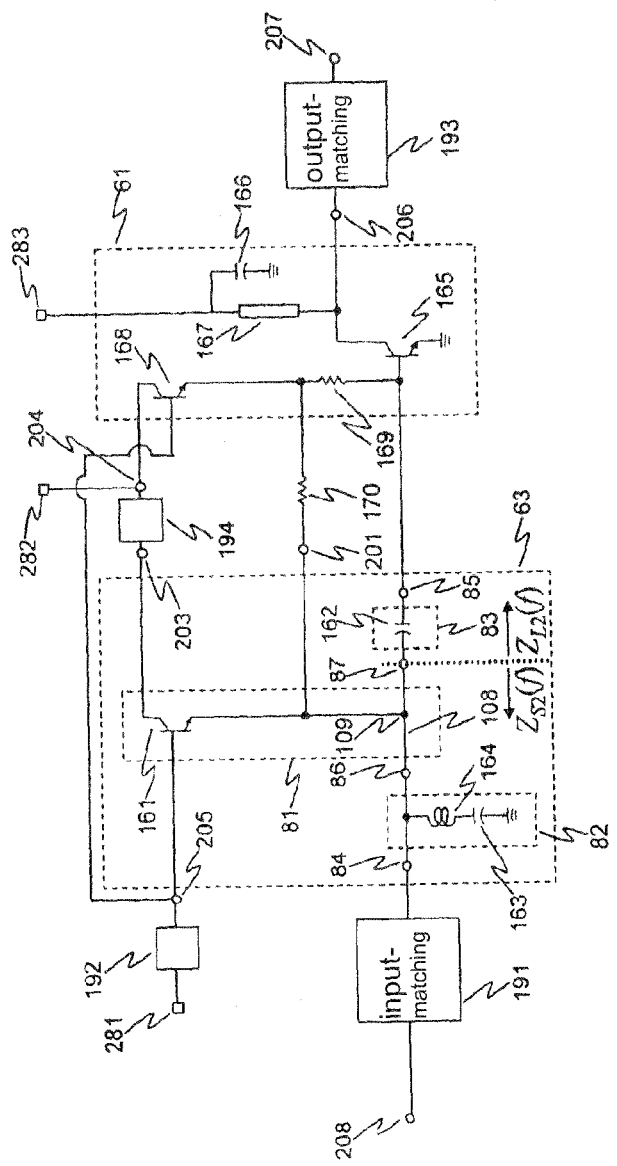
FIG. 13 is a circuit diagram showing, of the circuit construction shown in FIG. 8, the amplification path that includes amplifier 61 and anti-phase IMD3 generation circuit 63.
FIG. 14 is a circuit diagram showing, of the circuit construction shown in FIG. 8, the amplification path that includes amplifier 62.

The circuit shown in FIG. 13 shows, of the circuit configuration shown in FIG. 8, the amplification path that includes amplifier 61 and anti-phase IMD3 generation circuit 63. The circuit shown in FIG. 14 shows an amplification path that includes, of the circuit configuration shown in FIG. 8, amplifier 62. A configuration in which the circuit shown in FIG. 13 and the circuit shown in FIG. 14 are arranged in parallel between distributor 76 and synthesizer 64 and each connected to distributor 76 and synthesizer 64 corresponds to the circuit configuration shown in FIG. 8. The resulting characteristics of these two circuits are shown hereinbelow.

Figure 15:
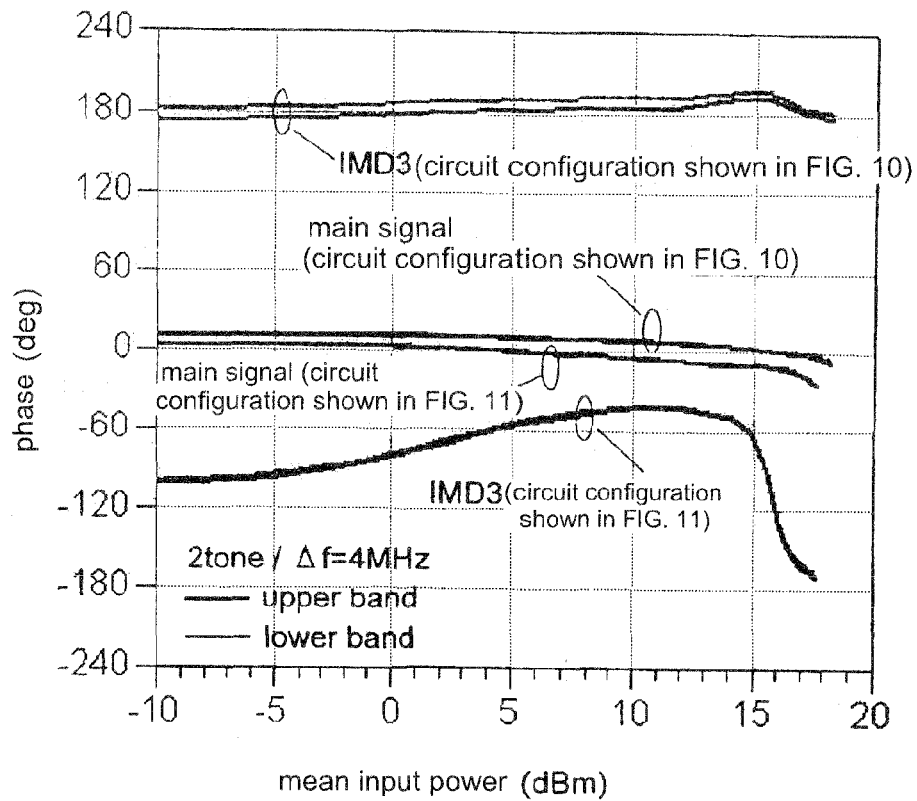
FIG. 15 is a graph showing the mean input power dependence of a 2tone signal with relation to the phases of the main signal and third-order intermodulation distortion for the circuits shown in each of FIG. 13 and FIG. 14.

FIG. 15 is a graph showing the dependence upon mean input power of a 2tone signal with relation to the phase of the main signal and third-order intermodulation distortion for the circuits shown in FIG. 13 and FIG. 14. Here, a case was taken in which the input is a 2tone signal having a difference frequency of 4 MHz and a center frequency of 1.95 GHz. The horizontal axis of the graph shows the mean input power of the 2tone signal, and the vertical axis shows the phase of the main signal and the third-order intermodulation distortion.

In the circuit shown in FIG. 13, the phase difference between the main signal and the third-order intermodulation distortion is substantially 180° and can therefore be seen as anti-phase. In the circuit shown in FIG. 14, the phase difference between the main signal and the third-order intermodulation distortion over a broad power region is within the range of 90°, and can be seen to be in-phase. Still further, the main signal of the circuit shown in FIG. 13 and the main signal of the circuit shown in FIG. 14 can be seen to be substantially in-phase.

As can be seen from the resulting characteristics of FIG. 15, connecting the circuit shown in FIG. 13 and the circuit shown in FIG. 14 in parallel and then combining the output signals of the two circuits can offset the third-order intermodulation distortion supplied from the circuit shown in FIG. 13 and the circuit shown in FIG. 14 and can reduce the overall third-order intermodulation distortion. In addition, because the phases of the main signals supplied from the circuit shown in FIG. 13 and the circuit shown in FIG. 14 are substantially in-phase, reduction and loss of the power during synthesis can be suppressed.

Figure 16:
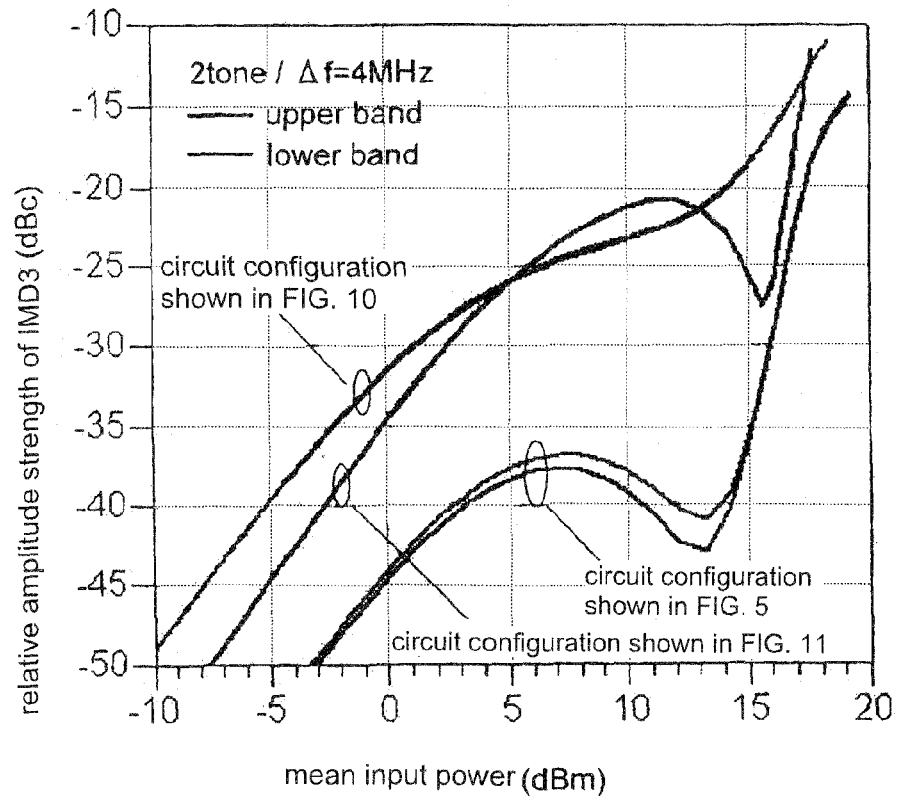
FIG. 16 is a graph showing the dependence of the relative amplitude strength of third-order intermodulation distortion with respect to the main signal upon the mean input power of a 2tone signal for circuits shown in each of FIG. 13 and FIG. 14.

FIG. 16 is a graph showing the dependence upon the mean input power of 2tone signal of the relative amplitude strength of third-order intermodulation distortion (IMD3) with respect to the main signal relating to each of the circuits shown in FIG. 8, FIG. 13, and FIG. 14. The horizontal axis of the graph shows the mean input power of the 2tone signal, and the vertical axis of the graph shows the relative amplitude strength of the third-order intermodulation distortion with respect to the main signal. A case is here shown in which the input is a 2tone signal having a difference frequency of 4 MHz and center frequency of 1.95 GHz. In addition, the element value in amplitude regulation circuit 83 of the circuit shown in FIG. 13 is set such that the relative amplitude strength of the third-order intermodulation distortion supplied from the circuit shown in FIG. 13 is of substantially the same level as the circuit shown in FIG. 14. As shown in FIG. 16, the relative amplitude strength of third-order intermodulation distortion with respect to the main signal in the circuit shown in FIG. 8 is 10 dB or more lower than for the circuits of FIG. 13 and FIG. 14, whereby an improvement of suppression of third-order intermodulation distortion of 10 dB or more is obtained. These results of FIG. 16 show that the power amplifier of the present invention is actually effective for reducing distortion.

Explanation next regards ten modifications regarding the present exemplary embodiment.

First Modification of the Second Exemplary Embodiment

This modification is a case in which a plurality of elements is used to make up phase-adjustment circuit 82 in anti-phase IMD3 generation circuit 63 shown in FIG. 8.

Figure 17:
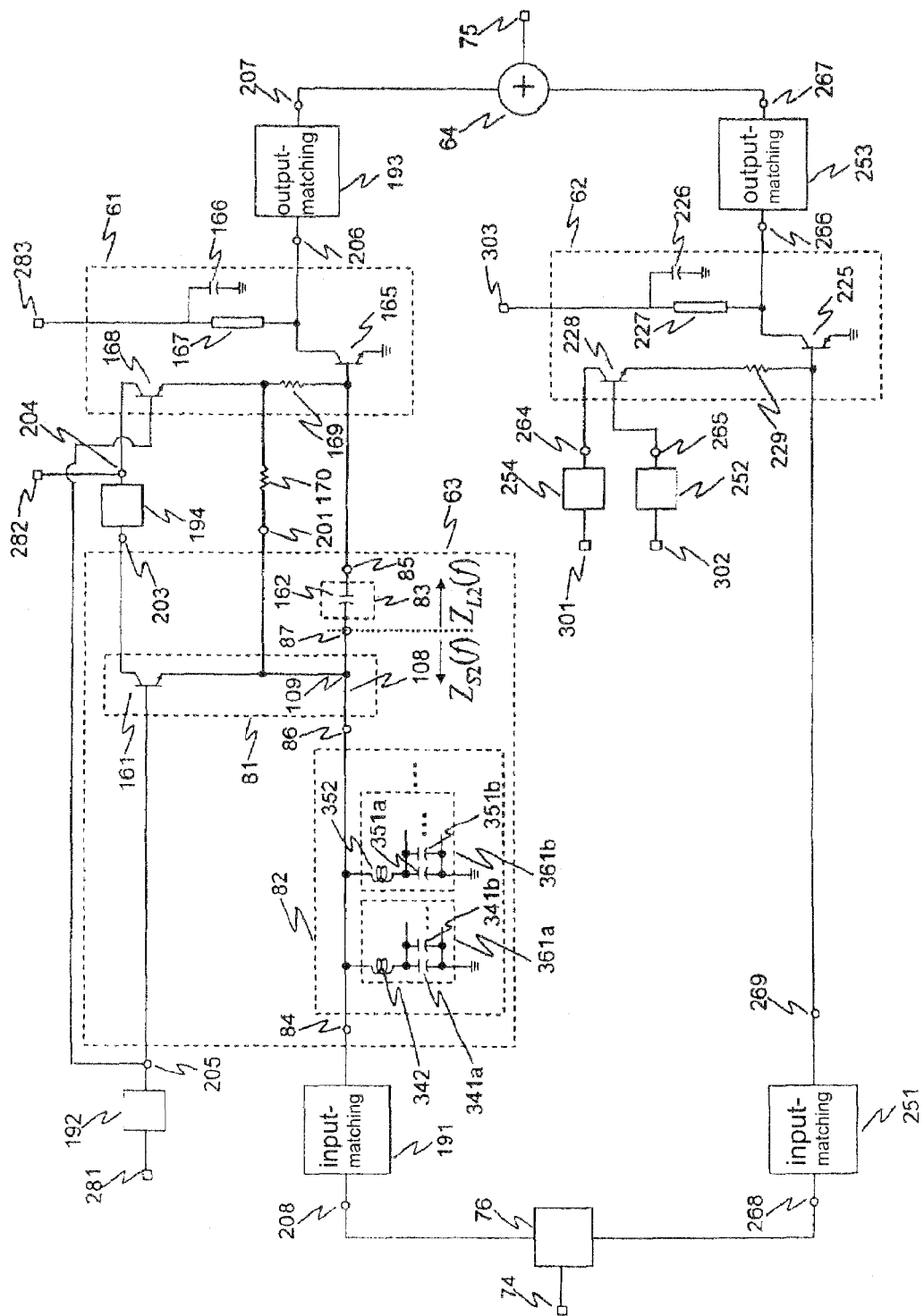
FIG. 17 is a circuit diagram showing a first modification of the second exemplary embodiment.

FIG. 17 is a circuit diagram showing the first modification of the second exemplary embodiment shown in FIG. 8. In contrast with a 2tone signal, when a typical modulated wave having a continuous spectrum within the modulation band is applied as input, a uniform reduction of impedance $|Z_{L2}(\Delta f)|$ $||Z_{S2}(\Delta f)|$ of the difference frequency band at the frequencies that correspond to this modulation bandwidth (from a low frequency approaching 0 Hz to the frequency of the modulation bandwidth) enables more stabilized distortion compensation. However, in a configuration that uses one capacitance element 164 as in phase-adjustment circuit 82 shown in FIG. 8, uniform reduction of the impedance $|Z_{L2}(\Delta f)||Z_{S2}(\Delta f)|$ of the difference frequency band at frequencies that correspond to the modulation bandwidth is problematic due to resonance caused by the parasitic inductance of capacitance element 164. Phase-adjustment circuit 82 shown in FIG. 17 is a configuration for overcoming this problem.

As shown in FIG. 17, phase-adjustment circuit 82 includes: circuit 361a in which a plurality of capacitance elements 341a, 341b, ..., 341x (where m is the number of elements a, b, ..., x and m is an integer equal to or greater than 1) that are connected in parallel is connected in a series to inductor element 342; and circuit 361b of the same configuration as circuit 361a. Circuit 361b is of a configuration in which a plurality of capacitance elements 351a, 351b, ..., 351x that are connected in parallel is connected in a series to inductor element 352.

Of the two terminals of circuit 361a, one terminal is grounded, and the other terminal is connected in parallel to signal line 108. Similarly, of the two terminals of circuit 361b, one terminal is grounded and the other terminal is connected in parallel to signal line 108.

Configurations that are each a circuit in which a plurality of capacitance elements is connected in a series to an inductor element and in which, of the two terminals of the circuit, one terminal is connected in parallel to signal line 108 and the other terminal is grounded, are not limited to two as with circuit 361a and circuit 361b of the present modification. Alternatively, only circuit 361a may be provided without providing circuit 361b, or three or more configurations each equivalent to circuit 361a may be provided.

In the configuration shown in FIG. 17, components each having different capacitance are used for capacitance elements 341a, 341b, ..., 341x and capacitance elements 351a, 351b, ..., 351x, whereby the capacitance of each reduces impedance in a different frequency range. As a result, the frequency range in which impedance $|Z_{L2}(\Delta f)||Z_{S2}(\Delta f)|$ of the difference frequency band is reduced can be extended. As a result, a more stabilized distortion compensation can be achieved even when a typical modulated wave is applied as input.

As described hereinabove, the use of anti-phase IMD3 generation circuit 63 shown in this modification enables distortion compensation to be carried out based on the same principles as explained in the first and second exemplary embodiments.

Second Modification of the Second Exemplary Embodiment

This modification uses a plurality of elements in phase-adjustment circuit 82 but is of a different configuration from the first modification.

Figure 18:
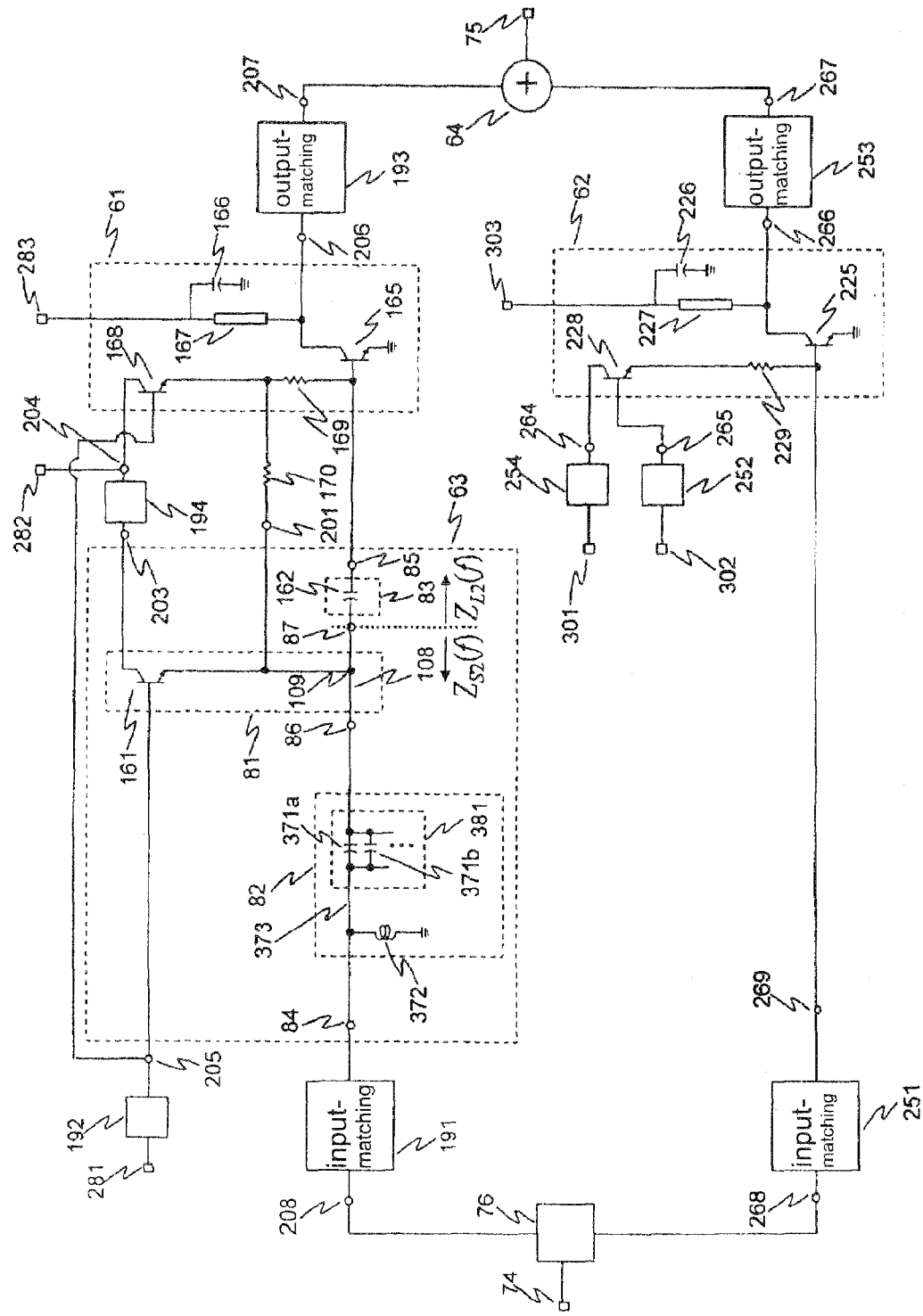
FIG. 18 is a circuit diagram showing a second modification of the second exemplary embodiment.

FIG. 18 is a circuit diagram showing the second modification of the second exemplary embodiment shown in FIG. 8. As shown in FIG. 18, phase-adjustment circuit 82 is of a configuration that includes circuit 381 that includes a plurality of capacitance elements 371a, 371b, ..., 371x (where m is the number of elements a, b, ..., x, and m is an integer greater than or equal to 1) connected in parallel, and inductor element 372. Circuit 381 is connected in a series to signal line 108. One terminal of the two terminals of inductor element 372 is connected in parallel to signal line 373, and the other terminal is grounded.

In order to uniformly reduce impedance $|Z_{L2}(\Delta f)||Z_{S2}(\Delta f)|$ at frequencies that correspond to the modulation bandwidth in this configuration, the capacitances of capacitance elements 371a, 371b, ..., 371x are preferably comparatively large values of several nF to several hundred uF, and moreover, each a different value.

The use of anti-phase IMD3 generation circuit 63 shown in this modification can also achieve distortion compensation based on the same principles as described in the first and second exemplary embodiments.

Third Modification of the Second Exemplary Embodiment

This modification is a configuration in which a resistance element is provided in a different location in anti-phase IMD3 generation circuit 63 shown in FIG. 8 for bypassing current supplied as output from distortion generation circuit 81.

Figure 19:
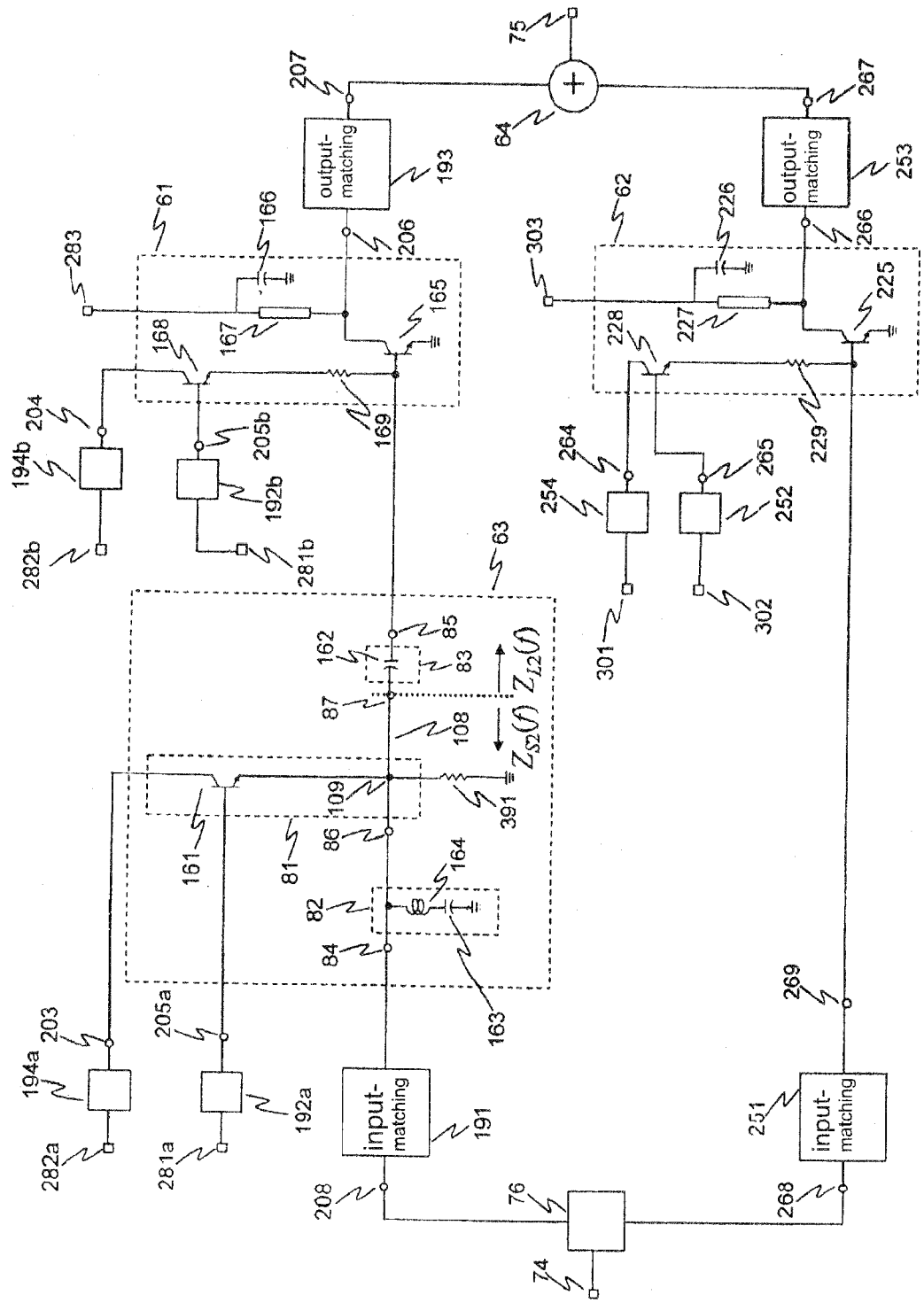
FIG. 19 is a circuit diagram showing a third modification of the second exemplary embodiment.

FIG. 19 is a circuit diagram showing the third modification of the second exemplary embodiment shown in FIG. 8. As shown in FIG. 19, resistance element 391 is connected to node 109 of signal line 108. One of the two terminals of resistance element 391 is connected to node 109, and the other terminal is grounded.

In the configuration of anti-phase IMD3 generation circuit 63 shown in FIG. 8, the emitter current of bipolar transistor 161 in distortion generation circuit 81 is bypassed as the base current of bipolar transistor 165 by way of resistance element 170. In contrast, in the configuration shown in FIG. 19, the emitter current of bipolar transistor 161 is bypassed to ground by way of resistance element 391. A configuration of this type is effective when current bypass to the input terminal of an amplification element is problematic, such as when a field-effect transistor is used as the amplification element in amplifier 61 in place of bipolar transistor 168.

The use of anti-phase IMD3 generation circuit 63 shown in this modification can achieve distortion compensation based on the same principles as described in the first and second exemplary embodiments.

Fourth Modification of the Second Exemplary Embodiment

This modification is of a configuration that employs a field-effect transistor in the non-linear element of distortion generation circuit 63 in anti-phase IMD3 generation circuit 63 shown in FIG. 8.

Figure 20:
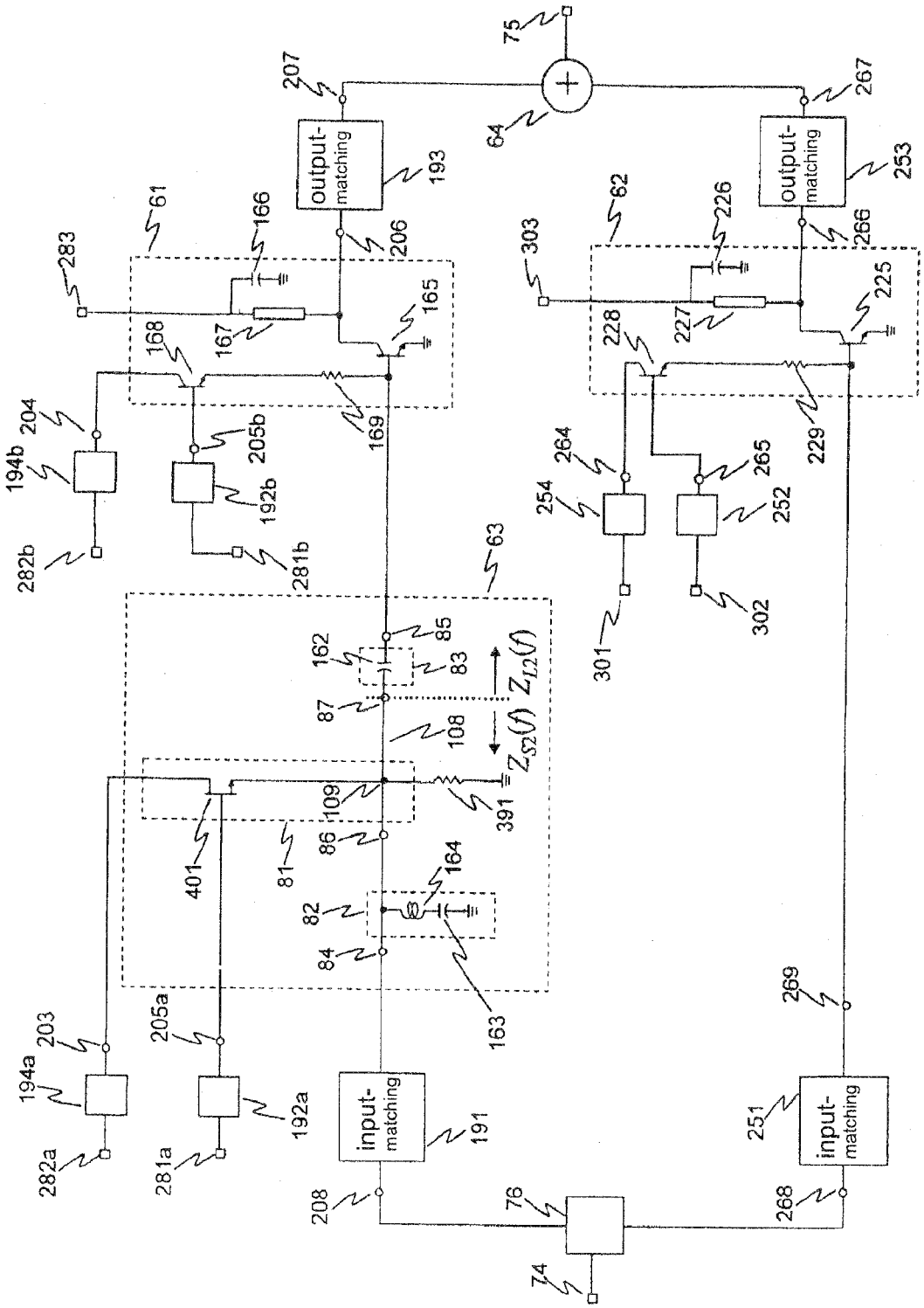
FIG. 20 is a circuit diagram showing a fourth modification of the second exemplary embodiment.

FIG. 20 is a circuit diagram showing the fourth modification of the second exemplary embodiment shown in FIG. 8. As shown in FIG. 20, distortion generation circuit 81 is provided with field-effect transistor 401 as non-linear element 101. Field-effect transistor 401 has its source terminal connected in parallel to signal line 108, its gate terminal connected to power-supply stabilizing circuit 192a by way of node 205a, and its drain terminal connected to power-supply stabilizing circuit 194a by way of node 203. Similar to a case in which bipolar transistor 161 is used, field-effect transistor 401 has the same nonlinear characteristics as non-linear element 101 described in the first exemplary embodiment and can generate third-order intermodulation distortion necessary for distortion compensation.

The use of anti-phase IMD3 generation circuit 63 shown in this modification also enables the distortion compensation based on the same principles described in the first and second exemplary embodiments.

Fifth Modification of the Second Exemplary Embodiment

This modification is of a configuration that employs a diode in the non-linear element of distortion generation circuit 63 in anti-phase IMD3 generation circuit 63 shown in FIG. 8.

Figure 21:
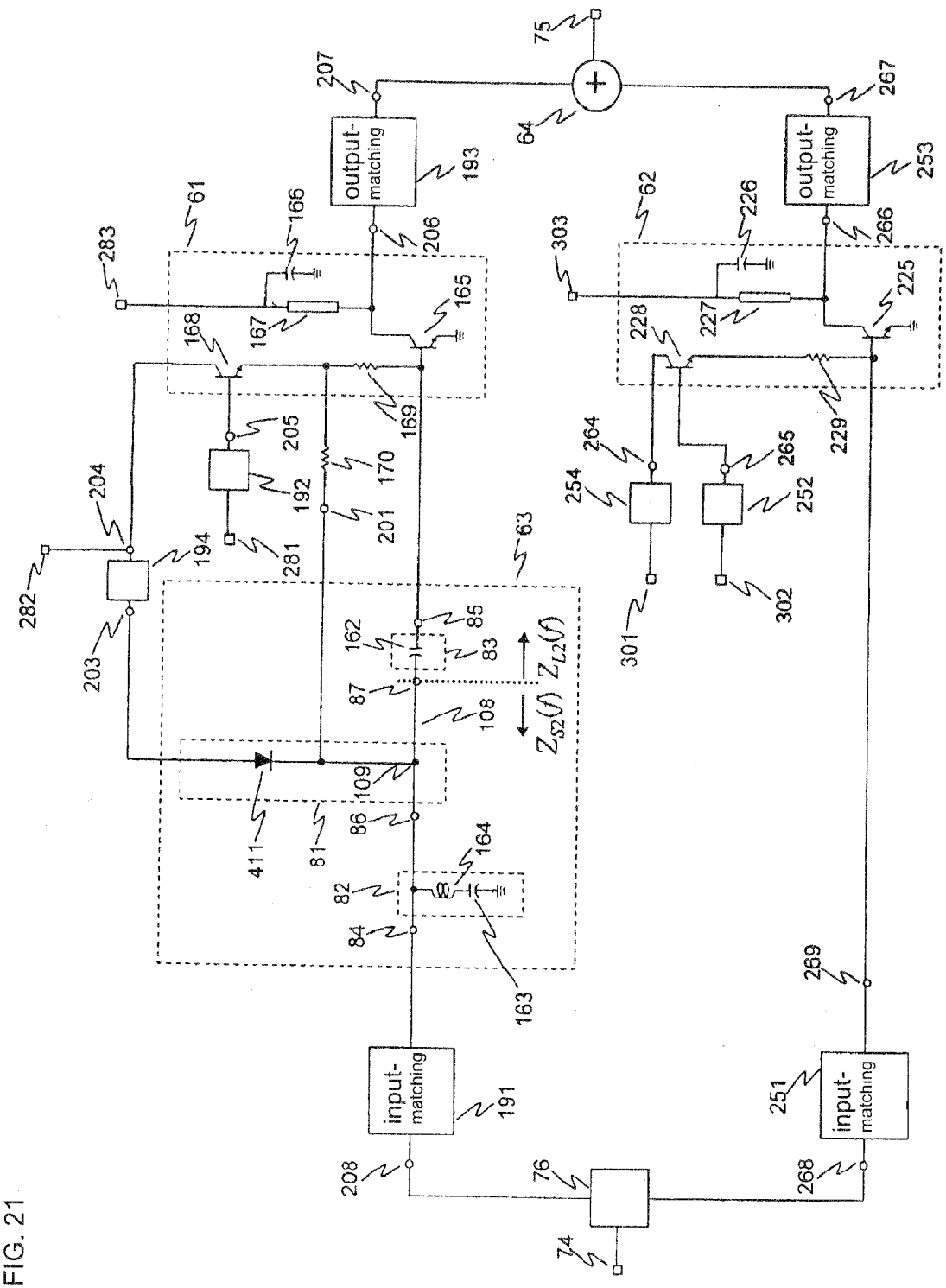
FIG. 21 is a circuit diagram showing a fifth modification of the second exemplary embodiment.

FIG. 21 is a circuit diagram showing the fifth modification of the second exemplary embodiment shown in FIG. 8. As shown in FIG. 21, distortion generation circuit 81 is provided with diode 411 as non-linear element 101. The cathode terminal of diode 411 is connected in parallel to signal line 108 and the anode terminal is connected to power-supply stabilizing circuit 194 by way of node 203. As when bipolar transistor 161 is used, diode 411 has the same nonlinear characteristics as non-linear element 101 shown in the first exemplary embodiment, and can cause the generation of the third-order intermodulation distortion required for distortion compensation.

The use of anti-phase IMD3 generation circuit 63 shown in this modification also enables distortion compensation based on the same principles explained in the first and second exemplary embodiments.

Sixth Modification of the Second Exemplary Embodiment

This modification uses a plurality of elements to make up amplitude regulation circuit 83 in anti-phase IMD3 generation circuit 63 shown in FIG. 8.

Figure 22:
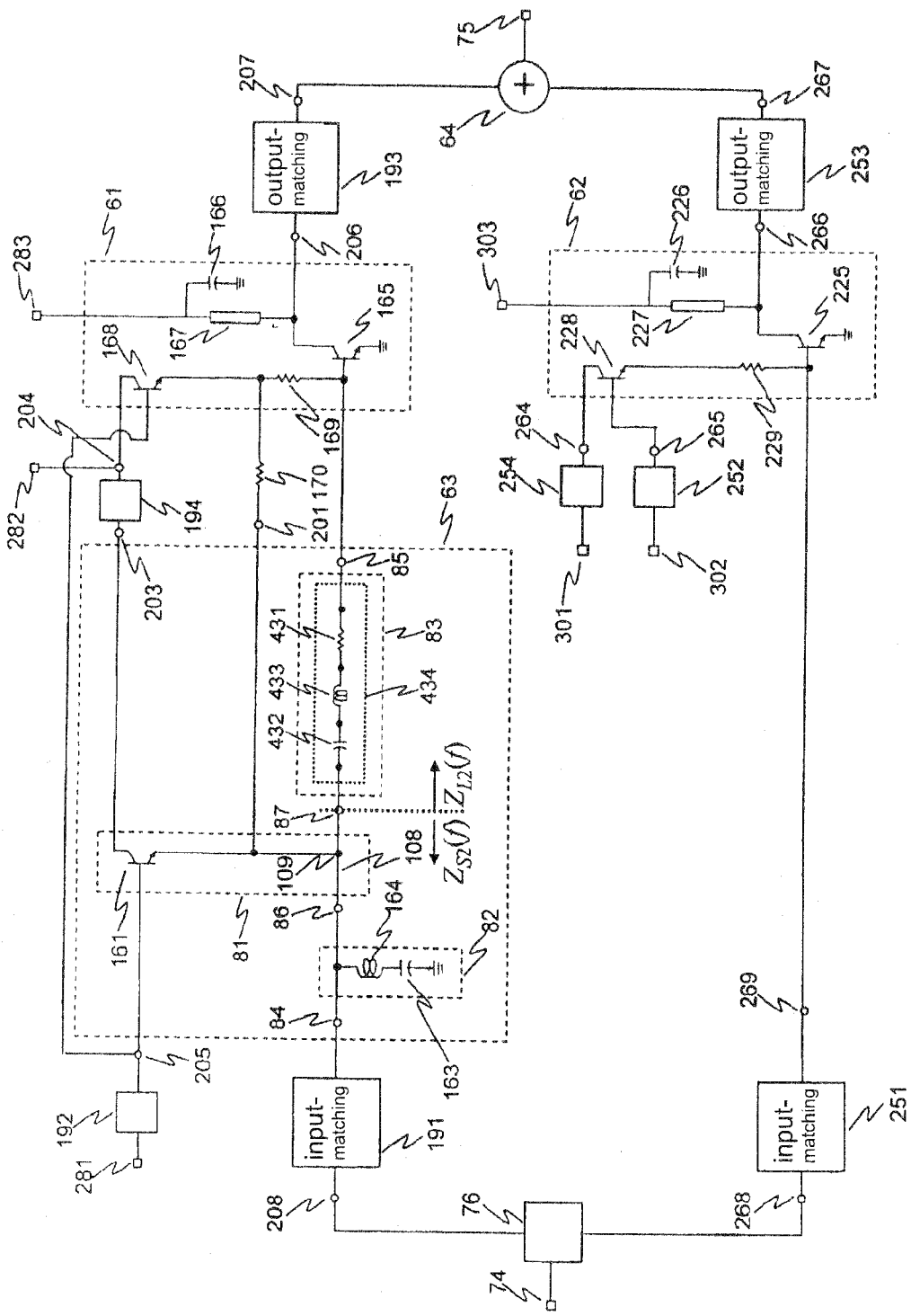
FIG. 22 is a circuit diagram showing a sixth modification of the second exemplary embodiment.

FIG. 22 is a circuit diagram showing the sixth modification of the second exemplary embodiment shown in FIG. 8. As shown in FIG. 22, amplitude regulation circuit 83 includes circuit 434 in which resistance element 431, capacitance element 432, and inductor element 433 are connected in a series. Circuit 434 is then connected in a series to signal line 108.

As in the second exemplary embodiment, setting the values of each of resistance element 431, capacitance element 432 and inductor element 433 to the optimum value in the configuration shown in FIG. 22 enables adjustment of the ratio $|Z_{L2}(f_c)|/Re[Z_{L2}(f_c)]$ of the real part and absolute value in the RF fundamental wave band of impedance $Z_{L2}(f)$ when the amplitude regulation circuit 83 side is viewed from distortion generation circuit 81. In addition, based on the principles explained in the first exemplary embodiment, adjusting the value of $|Z_{L2}(f_c)|/Re[Z_{L2}(f_c)]$ enables setting the amplitude of third-order intermodulation distortion that is supplied from output terminal 85 to the optimum value.

In the configuration shown in FIG. 22, resistance element 431, capacitance element 432, and inductor element 433 are elements for amplitude regulation, and the number of elements for setting amplitude to the optimum value is increased compared to the configuration shown in FIG. 8. The degree of freedom of regulation is improved over that of the configuration shown in FIG. 8 to the extent that the number of elements for setting is increased, and the amplitude of third-order intermodulation distortion supplied from output terminal 85 can be more easily set to the optimum value.

At least one of resistance element 431, capacitance element 432 and inductor element 433 may be used.

As described hereinabove, using anti-phase IMD3 generation circuit 63 shown in this modification enables distortion compensation based on the same principles as explained in the first and second exemplary embodiments.

Seventh Modification of the Second Exemplary Embodiment

This modification uses a plurality of elements in amplitude regulation circuit 83 but is of a different configuration than the sixth modification.

Figure 23:
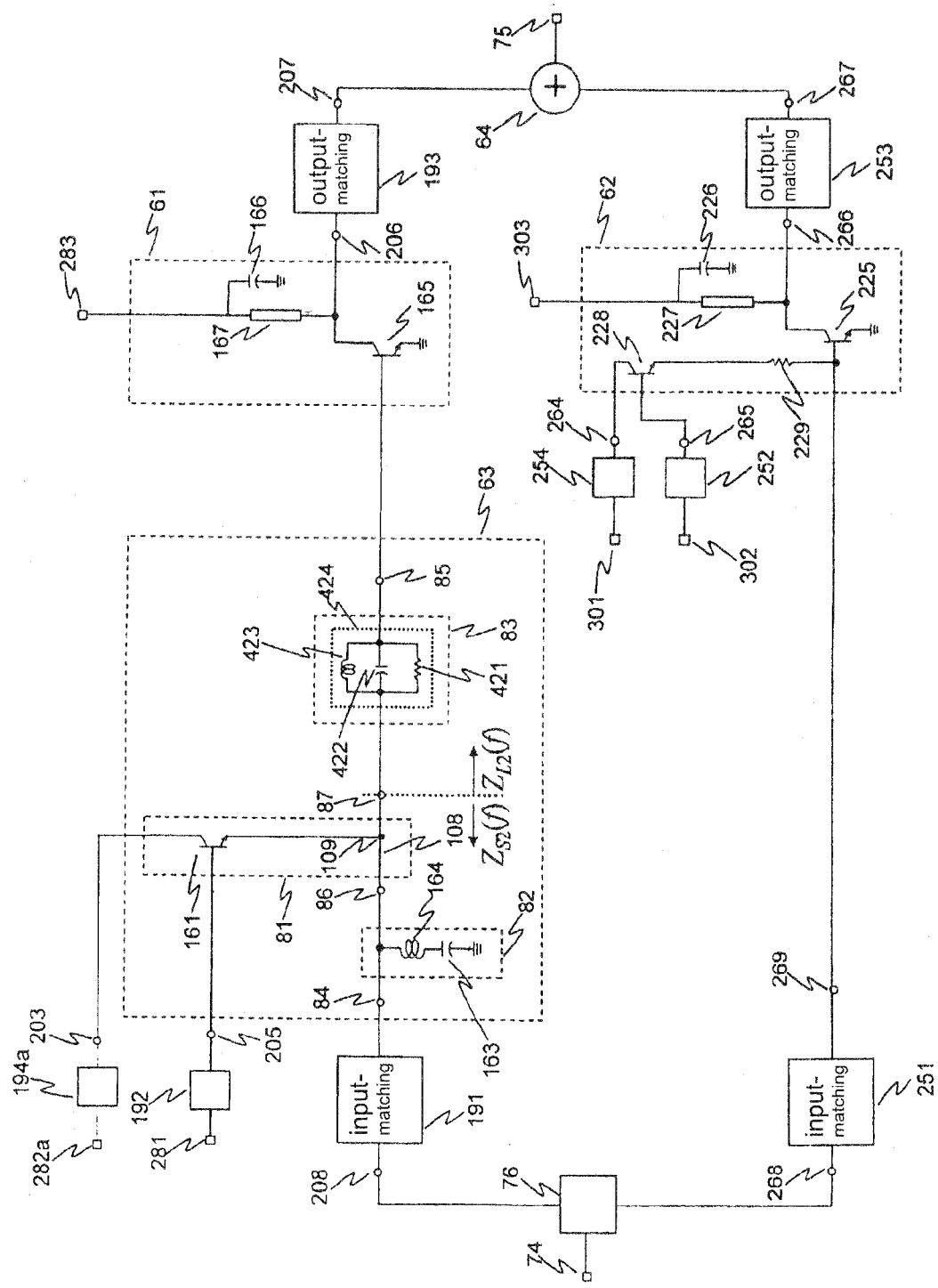
FIG. 23 is a circuit diagram showing a seventh modification of the second exemplary embodiment.

FIG. 23 is a circuit diagram showing the seventh modification of the second exemplary embodiment shown in FIG. 8. As shown in FIG. 23, amplitude regulation circuit 83 includes circuit 424 in which resistance element 421, capacitance element 422, and inductor element 423 are connected in parallel. Circuit 424 is then connected in a series to signal line 108.

In the configuration shown in FIG. 23, setting each of resistance element 421, capacitance element 422, and inductor element 423 to optimum values allows the amplitude of third-order intermodulation distortion that is supplied from output terminal 85 to be set to the optimum value for distortion compensation by the same principles as the sixth modification of the second exemplary embodiment.

In the configuration shown in FIG. 23, resistance element 421, capacitance element 422, and inductor element 423 are elements for amplitude regulation. Thus, as in the sixth modification, the degree of freedom of regulation is improved over the configuration shown in FIG. 8 to the degree that the number of elements for amplitude regulation is increased, and the amplitude of third-order intermodulation distortion that is supplied from output terminal 85 can be more easily set to the optimum value.

In addition, in the configuration shown in FIG. 23, bipolar transistor 161 in distortion generation circuit 81 not only has a function as non-linear element 101 that generates third-order intermodulation distortion for distortion compensation, but is also provided with the function of applying base voltage to bipolar transistor 165 in amplifier 61. In a configuration of this type, the ability to omit bipolar transistor 168, resistance element 169, and resistance element 170, which are constituent elements of the bias circuit of amplifier 61 and which were provided separately from distortion generation circuit 81, allows for further miniaturization.

In addition, at least one of resistance element 421, capacitance element 422, and inductor element 423 may be used.

The use of anti-phase IMD3 generation circuit 63 shown in this modification enables distortion compensation based on the same principles as described in the first and second exemplary embodiments.

Eighth Modification of the Second Exemplary Embodiment

This modification employs a plurality of elements in amplitude regulation circuit 83 but is of a configuration that differs from either of the sixth and seventh modifications.

Figure 24:
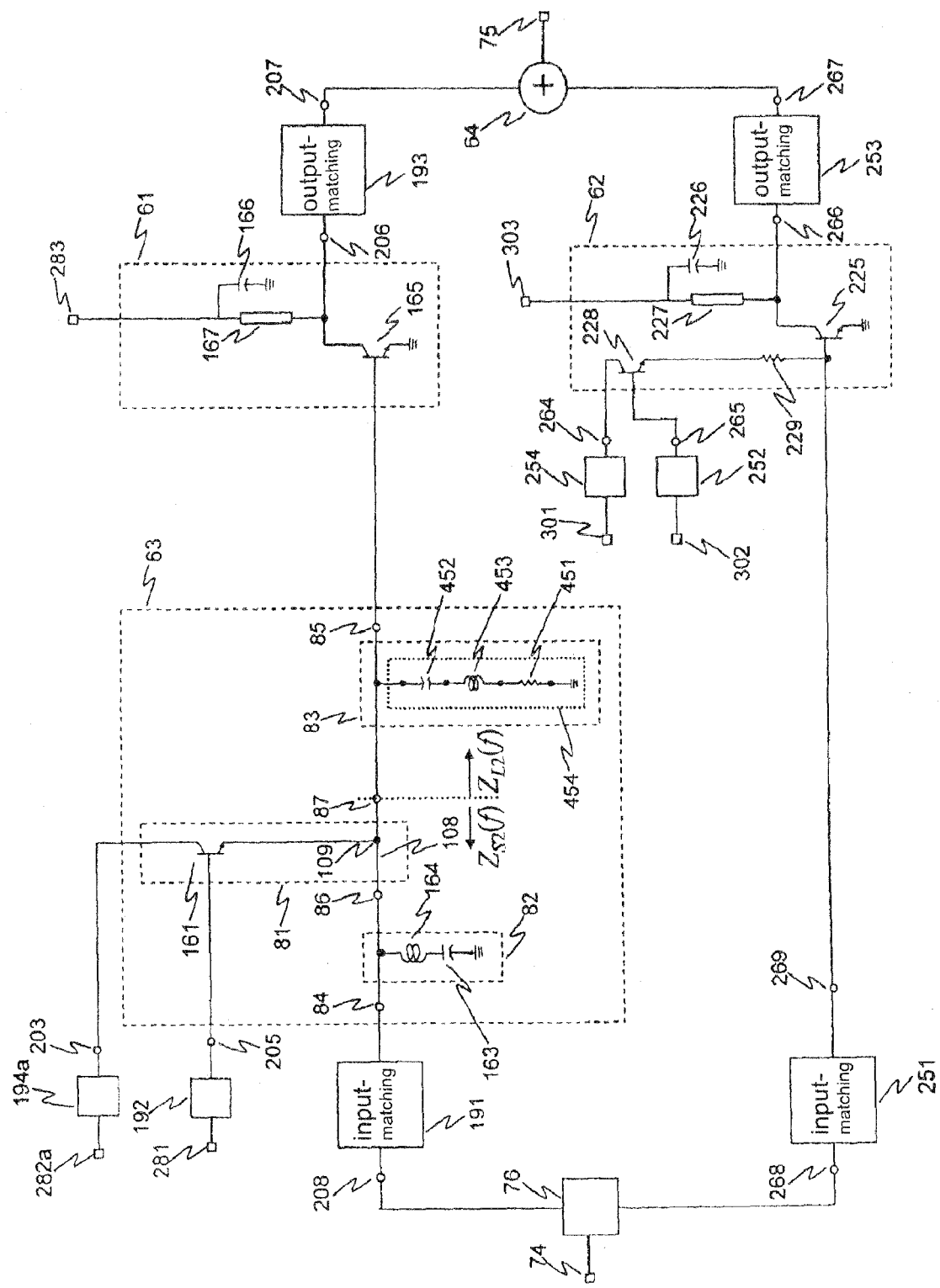
FIG. 24 is a circuit diagram showing an eighth modification of the second exemplary embodiment.

FIG. 24 is a circuit diagram showing the eight modification of the second exemplary embodiment shown in FIG. 8. As shown in FIG. 24, amplitude regulation circuit 83 includes circuit 454 in which resistance element 451, capacitance element 452, and inductor element 453 are connected in a series. Circuit 454 is then connected in parallel to signal line 108.

In the configuration shown in FIG. 24, setting the values of resistance element 441, capacitance element 442, and inductor element 443 to optimum values enables setting the amplitude of third-order intermodulation distortion that is supplied from output terminal 85 to the optimum value for distorcompensation by the same principles as the sixth modification of the second exemplary embodiment.

In addition, resistance element 451, capacitance element 452, and inductor element 453 in the configuration shown in FIG. 24 are elements for amplitude regulation, as with the sixth and seventh modifications. As a result, the degree of freedom of regulation is improved over that of the configuration shown in FIG. 8 to the extent that the number of elements for amplitude regulation is increased, whereby the amplitude of third-order intermodulation distortion supplied from output terminal 85 is more easily set to the optimum value.

Still further, in the configuration shown in FIG. 23, bipolar transistor 161 in distortion generation circuit 81 not only functions as non-linear element 101 as in the seventh modification but is also provided with the function of applying base voltage to bipolar transistor 165 in amplifier 61. As a result, bipolar transistor 168, resistance element 169, and resistance element 170, which are constituent elements of the bias circuit of amplifier 61, can be omitted to achieve a higher degree of miniaturization.

In addition, at least one of resistance element 451, capacitance element 452, and inductor element 453 may be used.

The use of anti-phase IMD3 generation circuit 63 shown in this modification enables distortion compensation based on the same principles as described in the first and second exemplary embodiments.

Ninth Modification of the Second Exemplary Embodiment

This modification employs a plurality of elements in amplitude regulation circuit 83 but is of a different configuration than any of the sixth to eighth modifications.

Figure 25:
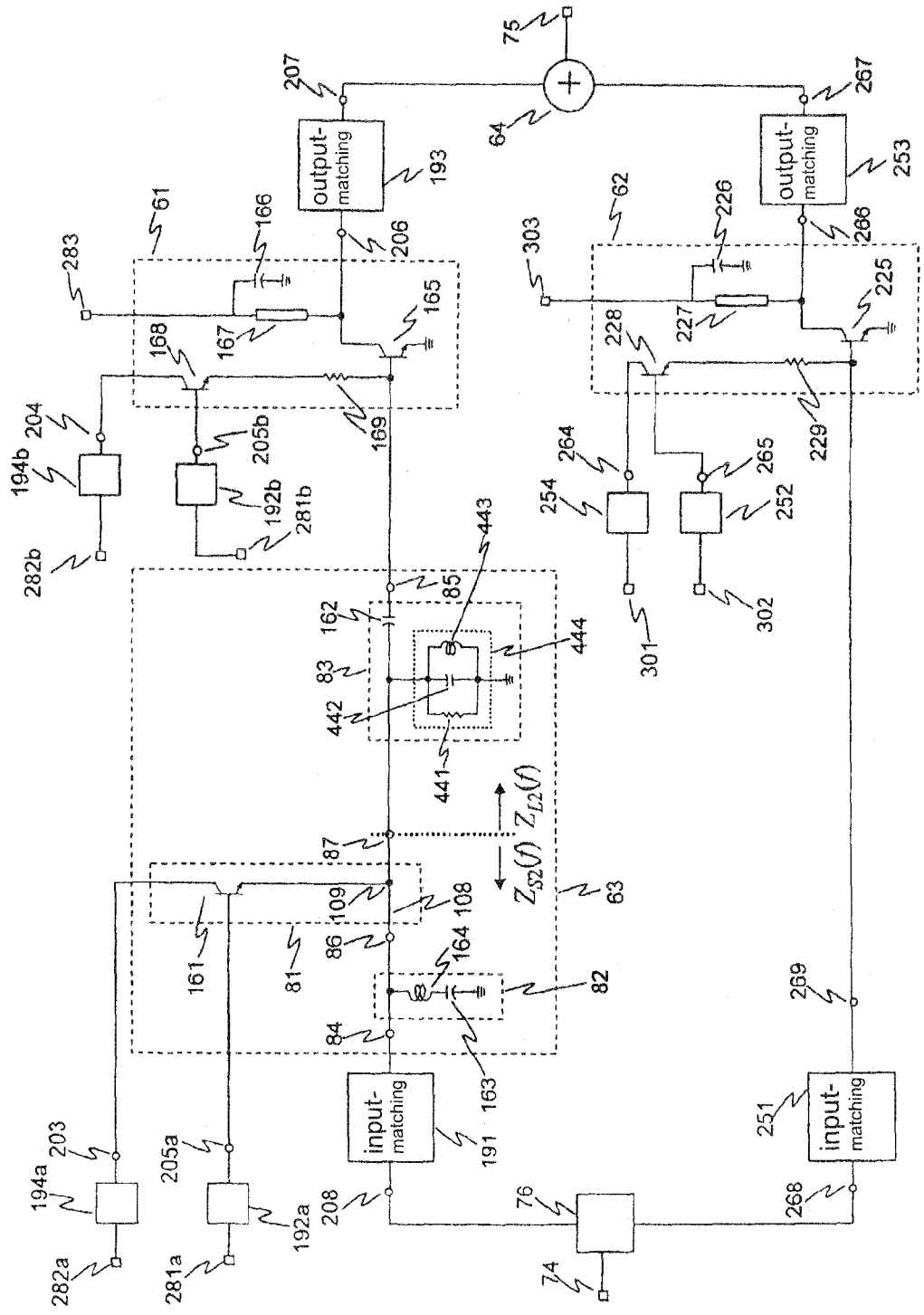
FIG. 25 is a circuit diagram showing a ninth modification of the second exemplary embodiment.

FIG. 25 is a circuit diagram showing the ninth modification of the second exemplary embodiment shown in FIG. 8.

As shown in FIG. 25, amplitude regulation circuit 83 includes circuit 444 in which resistance element 441, capacitance element 442, and inductor element 443 are connected in parallel, and capacitance element 162. Circuit 444 is then connected in parallel to signal line 108, and capacitance element 162 is connected in a series to signal line 108.

In the configuration shown in FIG. 25, setting the values of resistance element 441, capacitance element 162, capacitance element 442, and inductor element 443 to optimum values enables setting the amplitude of third-order intermodulation distortion supplied from output terminal 85 to the optimum value for distortion compensation by the same principles as the sixth modification of the second exemplary embodiment.

In the configuration shown in FIG. 25, resistance element 441, capacitance element 162, capacitance element 422, and inductor element 443 are elements for amplitude regulation. As a result, the degree of freedom in regulation is improved over the configuration shown in FIG. 8 to the extent that the number of elements for amplitude regulation is increased, as in the sixth and seventh modification, and the amplitude of third-order intermodulation distortion supplied from output terminal 85 is more easily set to the optimum value.

In addition, at least one of resistance element 441, capacitance element 162, capacitance element 442, and inductor element 443 may be used.

The use of anti-phase IMD3 generation circuit 63 shown in this modification enables distortion compensation based on the same principles as explained in the first and second exemplary embodiments.

Tenth Modification of the Second Exemplary Embodiment

This modification is of a configuration in which the sixth modification to the ninth modification are combined in amplitude regulation circuit 83.

Figure 26:
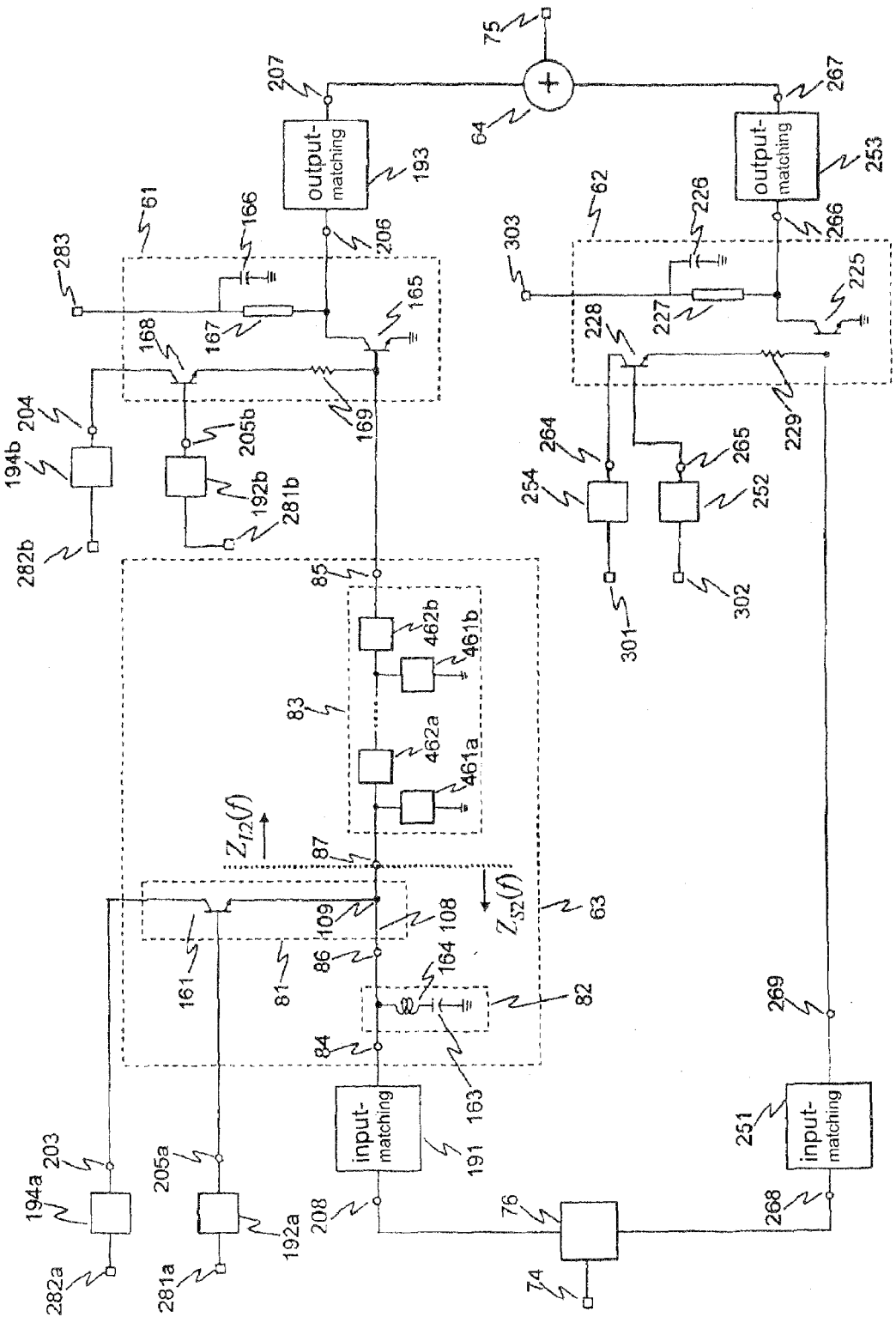
FIG. 26 is a circuit diagram showing a tenth modification of the second exemplary embodiment.

FIG. 26 is a circuit diagram showing the tenth modification of the second exemplary embodiment shown in FIG. 8. As shown in FIG. 26, amplitude regulation circuit 83 includes circuits 462a and 462b that are connected in a series to signal line 108 and circuits 461a and 461b that are connected in parallel to signal line 108. Each of circuits 462a and 462b is either of circuit 434 described in the sixth modification and circuit 424 described in the seventh modification. Each of circuit 461a and circuit 461b is either of circuit 454 described in the eighth modification and circuit 444 described in the ninth modification.

In the configuration shown in FIG. 26, setting the element values of the resistance elements, capacitance elements, and inductor elements in circuits 461a and 461b and circuit 462a and 462b to the optimum values enables setting the amplitude of third-order intermodulation distortion supplied from output terminal 85 to the optimum value for distortion compensation by the same principles as the sixth modification of the second exemplary embodiment.

In the configuration shown in FIG. 26, the degree of freedom of regulation is improved over the configuration shown in FIG. 8 to the extent that the number of elements that can be set to optimum values is increased, and the amplitude of third-order intermodulation distortion that is supplied from output terminal 85 is more easily set to the optimum value.

In the configuration shown in FIG. 26, two circuits, circuit 462a and circuit 462b, are provided as circuits that are connected in a series to signal line 108, but in the present invention, the number of circuits that correspond to either of circuit 434 of the sixth modification and circuit 424 of the seventh modification is not limited to two and the number may be one or three or more. In addition, two circuits, circuit 461a and circuit 461b, were provided as circuits that are connected in parallel to signal line 108, but in the present invention, the number of circuits that correspond to either of circuit 454 of the eighth modification and circuit 444 of the ninth modification is not limited to two, and may be one or three or more. Still further, although a case is described in which circuits 461a and 461b and circuits 462a and 462b are used, the present invention is not limited to this form and may use at least one of circuit 461a, circuit 461b, circuit 462a, and circuit 462b.

The use of anti-phase IMD3 generation circuit 63 shown in this modification enables distortion compensation based on the same principles as described in the first and second exemplary embodiments.

In addition, distortion compensation can be realized based on the same principles described in the first and second exemplary embodiments even when using anti-phase IMD3 generation circuit 63 that is formed by combining: phase-adjustment circuit 82 shown in the second exemplary embodiment and in the first and second modifications of the second exemplary embodiment; distortion generation circuit 81 shown in the second exemplary embodiment and in the third, fourth, and fifth modifications of the second exemplary embodiment; and amplitude regulation circuit 83 shown in the second exemplary embodiment and in the sixth, seventh, eighth, ninth, and tenth modifications of the second exemplary embodiment.

Third Exemplary Embodiment

Explanation next regards the configuration of the power amplifier according to the third exemplary embodiment of the present invention. The power amplifier of this exemplary embodiment is of a configuration in which two power amplifiers described in the first exemplary embodiment are connected in a series.

Figure 27:
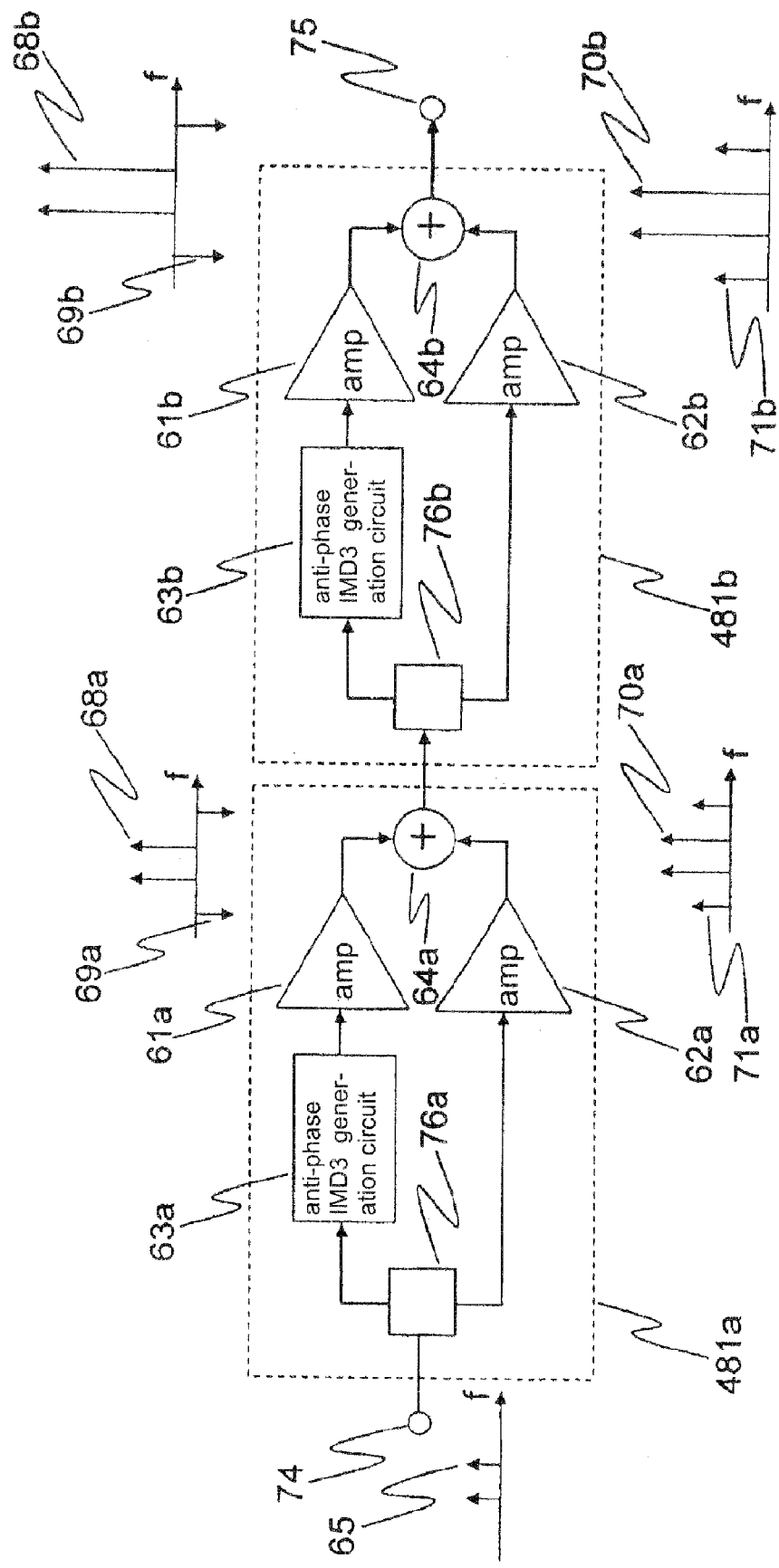
FIG. 27 is a block diagram showing an example of the configuration of the power amplifier according to the third exemplary embodiment.

FIG. 27 is a block diagram showing an example of the configuration of power amplifier according to the third exemplary embodiment. As shown in FIG. 27, the power amplifier of the present exemplary embodiment is of a configuration that includes: low-distortion amplifier 481a to which a signal is applied as input and low-distortion amplifier 481b connected to a section that follows low-distortion amplifier 481a. Input terminal 74 is provided in a section before low-distortion amplifier 481a, and output terminal 75 is provided in a section following low-distortion amplifier 481b.

Low-distortion amplifier 481a includes: distributor 76a that distributes input signal 65, anti-phase IMD3 generation circuit 63a that supplies a main signal and third-order intermodulation distortion that is anti-phase with the main signal, amplifier 61a that is connected to the output side of anti-phase IMD3 generation circuit 63a, amplifier 62a that is connected in parallel to anti-phase IMD3 generation circuit 63a and amplifier 61a, and synthesizer 64a for combining the output signals of amplifier 61a and amplifier 62a. Similar to low-distortion amplifier 481a, low-distortion amplifier 481b includes: distributor 76b, anti-phase IMD3 generation circuit 63b, amplifiers 61b and 62b, and synthesizer 64b. The output terminal of synthesizer 64a in low-distortion amplifier 481a is connected to the input terminal of distributor 76b in low-distortion amplifier 481b.

In the exemplary embodiment shown in FIG. 27, anti-phase IMD3 generation circuit 63a and anti-phase IMD3 generation circuit 63b each have the same configuration as either of anti-phase IMD3 generation circuit 63 described in the first exemplary embodiment as well as in the second exemplary embodiment and its modifications. Anti-phase IMD3 generation circuit 63a and anti-phase IMD3 generation circuit 63b in the present exemplary embodiment are also able to supply third-order intermodulation distortion that is anti-phase with the main signal by the same principles as described in the first exemplary embodiment as well as the second exemplary embodiment and its modifications.

Explanation next regards the operations of the power amplifier shown in FIG. 27.

In the configuration shown in FIG. 27, amplifier 61a for which anti-phase IMD3 generation circuit 63a is provided in the preceding section supplies as output main signal 68a and third-order intermodulation distortion 69a that is anti-phase with respect to main signal 68a. Amplifier 62a for which anti-phase IMD3 generation circuit is not provided in the preceding section supplies as output main signal 70a and third-order intermodulation distortion 71a that is in-phase with respect to main signal 70a. As a result, anti-phase third-order intermodulation distortion 69a and third-order intermodulation distortion 71a offset each other in synthesizer 64a, and the combined signal of main signal 68a and main signal 70a is supplied to low-distortion amplifier 481b of the following section.

In low-distortion amplifier 481b of the following section as well, anti-phase third-order intermodulation distortion 69b and third-order intermodulation distortion 71b offset each other in synthesizer 64b by the same principles as low-distortion amplifier 481a of the preceding section, and a low-distortion output signal in which third-order intermodulation distortion is suppressed is supplied to output terminal 75. In the present exemplary embodiment, main signals are combined in-phase in each of synthesizer 64a and synthesizer 64b, whereby power loss is also suppressed during synthesis.

Although the configuration shown in FIG. 27 is a two-stage configuration in which low-distortion amplifier 481a and low-distortion amplifier 481b are connected, the present invention is not limited to a two-stage configuration, and low-distortion amplifiers of the same configuration as low-distortion amplifier 481a may also be connected in three or more stages. A power amplifier can also be configured by connecting low-distortion amplifiers in multiple stages, and an amplifier with higher gain can be realized by increasing the number of stages of amplifiers.

As described hereinabove, the configuration shown in FIG. 27 provides an amplifier that realizes lower distortion and moreover, higher gain while suppressing power consumption.

First Modification of the Third Exemplary Embodiment

This modification is a configuration in which the amplification paths of low-distortion amplifier 481a and low-distortion amplifier 481b described in the third exemplary embodiment are connected together.

Figure 28:
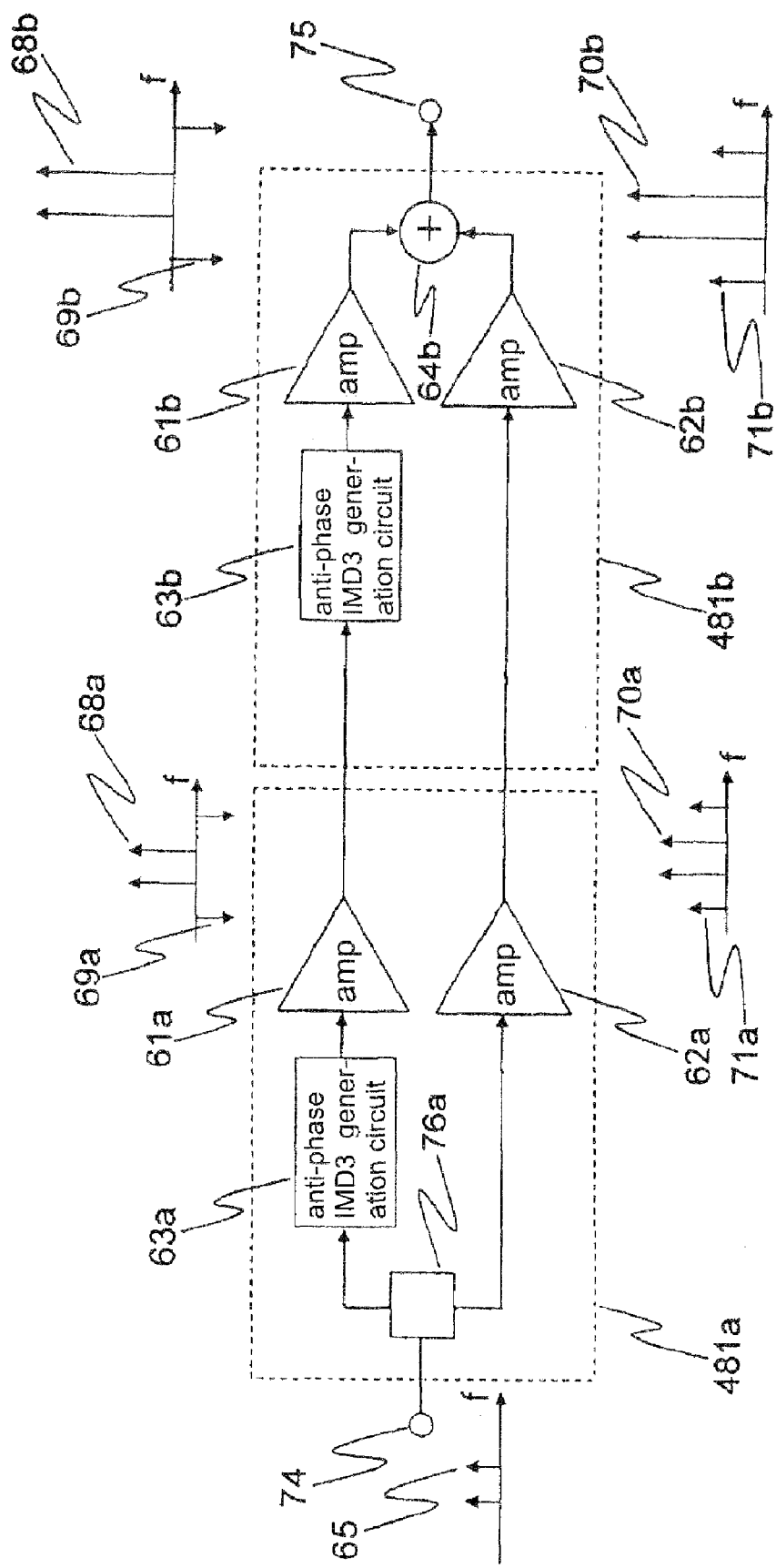
FIG. 28 is a block diagram showing a first modification of the third exemplary embodiment.

FIG. 28 is a block diagram showing the first modification of the third exemplary embodiment shown in FIG. 27.

As shown in FIG. 28, the power amplifier of this modification is of a configuration in which synthesizer 64a and distributor 76b are omitted from the configuration shown in FIG. 27, the output terminal of amplifier 61a is connected to the input terminal of anti-phase IMD3 generation circuit 63b, and the output terminal of amplifier 62a is connected to the input terminal of amplifier 62b.

A simple explanation regarding the operation of the power amplifier in this modification follows hereinbelow.

In the configuration shown in FIG. 28, amplifier 61a for which anti-phase IMD3 generation circuit 63a is provided in a preceding section transmits main signal 68a and third-order intermodulation distortion 69a that is anti-phase with main signal 68a to anti-phase IMD3 generation circuit 63b. Amplifier 61b for which anti-phase IMD3 generation circuit 63b is provided in the preceding section transmits main signal 68b and third-order intermodulation distortion 69b that is anti-phase with main signal 68b to synthesizer 64b. On the other hand, amplifier 62a for which an anti-phase IMD3 generation circuit is not provided in the preceding section transmits main signal 70a and third-order intermodulation distortion 71a that is in-phase with main signal 70a to amplifier 62b. Amplifier 62b transmits main signal 70b obtained by amplifying main signal 70a and third-order intermodulation distortion 71b obtained by amplifying third-order intermodulation distortion 71a to synthesizer 64b.

When main signal 68b and third-order intermodulation distortion 69b and main signal 70b and third-order intermodulation distortion 71b are applied as input to synthesizer 64b, third-order intermodulation distortion 69b and third-order intermodulation distortion 71b that are mutually anti-phase with each other offset each other in synthesizer 64b, and a low-distortion signal is supplied to output terminal 75.

The configuration shown in FIG. 28 is a two-stage configuration in which low-distortion amplifier 481a and low-distortion amplifier 481b are connected, but the present invention is not limited to a two-stage configuration and low-distortion amplifiers of the same configuration as low-distortion amplifier 481a may also be connected in three or more stages. A power amplifier can be configured by connecting multiple stages of low-distortion amplifiers, and an amplifier of higher gain can be realized by increasing the number of stages of amplifiers.

Figure 29:
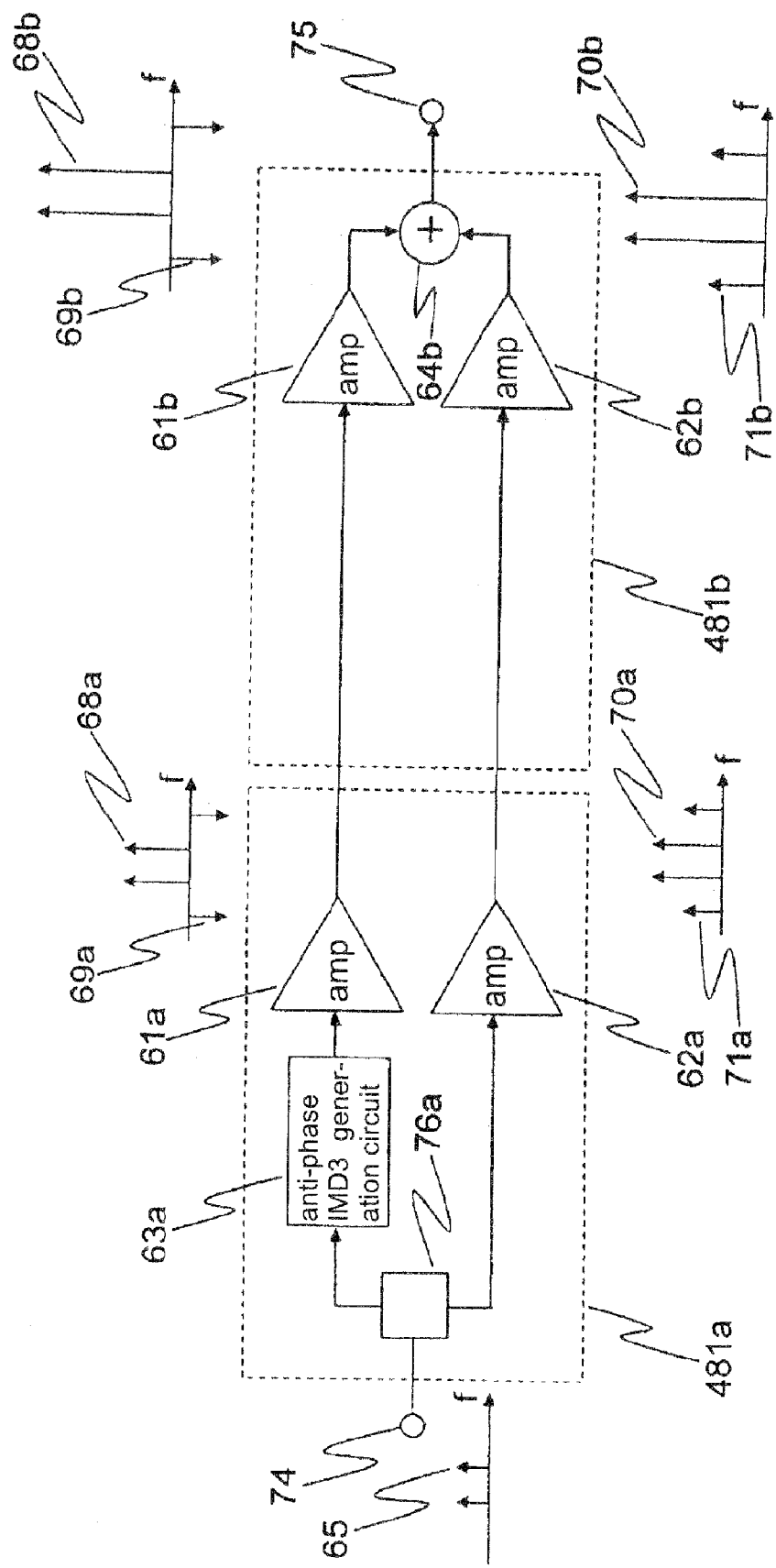
FIG. 29 is a block diagram showing another configuration of the first modification of the third exemplary embodiment.

A configuration may also be adopted such as the configuration shown in FIG. 29 in which either of the anti-phase IMD3 generation circuits provided in each of the sections preceding amplifier 61a and amplifier 61b is omitted. When three or more stages of low-distortion amplifiers of the same configuration as low-distortion amplifier 481a are connected, an anti-phase IMD3 generation circuit should be provided in at least any one of the low-distortion amplifiers.

The configuration shown in FIG. 28 or FIG. 29 can be made more compact than the configuration shown in FIG. 27 to the extent that the provision of synthesizer 64a and distributor 76b is omitted, and an amplifier of the same low distortion as the configuration shown in FIG. 28 can be realized.

Fourth Exemplary Embodiment

Explanation next regards the configuration of the power amplifier of the fourth exemplary embodiment of the present invention. The power amplifier of the present exemplary embodiment is of a configuration in which an amplifier is provided in a section preceding the power amplifier described in the first exemplary embodiment.

Figure 30:
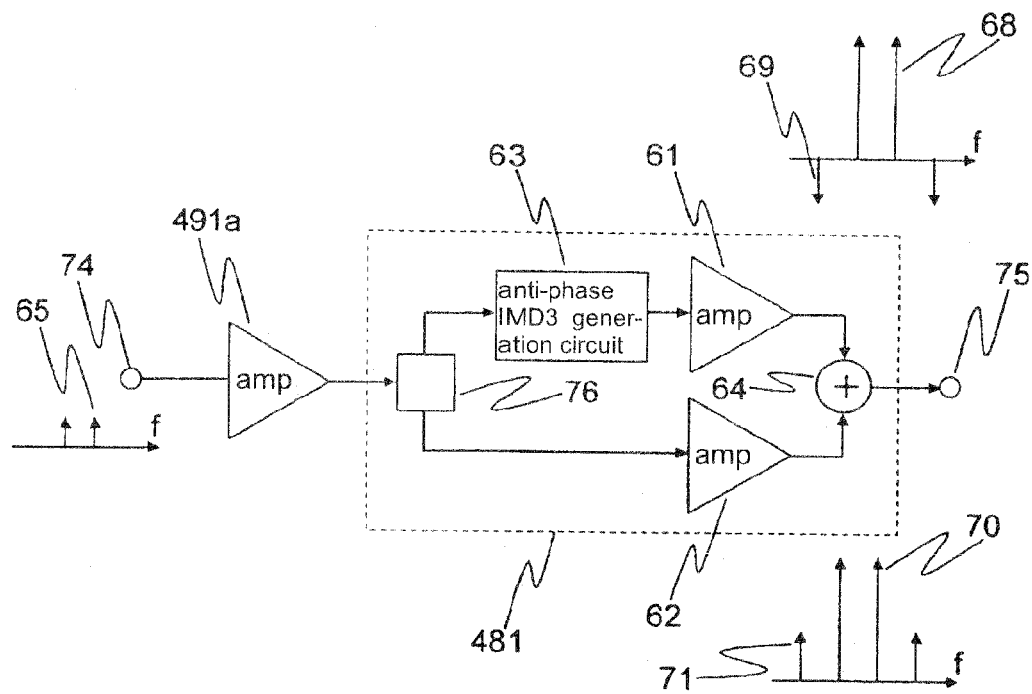
FIG. 30 is a block diagram showing an example of the configuration of the power amplifier according to the fourth exemplary embodiment.

FIG. 30 is a block diagram showing an example of the configuration of the power amplifier according to the fourth exemplary embodiment. As shown in FIG. 30, the power amplifier of the present exemplary embodiment is of a configuration that includes amplifier 481 and amplifier 491a provided in a section preceding amplifier 481. Amplifier 481 includes: distributor 76 for distributing input signal 65, anti-phase IMD3 generation circuit 63 for supplying a main signal and third-order intermodulation distortion that is anti-phase with the main signal, amplifier 61 that is connected to the output side of anti-phase IMD3 generation circuit 63, amplifier 62 that is connected in parallel to anti-phase IMD3 generation circuit 63 and amplifier 61, and synthesizer 64 for combining the output signals of amplifier 61 and amplifier 62. Input terminal 74 is provided in the section preceding amplifier 491a, and output terminal 75 is provided in the section following synthesizer 64.

In the exemplary embodiment shown in FIG. 30, anti-phase IMD3 generation circuit 63 has the same configuration as any of anti-phase IMD3 generation circuit 63 described in the first exemplary embodiment as well as the second exemplary embodiment and its modifications. Anti-phase IMD3 generation circuit 63 in the present exemplary embodiment can also supply a third-order intermodulation distortion that is anti-phase with the main signal by the same principles as described in the first exemplary embodiment as well as the second exemplary embodiment and its modifications.

Explanation next regards the operations of the power amplifier of the present exemplary embodiment.

In the configuration shown in FIG. 30, upon the input of input signal 65 by way of input terminal 74, amplifier 491a amplifies input signal 65 and transmits to distributor 76. Distributor 76 distributes the signal received from amplifier 491a to anti-phase IMD3 generation circuit 63 and amplifier 62.

Here, when the main signal and third-order intermodulation distortion that are supplied from amplifier 491a are in an in-phase relation, the operations proceed as follows. Anti-phase IMD3 generation circuit 63 makes the phase of the generated third-order intermodulation distortion anti-phase with the main signal, and further, makes the amplitude large, whereby anti-phase IMD3 generation circuit 63 supplies third-order intermodulation distortion that is anti-phase with the main signal. Amplifier 61 then amplifies the main signal and third-order intermodulation distortion that are received from anti-phase IMD3 generation circuit 63 and transmits to synthesizer 64. On the other hand, amplifier 62 amplifies the main signal and third-order intermodulation distortion that is in-phase with the main signal and transmits to synthesizer 64. Third-order intermodulation distortion 69 that is anti-phase with main signal 68 is supplied from amplifier 61, third-order intermodulation distortion 71 that is anti-phase with main signal 70 is supplied from amplifier 62, and the third-order intermodulation distortion are combined in synthesizer 64, whereby third-order intermodulation distortion 69 and third-order intermodulation distortion 71 are offset and a low-distortion signal can be supplied from output terminal 75.

Conversely, when the main signal and third-order intermodulation distortion supplied from amplifier 491a are in an anti-phase relation, the operations are as follows. Anti-phase IMD3 generation circuit 63 makes the generated third-order intermodulation distortion anti-phase with the main signal and moreover, makes the amplitude of the third-order intermodulation distortion small. In this way, anti-phase IMD3 generation circuit 63 regulates and supplies third-order intermodulation distortion that is anti-phase with the main signal such that the amplitude is not excessively large. Amplifier 61 then amplifies the main signal and third-order intermodulation distortion received from anti-phase IMD3 generation circuit 63 and transmits the result to synthesizer 64. On the other hand, amplifier 62 amplifies and transmits main signal and third-order intermodulation distortion that is in-phase with the main signal to synthesizer 64. Third-order intermodulation distortion 69 that is anti-phase with main signal 68 is supplied from amplifier 61, third-order intermodulation distortion 71 that is anti-phase with main signal 70 is supplied from amplifier 62, and the two are combined in synthesizer 64. As a result, third-order intermodulation distortion 69 and third-order intermodulation distortion 71 offset each other and a low-distortion signal can be supplied from output terminal 75.

The configuration shown in FIG. 30 can achieve a greater decrease of the number of components than the configuration described in the third exemplary embodiment, and further, can realize an amplifier of low distortion and high gain, similar to the third exemplary embodiment.

First Modification of Fourth Exemplary Embodiment

This modification is of a configuration provided with amplifier 491a in the section after amplifier 481 in the power amplifier shown in FIG. 30. A detailed explanation regarding configuration and operation that are similar to the fourth exemplary embodiment is here omitted.

Figure 31:
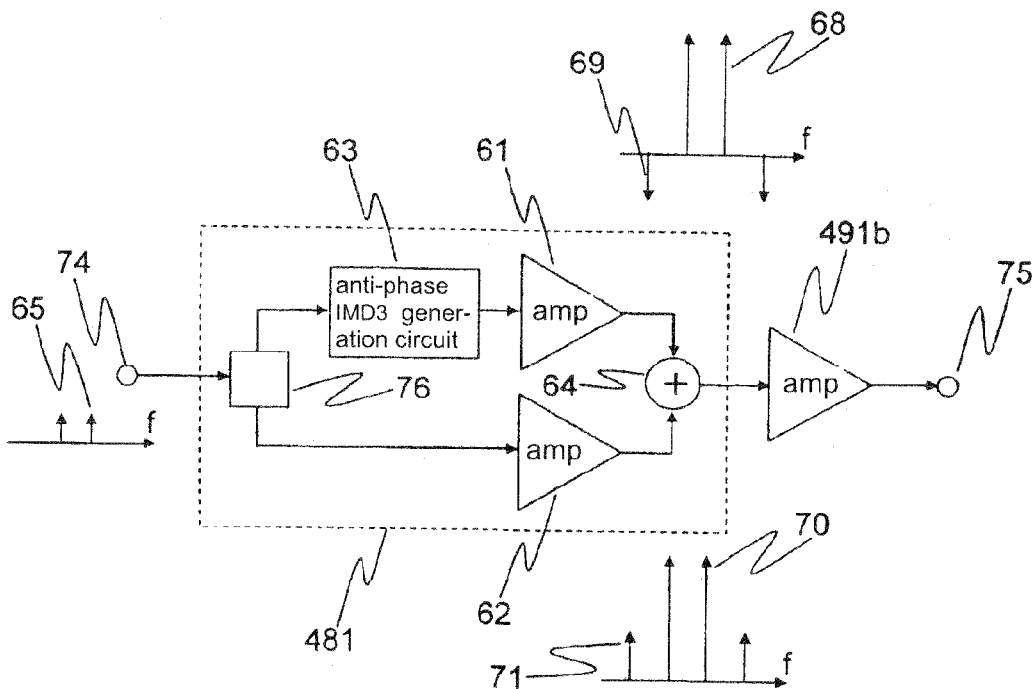
FIG. 31 is a block diagram showing a first modification of the fourth exemplary embodiment.

FIG. 31 is a block diagram showing the first modification of the fourth exemplary embodiment shown in FIG. 30. The exemplary embodiment shown in FIG. 31 is a configuration in which, in the configuration shown in FIG. 30, amplifier 491a that was provided in the section preceding amplifier 481 is eliminated, and instead, amplifier 491b is provided in the section following amplifier 481.

In the configuration shown in FIG. 31, a low-distortion signal is amplified in amplifier 491b after having been supplied from amplifier 481, as was explained in the first exemplary embodiment. Because the third-order intermodulation distortion is reduced in the signal that is supplied from amplifier 481, distortion can be suppressed and the main signal can be further amplified.

A method is here described for achieving a further decrease of the amplitude of the third-order intermodulation distortion contained in the signal supplied by amplifier 491*b*.

When the main signal and third-order intermodulation distortion supplied from amplifier 491*b* are in an in-phase relation, the operations are as follows. Anti-phase IMD3 generation circuit 63 makes the generated third-order intermodulation distortion anti-phase with the main signal, and moreover, increases the amplitude. As a result, anti-phase IMD3 generation circuit 63 supplies a third-order intermodulation distortion that is anti-phase with the main signal. Amplifier 61 then amplifies the main signal and third-order intermodulation distortion that are received from anti-phase IMD3 generation circuit 63 and transmits the result to synthesizer 64. On the other hand, amplifier 62 amplifies the main signal and third-order intermodulation distortion that is in-phase with the main signal and transmits to synthesizer 64. Third-order intermodulation distortion 69 that is anti-phase with main signal 68 is supplied from amplifier 61, third-order intermodulation distortion 71 that is anti-phase with main signal 70 is supplied from amplifier 62, and these outputs are combined in synthesizer 64. As a result, third-order intermodulation distortion 69 and third-order intermodulation distortion 71 offset each other. In this way, the amplitude of third-order intermodulation distortion of the signal supplied by amplifier 491*b* can be further decreased.

On the other hand, when the main signal and third-order intermodulation distortion supplied from amplifier 491*b* are in an anti-phase relation, the operations are as follows. Anti-phase IMD3 generation circuit 63 makes the generated third-order intermodulation distortion anti-phase with the main signal, and further, decreases the amplitude. In this way, anti-phase IMD3 generation circuit 63 regulates third-order intermodulation distortion that is anti-phase with the main signal such that the amplitude does not become excessively large and supplies the result as output. Amplifier 61 then amplifies the main signal and third-order intermodulation distortion received from anti-phase IMD3 generation circuit 63 and transmits the result to synthesizer 64. On the other hand, amplifier 62 amplifies the main signal and third-order intermodulation distortion that is in-phase with the main signal and transmits the result to synthesizer 64. Third-order intermodulation distortion 69 that is anti-phase with main signal 68 is supplied from amplifier 61, third-order intermodulation distortion 71 that is anti-phase with main signal 70 is supplied from amplifier 62, and these outputs are combined in synthesizer 64. As a result, third-order intermodulation distortion 69 and third-order intermodulation distortion 71 offset each other, whereby the amplitude of third-order intermodulation distortion of the signal supplied by amplifier 491*b* can be further decreased.

As explained hereinabove, in the configuration shown in FIG. 31 as well, the number of parts can be decreased from the configuration shown in the third exemplary embodiment, and further, an amplifier having low distortion and high gain can be realized similar to the third exemplary embodiment.

Fifth Exemplary Embodiment

Explanation next regards the configuration of the power amplifier of the fifth exemplary embodiment of the present invention. The power amplifier of the present exemplary embodiment is of a configuration provided with: a plurality of amplification paths that each include an anti-phase IMD3 generation circuit described in the first exemplary embodiment, and amplification paths that each lack an anti-phase IMD3 generation circuit.

Figure 32:
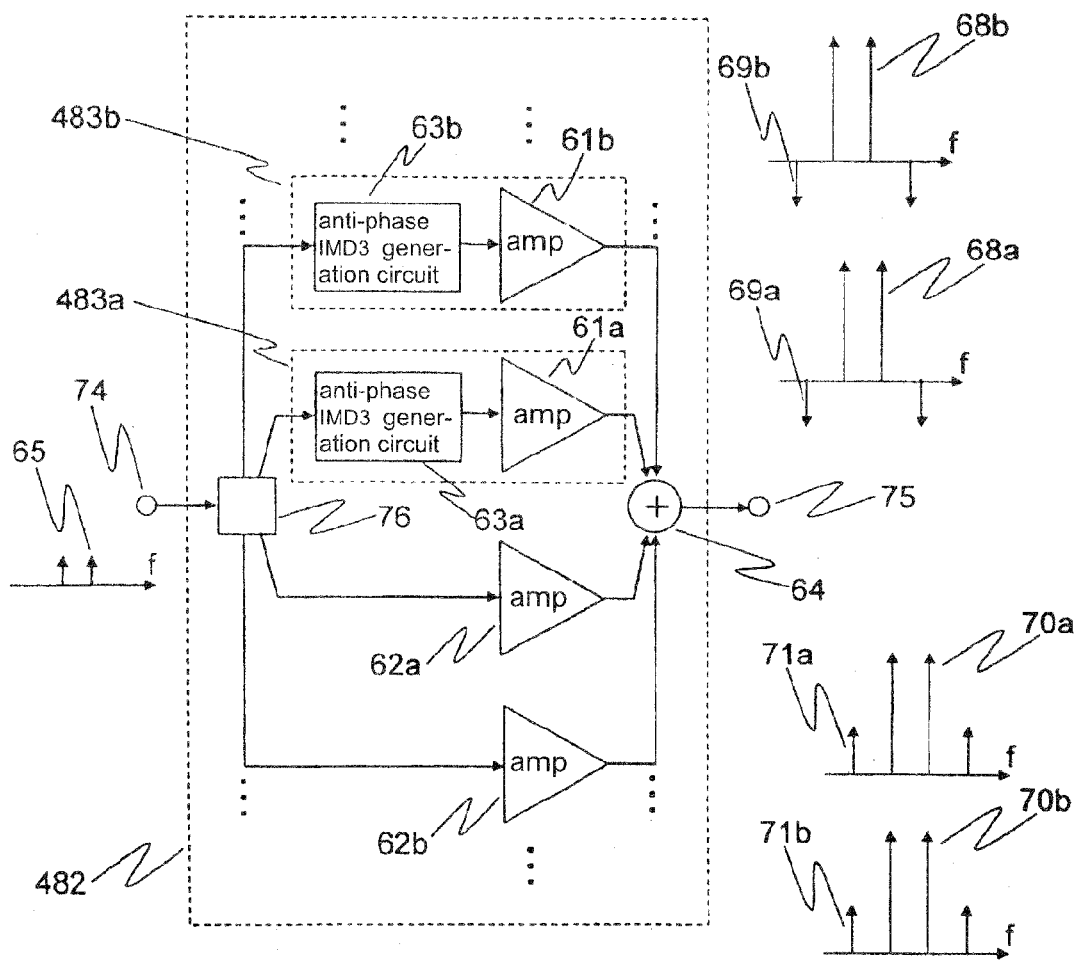
FIG. 32 is a block diagram showing an example of the configuration of the power amplifier according to the fifth exemplary embodiment.

FIG. 32 is a block diagram showing an example of the configuration of the power amplifier according to the fifth exemplary embodiment. As shown in FIG. 32, the power amplifier of the present exemplary embodiment includes: a plurality of first amplification paths that each include an anti-phase IMD3 generation circuit, a plurality of second amplification paths that each lack an anti-phase IMD3 generation circuit, distributor 76 for distributing input signal 65 to the plurality of first amplification paths and the plurality of second amplification paths, and synthesizer 64 for combining output signals from the plurality of first amplification paths and the plurality of second amplification paths. Input terminal 74 is provided in a section preceding distributor 76, and output terminal 75 is provided in a section following synthesizer 64.

The plurality of first amplification paths corresponds to the plurality of circuits 483*a*, 483*b*, . . . , 483*x* (where m is the number of elements a, b, . . . , x and m is an integer equal to or greater than 2). One amplifier is provided for each of the plurality of second amplification paths. These amplifiers are represented as amplifiers 62*a*, 62*b*, . . . , 62*y* (where n is the number of elements a, b, . . . , y and n is an integer equal to or greater than 2). The number of second amplification paths is n. As shown in FIG. 32, circuits 483*a*-483*x* and amplifiers 62*a*-62*y* are connected in parallel.

Circuit 483*a* includes anti-phase IMD3 generation circuit 63*a* for supplying a main signal and third-order intermodulation distortion that is anti-phase with the main signal, and amplifier 61*a* that is connected to the output side of anti-phase IMD3 generation circuit 63*a*. Similarly, circuit 483*b* includes anti-phase IMD3 generation circuit 63*b* and amplifier 61*b*. The other circuits 483*c*-483*x* are of the same configuration and a detailed explanation is therefore here omitted.

In the exemplary embodiment shown in FIG. 32, each of anti-phase IMD3 generation circuits 63*a*-63*x* has the same configuration as any of anti-phase IMD3 generation circuits described in the first exemplary embodiment as well as the second exemplary embodiment and its modifications. In addition, anti-phase IMD3 generation circuit 63 in the present exemplary embodiment can also supply a third-order intermodulation distortion that is anti-phase with the main signal by means of the same principles as explained in the first exemplary embodiment as well as in the second exemplary embodiment and its modifications.

In the present exemplary embodiment, each of anti-phase IMD3 generation circuits 63*a*-63*x* in circuits 483*a*-483*x* are set such that the third-order intermodulation distortion that is anti-phase with the main signal that is supplied by circuits 483*a*-483*x* and the third-order intermodulation distortion that is in-phase with the main signal that is supplied by amplifiers 62*a*-62*y* offset each other.

in the configuration shown in FIG. 32, third-order intermodulation distortion 69*a*-69*x* that is anti-phase with respect to main signals 68*a*-68*x* are supplied from circuits 483*a*-483*x*, respectively, that include anti-phase IMD3 generation circuits. In addition, third-order intermodulation distortion 71*a*-71*y* that are anti-phase with respect to main signals 70*a*-70*y* are supplied from amplifiers 62*a*-62*y*, respectively, of the amplification paths that lack anti-phase IMD3 generation circuits. Third-order intermodulation distortion 69*a*-69*x* and third-order intermodulation distortion 71*a*-71*y* that are in an anti-phase relation to each other are combined in synthesizer 64 such that the third-order intermodulation distortion is offset, and an output signal in which the third-order intermodulation distortion is suppressed is supplied to output terminal 75.

As described hereinabove, the fifth exemplary embodiment shown in FIG. 32 can realize a low-distortion amplifier similar to the other above-described exemplary embodiments.

Sixth Exemplary Embodiment

Explanation next regards the configuration of the power amplifier of the sixth exemplary embodiment of the present invention. The present exemplary embodiment applies the present invention to a Doherty amplifier.

Figure 33:
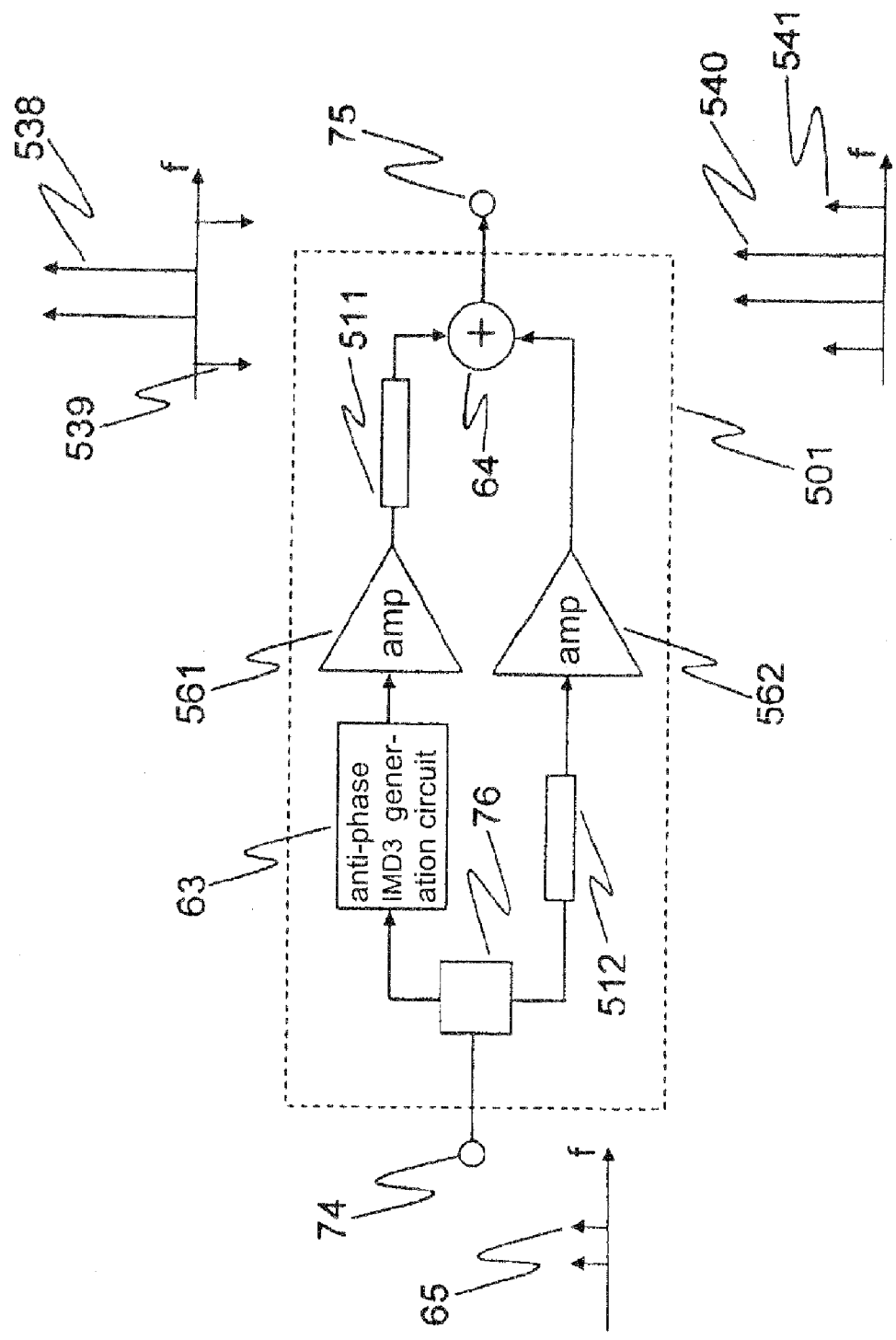
FIG. 33 is a block diagram showing an example of the configuration of the power amplifier according to the sixth exemplary embodiment.

FIG. 33 is a block diagram showing an example of the configuration of the power amplifier according to the sixth exemplary embodiment. As shown in FIG. 33, power amplifier 501 of the present exemplary embodiment includes first and second amplification paths connected in parallel, distributor 76 for distributing an input signal to the first and second amplification paths, and synthesizer 64 for combining the output signals of the first and second amplification paths. Input terminal 74 is provided in the section preceding distributor 76, and output terminal 75 is provided in the section following synthesizer 64.

The first amplification path includes anti-phase IMD3 generation circuit 63 for supplying a main signal and third-order intermodulation distortion that is anti-phase with the main signal, amplifier 561 that is connected to the output side of anti-phase IMD3 generation circuit 63, and $\lambda/4$ line 511 that is connected to the section following amplifier 561. The second amplification path includes amplifier 562, and $\lambda/4$ line 512 connected to the section preceding amplifier 562. $\lambda/4$ line 511 and $\lambda/4$ line 512 form a phase-adjustment unit for changing phase 90°.

In the exemplary embodiment shown in FIG. 33, anti-phase IMD3 generation circuit 63 has the same configuration as any of anti-phase IMD3 generation circuit 63 described in the first exemplary embodiment as well as the second exemplary embodiment and its modifications. In addition, anti-phase IMD3 generation circuit 63 in the present exemplary embodiment can supply third-order intermodulation distortion that is anti-phase with the main signal by the same principles as explained in the first exemplary embodiment as well as in the second exemplary embodiment and its modifications.

In the configuration shown in FIG. 33, amplifier 561 is set to a Class-A-AB bias, amplifier 562 is set to a Class-C bias state. Amplifier 561 performs operations that correspond to a main amplifier in a Doherty amplifier, and amplifier 562 performs operations that correspond to an auxiliary amplifier in a Doherty amplifier. In a configuration of this type, change in output impedance of amplifier 562 that accompanies increase in input power can be used and the load impedance of main amplifier 561 set to the optimum efficiency state over a broad input power range by the same principles as a Doherty amplifier of the related art. In this way, a greater improvement in efficiency can be obtained over a broad input power range than for amplifier 561 alone.

In addition, in the configuration shown in FIG. 33, third-order intermodulation distortion 539 that is anti-phase with main signal 538 is supplied from amplifier 561 for which anti-phase IMD3 generation circuit 63 is provided in the preceding section. In addition, third-order intermodulation distortion 541 that is in-phase with main signal 540 is supplied from amplifier 562 for which an anti-phase IMD3 generation circuit is not provided in the preceding section. Third-order intermodulation distortion 539 and third-order intermodulation distortion 541 that are in an anti-phase relation to each other are then combined and offset each other in synthesizer 64, whereby a low-distortion signal is supplied to output terminal 75.

Based on the above-described process, a decrease in distortion and an improvement in efficiency are simultaneously obtained in the configuration shown in FIG. 33.

First Modification of Sixth Exemplary Embodiment

This modification is of a configuration in which anti-phase IMD3 generation circuit 63 provided in the first amplification path in the configuration shown in FIG. 33 is provided in the section preceding amplifier 562 of the second amplification path.

Figure 34:
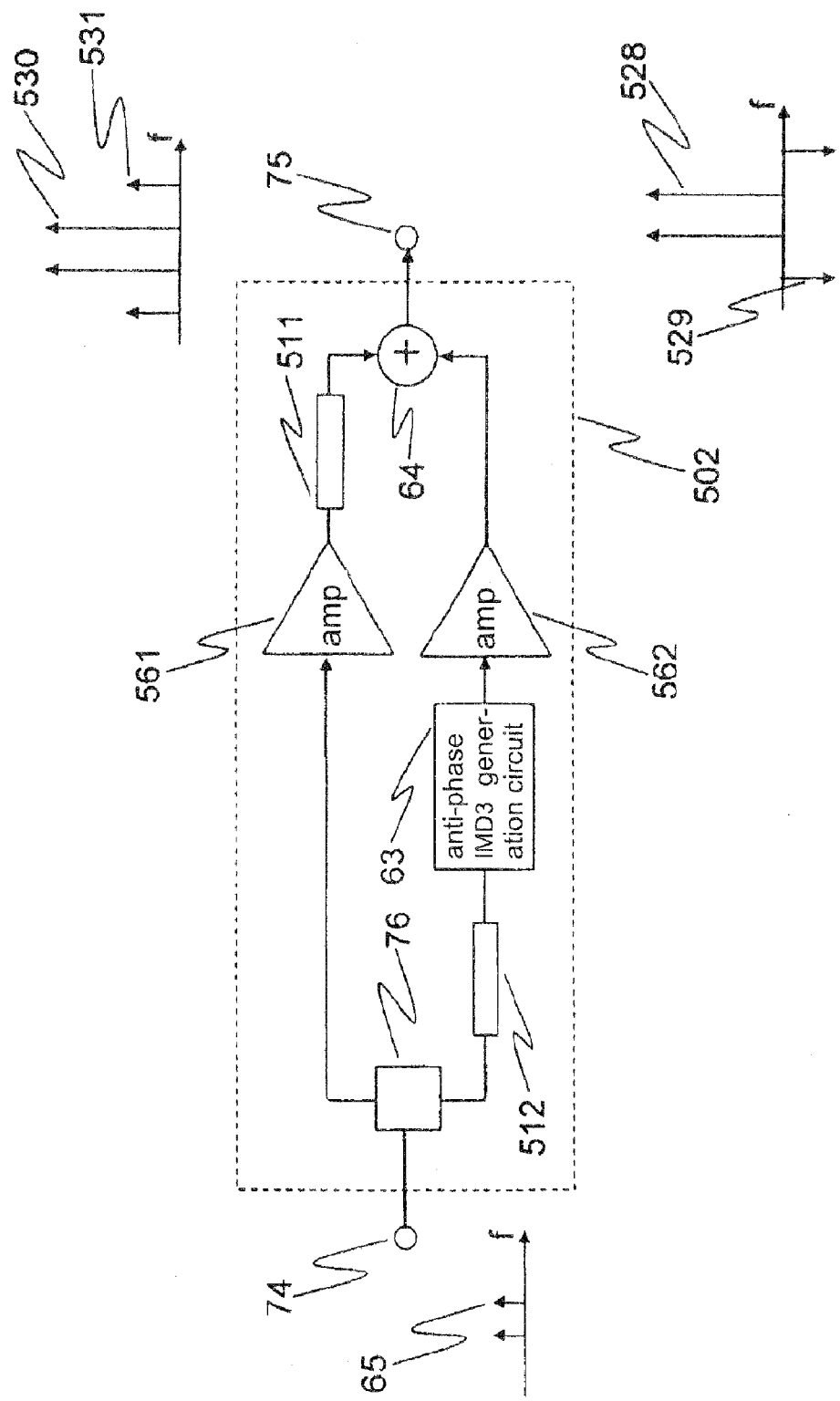
FIG. 34 is a block diagram showing a first modification of the sixth exemplary embodiment.

FIG. 34 is a block diagram showing the first modification of the sixth exemplary embodiment shown in FIG. 33.

Power amplifier 502 shown in FIG. 34 is of a configuration in which anti-phase IMD3 generation circuit 63 that was provided in the section preceding amplifier 561 that operates as the main amplifier is eliminated in the configuration shown in FIG. 33, and in its place, anti-phase IMD3 generation circuit 63 is provided in the section preceding amplifier 562 that operates as an auxiliary amplifier.

In the configuration shown in FIG. 34, based on the same principles as the sixth exemplary embodiment, a greater improvement of efficiency can be obtained over a broad input power range than for amplifier 561 alone.

In the configuration shown in FIG. 34, third-order intermodulation distortion 529 that is anti-phase with main signal 528 is supplied from amplifier 562 for which anti-phase IMD3 generation circuit 63 is provided in the preceding section. In addition, third-order intermodulation distortion 531 that is in-phase with main signal 530 is supplied from amplifier 561 for which an anti-phase IMD3 generation circuit is not provided in the preceding section. Third-order intermodulation distortion 529 and third-order intermodulation distortion 531 that are in an anti-phase relation to each other are then combined and offset each other in synthesizer 64, whereby a low-distortion signal is supplied to output terminal 75.

Based on the above-described process, an improvement in efficiency and a decrease of distortion can be simultaneously achieved in the configuration shown in FIG. 34.

Second Modification of Sixth Exemplary Embodiment

This modification is of a configuration in which anti-phase IMD3 generation circuit 63 provided in the first amplification path in the configuration shown in FIG. 33 is provided in the section preceding $\lambda/4$ line 512 of the second amplification path.

Figure 35:
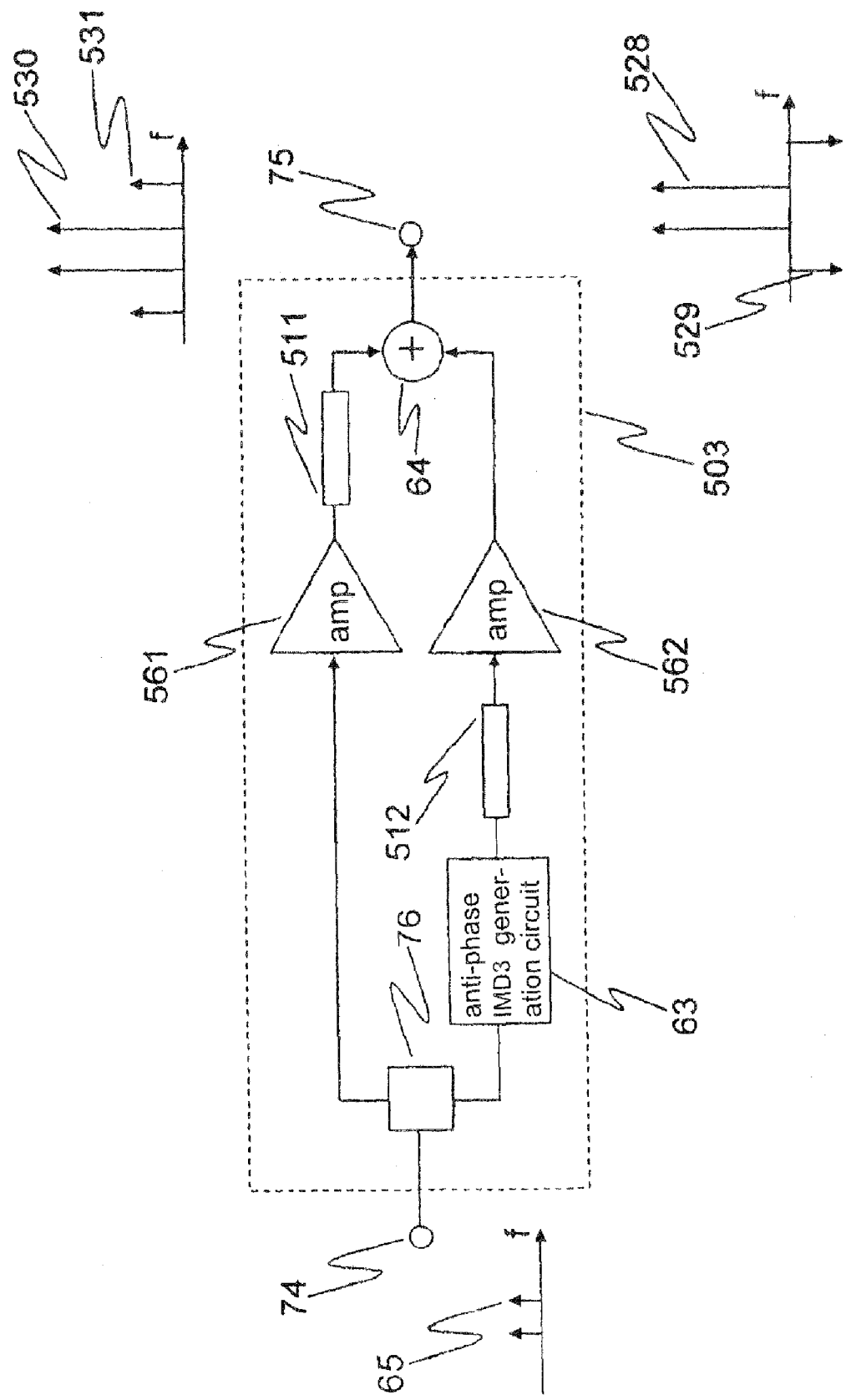
FIG. 35 is a block diagram showing a second modification of the sixth exemplary embodiment.

FIG. 35 is a block diagram showing the second modification of the sixth exemplary embodiment shown in FIG. 33.

Power amplifier 503 shown in FIG. 35 is of a configuration in which, in the configuration shown in FIG. 33, anti-phase IMD3 generation circuit 63 that was provided in the section preceding amplifier 561 that operates as the main amplifier is eliminated, and in its place, anti-phase IMD3 generation circuit 63 is provided in the section preceding $\lambda/4$ line 512 that is provided in the path that includes amplifier 562 that operates as an auxiliary amplifier.

Based on the same principles as the first modification of the sixth exemplary embodiment, the configuration shown in FIG. 35 can also simultaneously achieve a greater improvement in efficiency and greater reduction of distortion over a broad range of input power than amplifier 561 alone.

Third Modification of the Sixth Exemplary Embodiment

This modification is of a configuration in which, in the configuration shown in FIG. 33, an equivalent circuit having characteristics equivalent to a λ/4 line is substituted for the λ/4 line.

Figure 36:
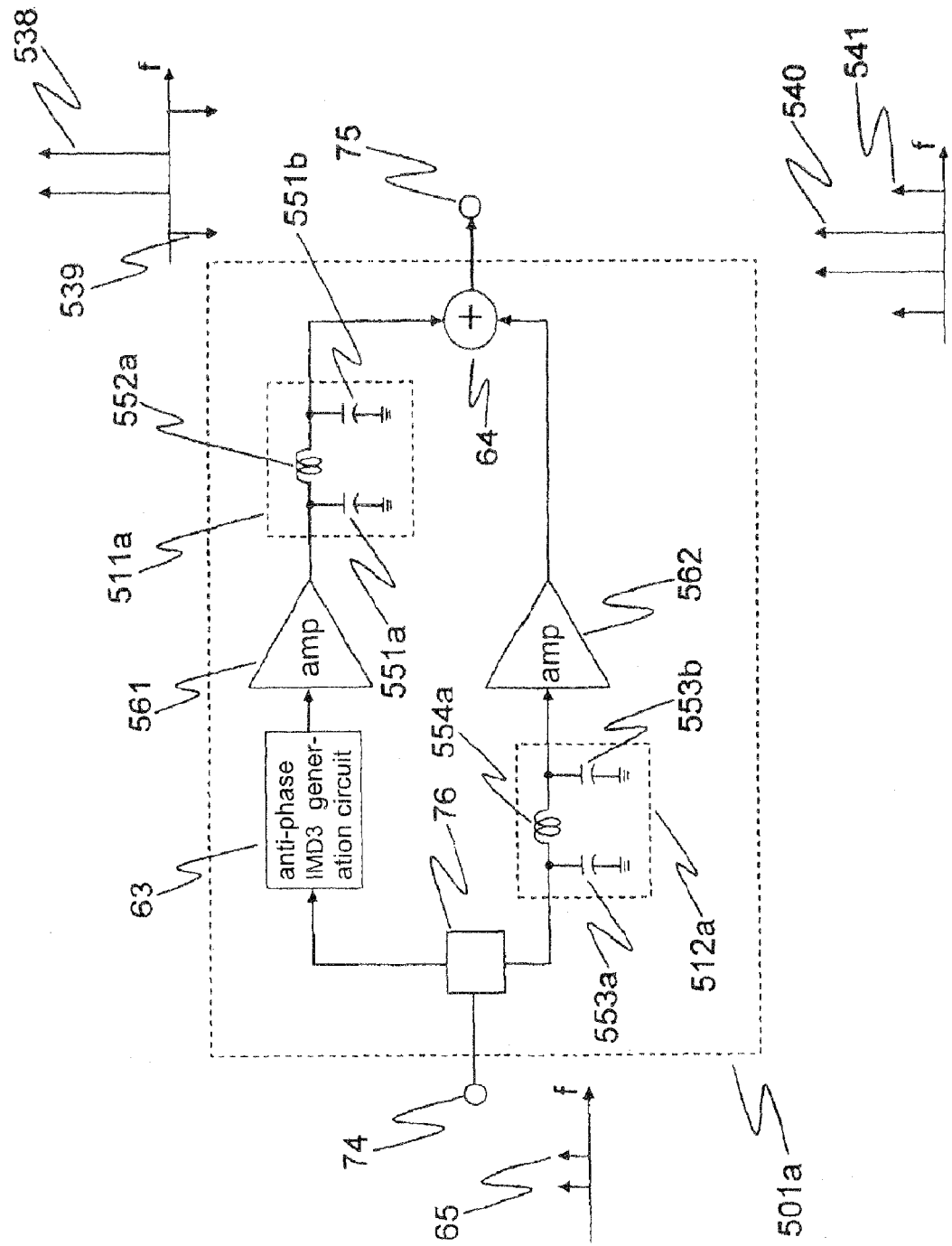
FIG. 36 is a block diagram showing a third modification of the sixth exemplary embodiment.

FIG. 36 is a block diagram showing the third modification of the sixth exemplary embodiment shown in FIG. 33. Power amplifier 501a shown in FIG. 36 is of a configuration in which, in the configuration shown in FIG. 33, λ/4 line 511 that is a distributed-constant element is substituted by circuit 511a that is a lumped-constant element and that is made up from capacitance elements 551a and 551b and inductor element 552a, and λ/4 line 512 is substituted by circuit 512 that is made up from capacitance element 553a and 553b and inductor element 554a. Circuit 511a is an equivalent circuit having characteristics that are equivalent to λ/4 line 511, and circuit 512a is an equivalent circuit with λ/4 line 512.

In the configuration shown in FIG. 36, circuit 511a is made up from capacitance elements 551a and 551b and inductor element 552a, but the present invention is not limited to this configuration and circuit 511a may be of a configuration in which the number of capacitance elements and inductor elements is increased or decreased with respect to the configuration shown in FIG. 36. Similarly, regarding circuit 512a, the number of capacitance elements and inductor elements may be increased or decreased compared to the configuration shown in FIG. 36. In addition, λ/4 line 511 and λ/4 line 512 are substituted by equivalent circuits, but this substitution may also be limited to only one of these components.

In the configuration shown in FIG. 36, based on the same principles as the sixth exemplary embodiment, a greater improvement in efficiency and a greater reduction of distortion can be achieved over a broad range of input power than by amplifier 561 alone.

In addition, although explanation is based on the sixth exemplary embodiment in this modification, the present modification may also be applied to the first and second modifications, and each of λ/4 line 511 and λ/4 line 512 may be substituted by circuit 511a and 512b. The substitution by an equivalent circuit may also apply to only either one of the λ/4 lines. In this case as well, based on the same principles as the sixth exemplary embodiment, a greater improvement of efficiency and a greater reduction of distortion can be achieved over a broad range of input power than by amplifier 561 alone.

The first to sixth exemplary embodiments described above are only examples on all points and are not restrictive. The present invention is not limited to the above-described exemplary embodiments and is open to various modifications within the scope of the present invention, and these modifications are all included within the scope of the present invention.

As explained hereinabove, the first effect of the present invention is the capability to achieve a reduction of distortion while suppressing the power loss during power synthesis that occurred in a parallel low-distortion amplifier of the related art. The reason for this effect is that, in the present invention a circuit is proposed for generating third-order intermodulation distortion that is anti-phase with the main signal whereby main signals can be combined in-phase while combining and offsetting in anti-phase only the third-order intermodulation distortion in a parallel low-distortion amplifier.

In addition, by means of the first effect of the present invention, the effect can be obtained of achieving reduction of distortion while suppressing power loss during power synthesis in all of the exemplary embodiments shown in the present invention.

The second effect of the present invention is the capability of high-efficiency, and moreover, low-distortion operation of an amplifier. The reason for this capability is that, although third-order intermodulation distortion that is in-phase with the main signal is generated when the amplifier is operated while in a state in which the idle current of the amplifier has been decreased to realize high efficiency operation, a circuit is proposed in the present invention for generating third-order intermodulation distortion that is anti-phase with the main signal, whereby the third-order intermodulation distortion that is in-phase with the main signal that is generated from the amplifier can be offset.

In addition, the second effect of the present invention obtains the effect of enabling high-efficiency and low-distortion operation of an amplifier in all of the exemplary embodiments shown in the present invention.

The third effect of the present invention is the ability to easily reduce distortion of an amplifier by separately providing, in a circuit that generates third-order intermodulation distortion that is anti-phase with a main signal, a means that can set the amplitude and phase of the third-order intermodulation distortion generated from this circuit to optimum values. The reasons for this ability are as follows. In a circuit that generates third-order intermodulation distortion that is anti-phase with a main signal, the amplitude of the third-order intermodulation distortion that is supplied from the distortion generation circuit can be set to the optimum value by setting the load impedance in the RF fundamental wave band of the distortion generation circuit to the optimum value. Then, the phase of the third-order intermodulation distortion supplied form the distortion generation circuit can be set to the optimum value by setting the load impedance in the difference frequency band of the distortion generation circuit to the optimum value. As a result, the amplitude and phase of third-order intermodulation distortion from a circuit for generating third-order intermodulation distortion that is anti-phase with the main signal that is connected in parallel to the amplifier can be set to optimum values such that the third-order intermodulation distortion generated from the amplifier can be offset.

In addition, the present invention is not limited to the above-described exemplary embodiment and is open to various modifications within the scope of the present invention, and these modifications are of course included within the scope of the invention.

The invention claimed is:

1. A power amplifier comprising:
   a distributor for distributing an input signal;
   an anti-phase third-order intermodulation distortion generation circuit for, upon receiving an input signal that has been distributed by said distributor, generating anti-phase third-order intermodulation distortion having a phase difference in a range from +90° to +180° or in a range of from −180° to −90° with respect to each of two main signals of different frequency that are included in said input signal and supplying said two main signals and said third-order intermodulation distortion as output;
   a first amplifier for amplifying a signal received from said anti-phase third-order intermodulation distortion generation circuit and supplying a result as output;

a second amplifier for amplifying an input signal distributed by said distributor and supplying a result as output;

a synthesizer for combining an output signal of said first amplifier and an output signal of said second amplifier; and a first amplification path and a second amplification path to which said input signal is distributed by said distributor, wherein:

said anti-phase third-order intermodulation distortion generation circuit and said first amplifier are provided on said first amplification path; and said second amplifier is provided on said second amplification path wherein a plurality of said first amplification path is provided in parallel, and a plurality of said second amplification path is provided in parallel.

2. A power amplifier comprising:

a distributor for distributing an input signal;

an anti-phase third-order intermodulation distortion generation circuit for, upon receiving an input signal that has been distributed by said distributor, generating anti-phase third-order intermodulation distortion having a phase difference in a range from +90° to +180° or in a range of from −180° to −90° with respect to each of two main signals of different frequency that are included in said input signal and supplying said two main signals and said third-order intermodulation distortion as output;

a first amplifier for amplifying a signal received from said anti-phase third-order intermodulation distortion generation circuit and supplying a result as output;

a second amplifier for amplifying an input signal distributed by said distributor and supplying a result as output;

a synthesizer for combining an output signal of said first amplifier and an output signal of said second amplifier; and a first amplification path and a second amplification path to which said input signal is distributed by said distributor, wherein:

said anti-phase third-order intermodulation distortion generation circuit and said first amplifier are provided on said first amplification path; and said second amplifier is provided on said second amplification path, wherein said anti-phase third-order intermodulation distortion generation circuit includes:

a distortion generation circuit that includes a non-linear element for generating said third-order intermodulation distortion;

an amplitude regulation circuit for regulating amplitude of said third-order intermodulation distortion in accordance with load impedance of said distortion generation circuit in an RF fundamental wave band that is set according to a center frequency of a frequency component of said two main signals of said input signal; and a phase-adjustment circuit for adjusting a phase of said third-order intermodulation distortion in accordance with load impedance of said distortion generation circuit in a difference frequency band that is set according to a difference between frequency components of said two main signals of said input signal.

3. The power amplifier according to claim 2, wherein said non-linear element is a bipolar transistor, and an emitter terminal of said bipolar transistor is connected to said first amplification path.

4. The power amplifier according to claim 2, wherein said non-linear element is a field-effect transistor, and the source terminal of said field-effect transistor is connected to said first amplification path.

5. The power amplifier according to claim 2, wherein said non-linear element is a diode, and a cathode terminal of said diode is connected to said first amplification path.

6. The power amplifier according to claim 2, wherein said amplitude regulation circuit includes at least one passive element among a capacitance element, an inductor element and a resistance element that is connected in a series or in parallel to said first amplification path; and said amplitude regulation circuit regulates said amplitude of said third-order intermodulation distortion in accordance with load impedance in an RF fundamental wave band of said distortion generation circuit by means of said passive element that is selected.

7. The power amplifier according to claim 2, wherein said phase-adjustment circuit includes a circuit in which a capacitance element and an inductor element are connected in a series, one terminal of two terminals of said circuit being connected to said first amplification path and the other terminal being grounded; and said phase-adjustment circuit adjusts said phase of said third-order intermodulation distortion in accordance with load impedance in a difference frequency band of said distortion generation circuit by setting the element values of said capacitance element and said inductor element.

8. The power amplifier according to claim 2, wherein said phase-adjustment circuit includes:

an inductor element having one terminal of two terminals connected to ground and the other terminal connected to said first amplification path; and a capacitance element connected in a series to said first amplification path between a point to which said non-linear element is connected and a point to which said inductor element is connected; and said phase-adjustment circuit adjusts said phase of said third-order intermodulation distortion in accordance with load impedance in a difference frequency band of said distortion generation circuit by setting element values of said capacitance element and said inductor element.

9. A power amplifier comprising:

a distributor for distributing an input signal;

an anti-phase third-order intermodulation distortion generation circuit for, upon receiving an input signal that has been distributed by said distributor, generating anti-phase third-order intermodulation distortion having a phase difference in a range from +90° to +180° or in a range of from −180° to −90° with respect to each of two main signals of different frequency that are included in said input signal and supplying said two main signals and said third-order intermodulation distortion as output;

a first amplifier for amplifying a signal received from said anti-phase third-order intermodulation distortion generation circuit and supplying a result as output;

a second amplifier for amplifying an input signal distributed by said distributor and supplying a result as output;

a synthesizer for combining an output signal of said first amplifier and an output signal of said second amplifier; and a first amplification path and a second amplification path to which said input signal is distributed by said distributor, wherein:

said anti-phase third-order intermodulation distortion generation circuit and said first amplifier are provided on said first amplification path; and said second amplifier is provided on said second amplification path, and said power amplifier further comprising:

a first phase-adjustment unit that includes a $\lambda/4$ line or an equivalent circuit of said $\lambda/4$ line provided in a section following said first amplifier in said first amplification path; and a second phase-adjustment unit that includes a $\lambda/4$ line or an equivalent circuit to said $\lambda/4$ line provided in a section preceding said second amplifier in said second amplification path.

10. A power amplifier comprising:

a distributor for distributing an input signal;

an anti-phase third-order intermodulation distortion generation circuit for, upon receiving an input signal that has been distributed by said distributor, generating anti-phase third-order intermodulation distortion having a phase difference in a range from +90° to +180° or in a range of from −180° to −90° with respect to each of two main signals of different frequency that are included in said input signal and supplying said two main signals and said third-order intermodulation distortion as output;

a first amplifier for amplifying a signal received from said anti-phase third-order intermodulation distortion generation circuit and supplying a result as output;

a second amplifier for amplifying an input signal distributed by said distributor and supplying a result as output;

a synthesizer for combining an output signal of said first amplifier and an output signal of said second amplifier; and a first amplification path and a second amplification path to which said input signal is distributed by said distributor, wherein:

said anti-phase third-order intermodulation distortion generation circuit and said first amplifier are provided on said first amplification path; and said second amplifier is provided on said second amplification path, and said power amplifier further comprising:

a first phase-adjustment unit that includes a $\lambda/4$ line or an equivalent circuit to said $\lambda/4$ line provided in a section preceding said first amplifier in said first amplification path; and a second phase-adjustment unit that includes a $\lambda/4$ line or an equivalent circuit of said $\lambda/4$ line provided in a section following said second amplifier in said second amplification path.

\* \* \* \* \*